US008970565B2

(12) United States Patent
Hachida et al.

(10) Patent No.: US 8,970,565 B2
(45) Date of Patent: Mar. 3, 2015

(54) DISPLAY DRIVING CIRCUIT, DISPLAY PANEL AND DISPLAY DEVICE

(75) Inventors: Takuya Hachida, Osaka (JP); Yuhichiroh Murakami, Osaka (JP); Shige Furuta, Osaka (JP); Makoto Yokoyama, Osaka (JP); Yasushi Sasaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 423 days.

(21) Appl. No.: 13/378,233

(22) PCT Filed: Mar. 18, 2010

(86) PCT No.: PCT/JP2010/001938
§ 371 (c)(1),
(2), (4) Date: Dec. 14, 2011

(87) PCT Pub. No.: WO2010/146751
PCT Pub. Date: Dec. 23, 2010

(65) Prior Publication Data
US 2012/0105395 A1 May 3, 2012

(30) Foreign Application Priority Data
Jun. 17, 2009 (JP) .................. 2009-144751

(51) Int. Cl.
*G06F 3/038* (2013.01)
*G09G 3/36* (2006.01)
*G11C 19/28* (2006.01)

(52) U.S. Cl.
CPC ............ *G11C 19/28* (2013.01); *G09G 3/3677* (2013.01); *G09G 2310/063* (2013.01)
USPC ......................................... 345/204; 345/100

(58) Field of Classification Search
CPC ................................ G06F 3/033; G06F 3/017
USPC .................................................. 345/204, 100
See application file for complete search history.

(56) References Cited

U.S. PATENT DOCUMENTS

2002/0039096 A1* 4/2002 Katsutani ...................... 345/204
2004/0150610 A1 8/2004 Zebedee et al.
(Continued)

FOREIGN PATENT DOCUMENTS

| JP | 2004227751 A | 8/2004 |
| JP | 2005244956 A | 9/2005 |

(Continued)

OTHER PUBLICATIONS

International Search Report.

*Primary Examiner* — Abbas Abdulselam
*Assistant Examiner* — Sarvesh J Nadkarni
(74) *Attorney, Agent, or Firm* — Harness, Dickey & Pierce

(57) ABSTRACT

A stage of the shift register has (i) a set-reset type flip-flop which receives an initialization signal and (ii) a signal generating circuit which receives a simultaneous selection signal and which generates an output signal by use of an output of the flip-flop. In at least one example embodiment, the output of the flip-flop becomes inactive regardless of whether a setting signal and a resetting signal are active or inactive, as long as the initialization signal is active. The initialization signal becomes active before the end of the simultaneous selection, and then becomes inactive after the end of the simultaneous selection. This makes it possible to stabilize operation of the shift register after the end of simultaneous selection of a plurality of signal lines carried out by the display driving circuit at a predetermined timing.

23 Claims, 41 Drawing Sheets

(56) References Cited

U.S. PATENT DOCUMENTS

2005/0184784 A1    8/2005    Washio et al.
2009/0109161 A1    4/2009    Yamamoto et al.
2009/0121998 A1*    5/2009    Ohkawa et al. ............... 345/100

FOREIGN PATENT DOCUMENTS

| | | |
|---|---|---|
| WO | WO-2007010835 A1 | 1/2007 |
| WO | WO-2007108177 A1 | 9/2007 |
| WO | WO 2009/028353 A1 * | 5/2009 ............... G09G 3/36 |

* cited by examiner

DISPLAY DRIVING CIRCUIT, DISPLAY PANEL AND DISPLAY DEVICE

TECHNICAL FIELD

The present invention relates to a display driving circuit (various kinds of display drivers) by which signal lines are simultaneously selected at a predetermined timing.

BACKGROUND ART

Patent Literature 1 (see FIG. 38) discloses a gate driver used in a liquid crystal display device which gate driver includes a shift register having a plurality of stages. Each of the plurality of stages has (i) a set-reset type flip-flop having an initial terminal (INI) and (ii) a gate circuit including an analog switch 43 and an n-channel transistor 44. Moreover, a clock signal CK is supplied to the analog switch 43, a source of the transistor 44 is connected to a VSS, and an output signal On of each of the stages is supplied to a corresponding scanning signal line. In the configuration, when a power supply of the liquid crystal display device is turned on, output signals (On−1, On, On+1, and the like) of all the stages sequentially become active after each delay by causing a start pulse ST to become active while the clock signal CK is being fixed to active (see FIG. 39). This makes it possible to simultaneously select all the scanning signal lines so that a Vcom (common electrode electric potential) is written into all pixels.

CITATION LIST

Patent Literature

Patent Literature 1
International Publication NO. WO2007/108177 (Publication Date: Sep. 27, 2007)

SUMMARY OF INVENTION

Technical Problem

The conventional configuration, however, has a problem that operation of the shift register becomes unstable because an output of the flip-flop is undetermined during a period after the output signal of the each stage becomes inactive when the clock signal CK becomes inactive (Low) (i.e., after the end of the simultaneous selection) until an INI signal (initialization signal) becomes active (High) (see FIG. 39). This is because, when the output signal of the each stage becomes inactive and thereby an SB-signal and an R-signal, which are supplied to the each stage, return to inactive, the output of the flip-flop varies depending on a relation between a timing at which the SB-signal returns to inactive and a timing at which the R-signal returns to inactive. For example, in a case where both the SB-signal and the R-signal are shifted as follows: "active→inactive", the flip-flop maintains its output Q at High (see FIG. 40); in a case where the SB-signal is shifted as follows: "active→inactive→inactive" while the R-signal is shifted as follows: "active→active→inactive", the flip-flop is reset and accordingly the output Q becomes Low (see FIG. 41); and in a case where the SB-signal is shifted as follows: "active→active→inactive" while the R-signal is shifted as follows: "active→inactive→inactive", the flip-flop is set so that the output Q becomes High (see FIG. 42).

An object of the present invention is to stabilize operation of a shift register after simultaneous selection of a plurality of signal lines is carried out by a display driving circuit at a predetermined timing.

Solution to Problem

A display driving circuit of the present invention includes a shift register, the display driving circuit carrying out simultaneous selection of a plurality of signal lines at a predetermined timing, wherein: a stage of the shift register includes (i) a set-reset type flip-flop receiving an initialization signal and (ii) a signal generating circuit receiving a simultaneous selection signal, the signal generating circuit generating an output signal of the stage by use of an output of the flip-flop; the output signal of the stage (i) becomes active due to an activation of the simultaneous selection signal and then (ii) remains active during the simultaneous selection; the output of the flip-flop is being inactive while the initialization signal is being active, regardless of whether each of a setting signal and a resetting signal is active or inactive; and the initialization signal becomes active before the end of the simultaneous selection and becomes inactive after the end of the simultaneous selection.

According to the configuration, initialization of the shift register (i.e., initialization of the flip-flop in the each stage) is completed when the simultaneous selection is ended and both the setting signal and the resetting signal become inactive. This makes it possible to stabilize operation of the shift register after the simultaneous selection, as compared to the conventional driver (see FIGS. 38 and 39) in which the flip-flop is undetermined, after the end of simultaneous selection, until an INI signal is supplied to the flip-flop.

Advantageous Effects of Invention

The present invention makes it possible to stabilize operation of the shift register after simultaneous selection of the plurality of signal lines is carried out by the display driving circuit at a predetermined timing.

Figure 2:
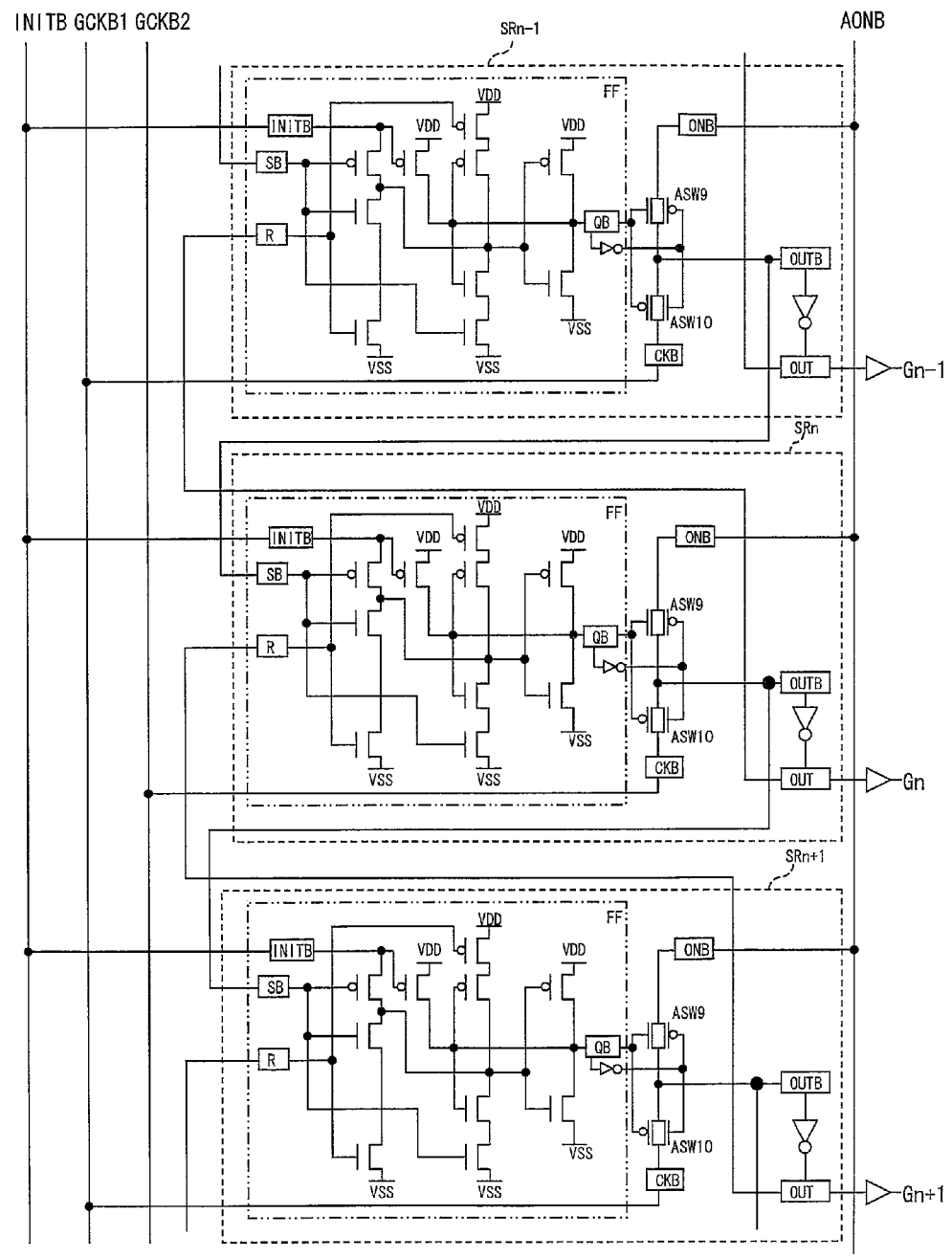
FIG. 2 is a circuit diagram partially illustrating a shift register of the liquid crystal display device shown in FIG. 1.

(a) is a circuit diagram of a flip-flop of the shift register shown in FIG. 2, and (b) is a truth table of the flip-flop.

Figure 1:
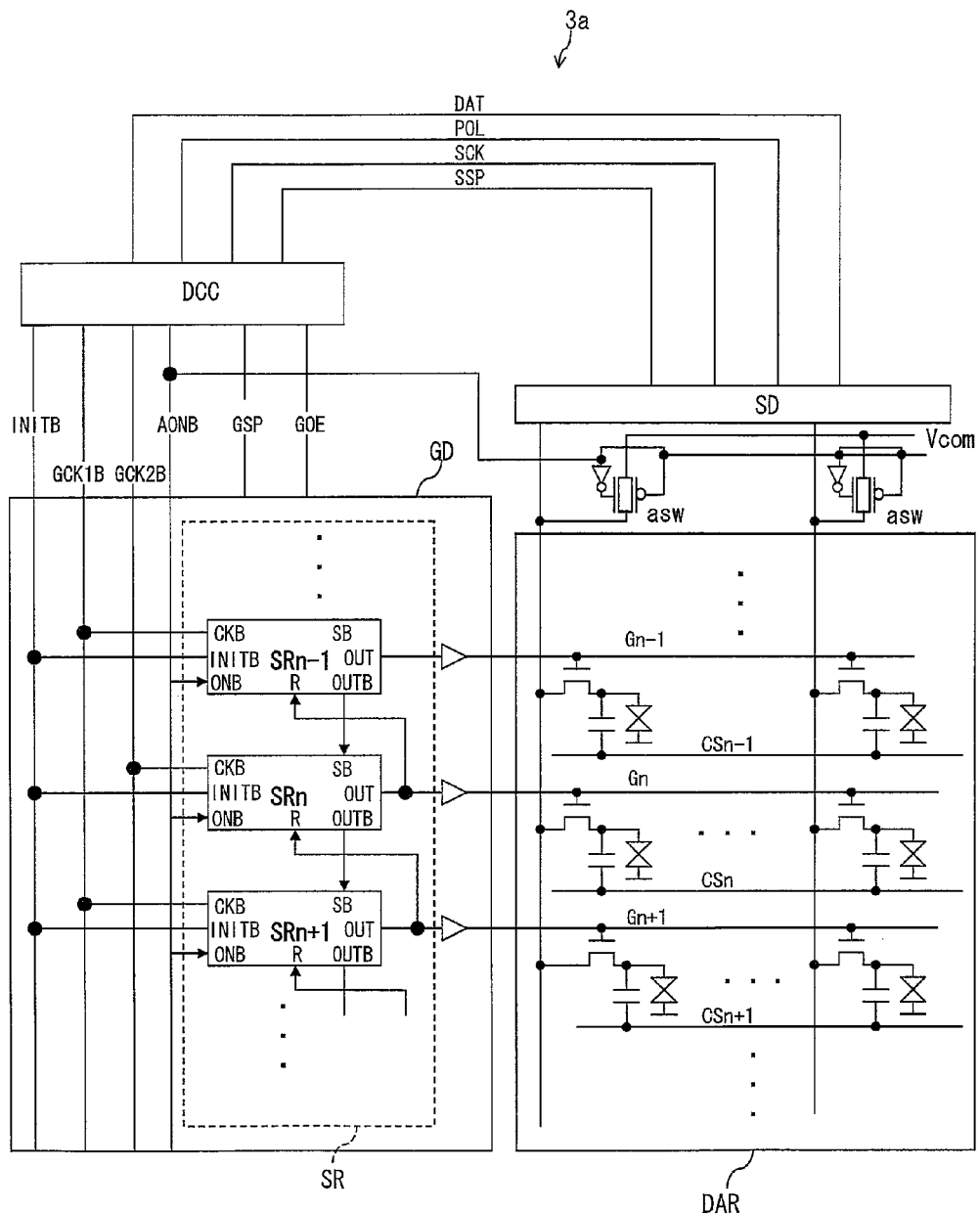
FIG. 1 is a schematic view illustrating a configuration of a liquid crystal display device of Embodiment 1 of the present invention.
Figure 4:
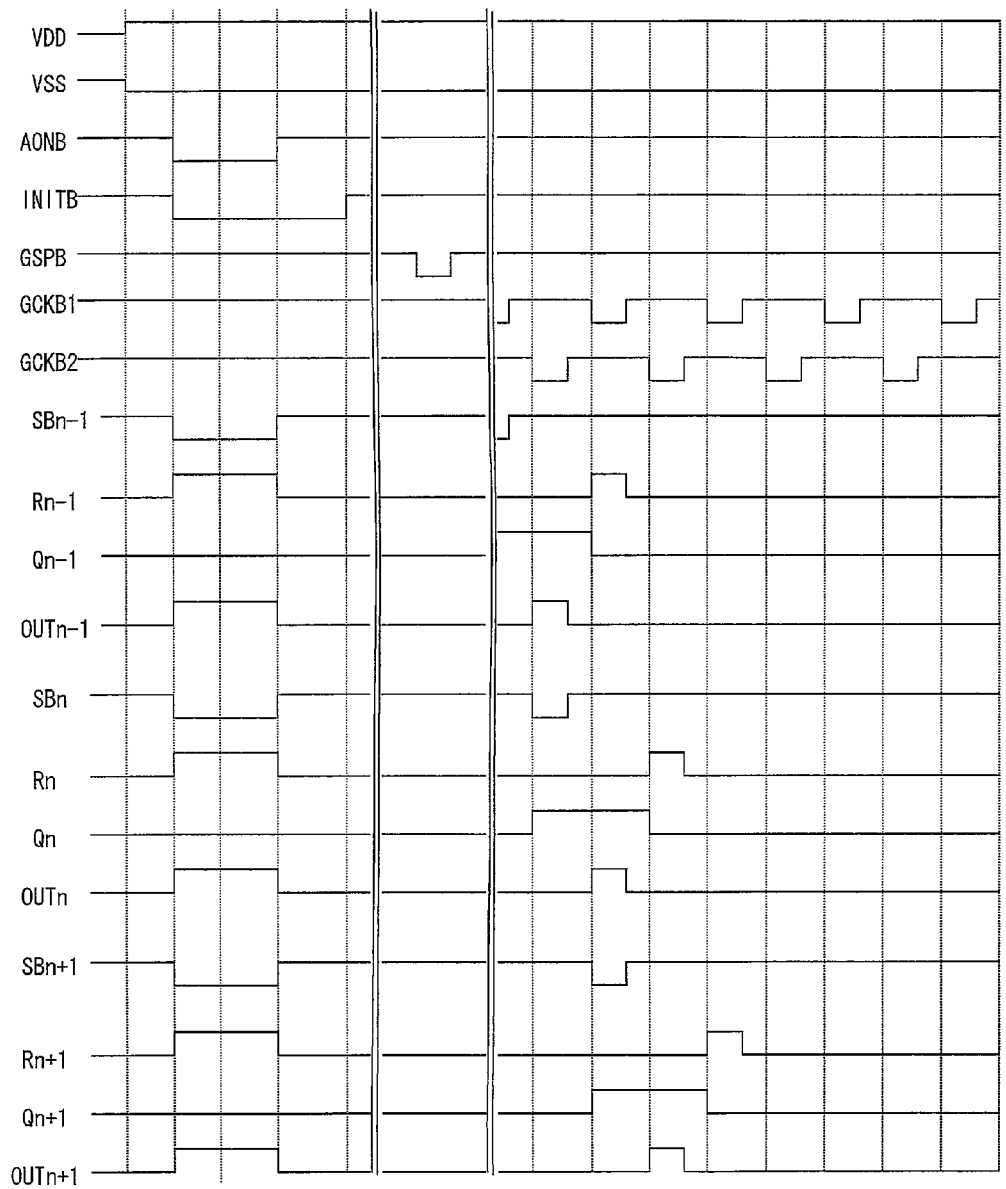

FIG. 4 is a timing chart illustrating how the liquid crystal display device shown in FIG. 1 is driven (when a power supply is turned on).

Figure 5:
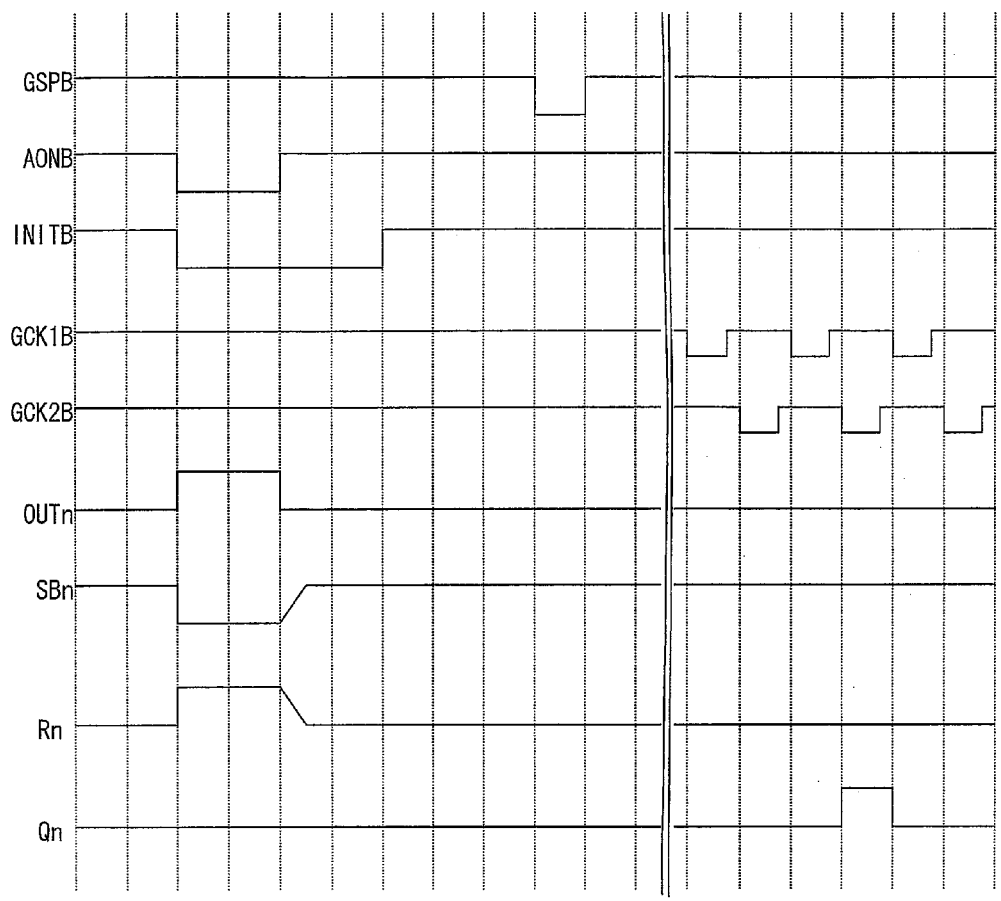

FIG. 5 is a timing chart illustrating how the liquid crystal display device shown in FIG. 1 is driven (in a case where an SB-signal and an R-signal return simultaneously).

Figure 6:
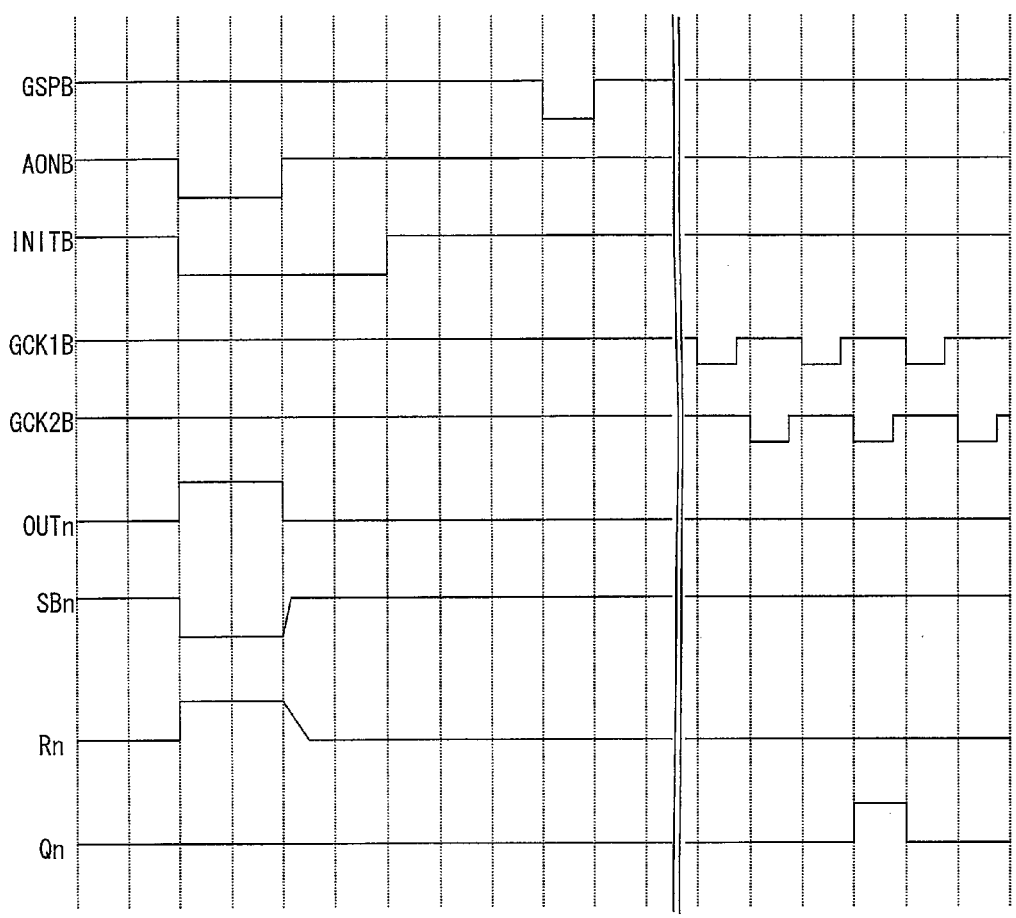

FIG. 6 is a timing chart illustrating how the liquid crystal display device shown in FIG. 1 is driven (in a case where the SB-signal returns before the R-signal returns).

Figure 7:
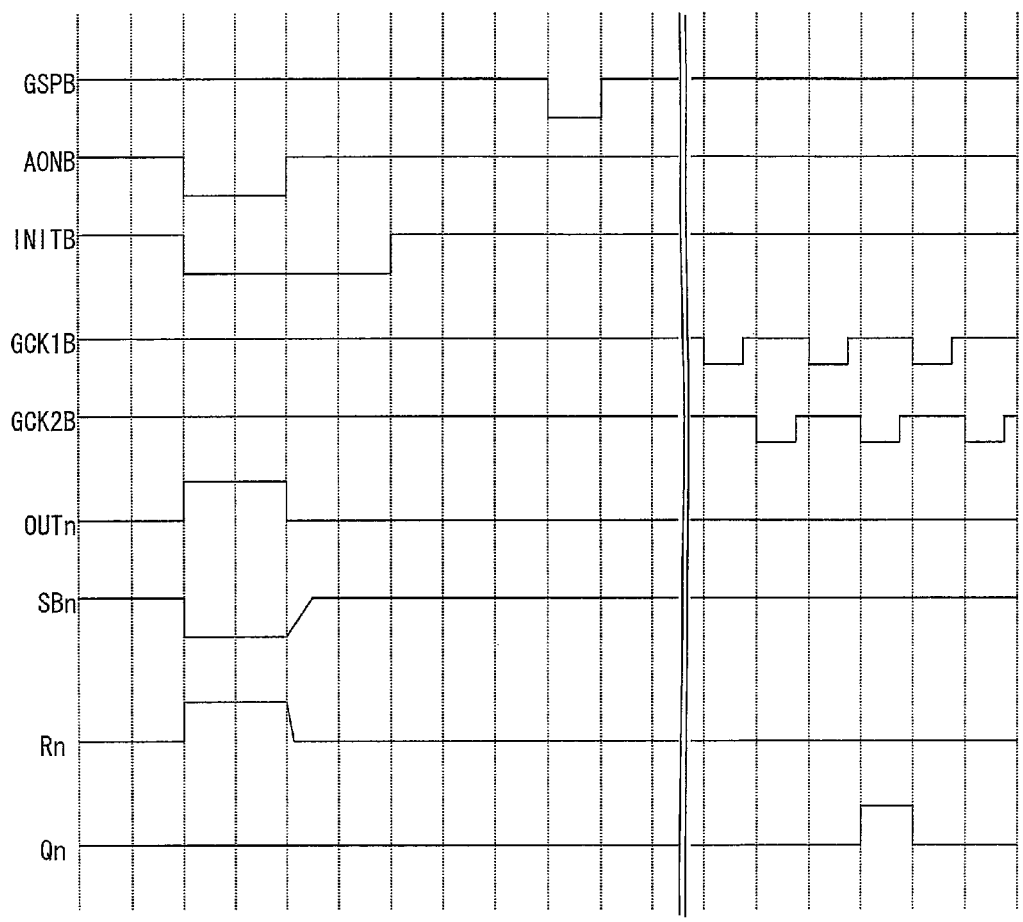

FIG. 7 is a timing chart illustrating how the liquid crystal display device shown in FIG. 1 is driven (in a case where the SB-signal returns after the R-signal returns).

Figure 8:
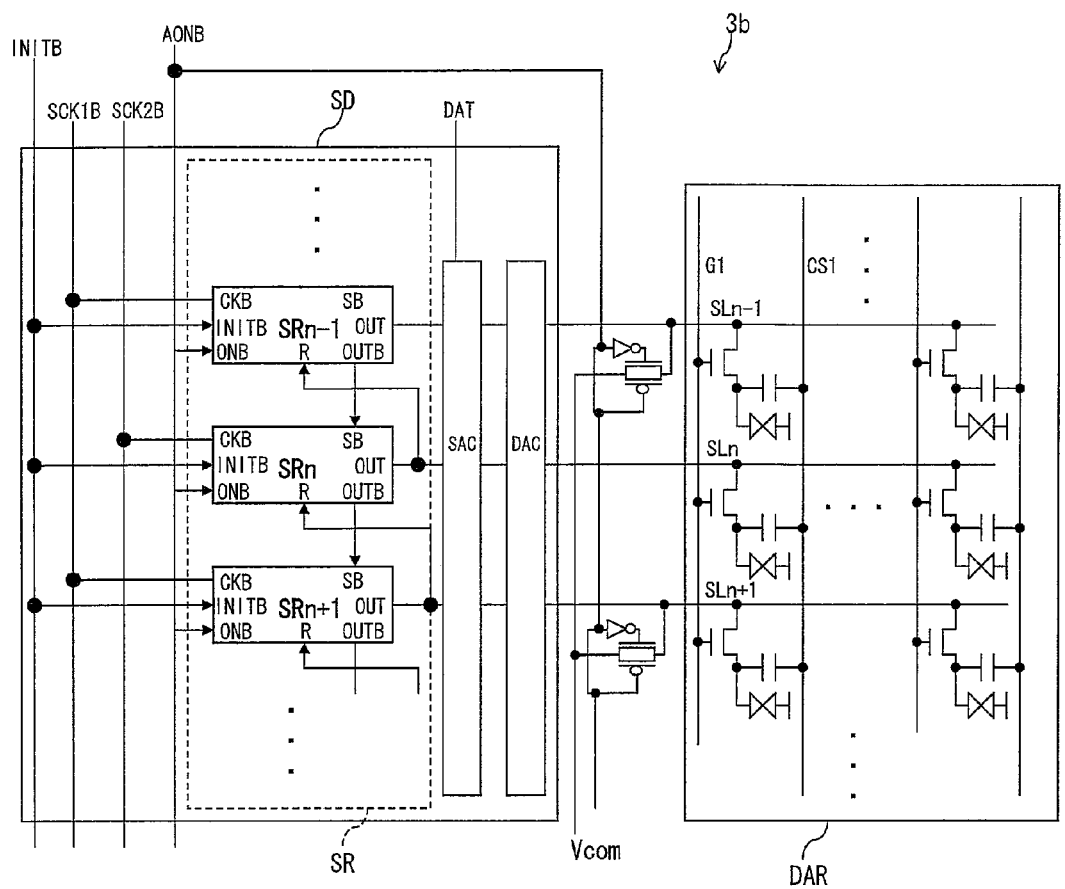

FIG. 8 is a schematic view illustrating another configuration of the liquid crystal display device of Embodiment 1 of the present invention.

Figure 9:
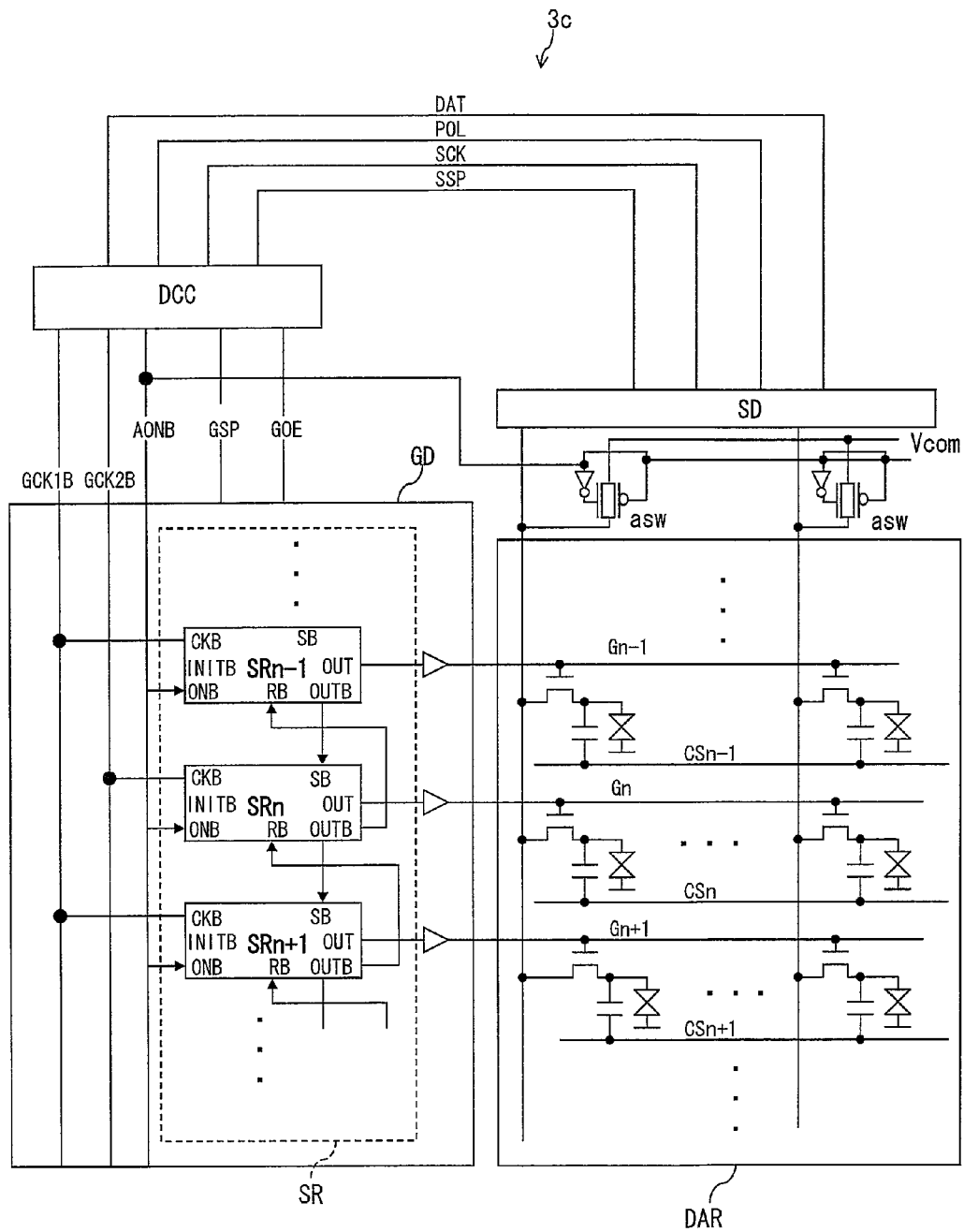

FIG. 9 is a schematic view illustrating yet another configuration of the liquid crystal display device of Embodiment 1 of the present invention.

Figure 10:
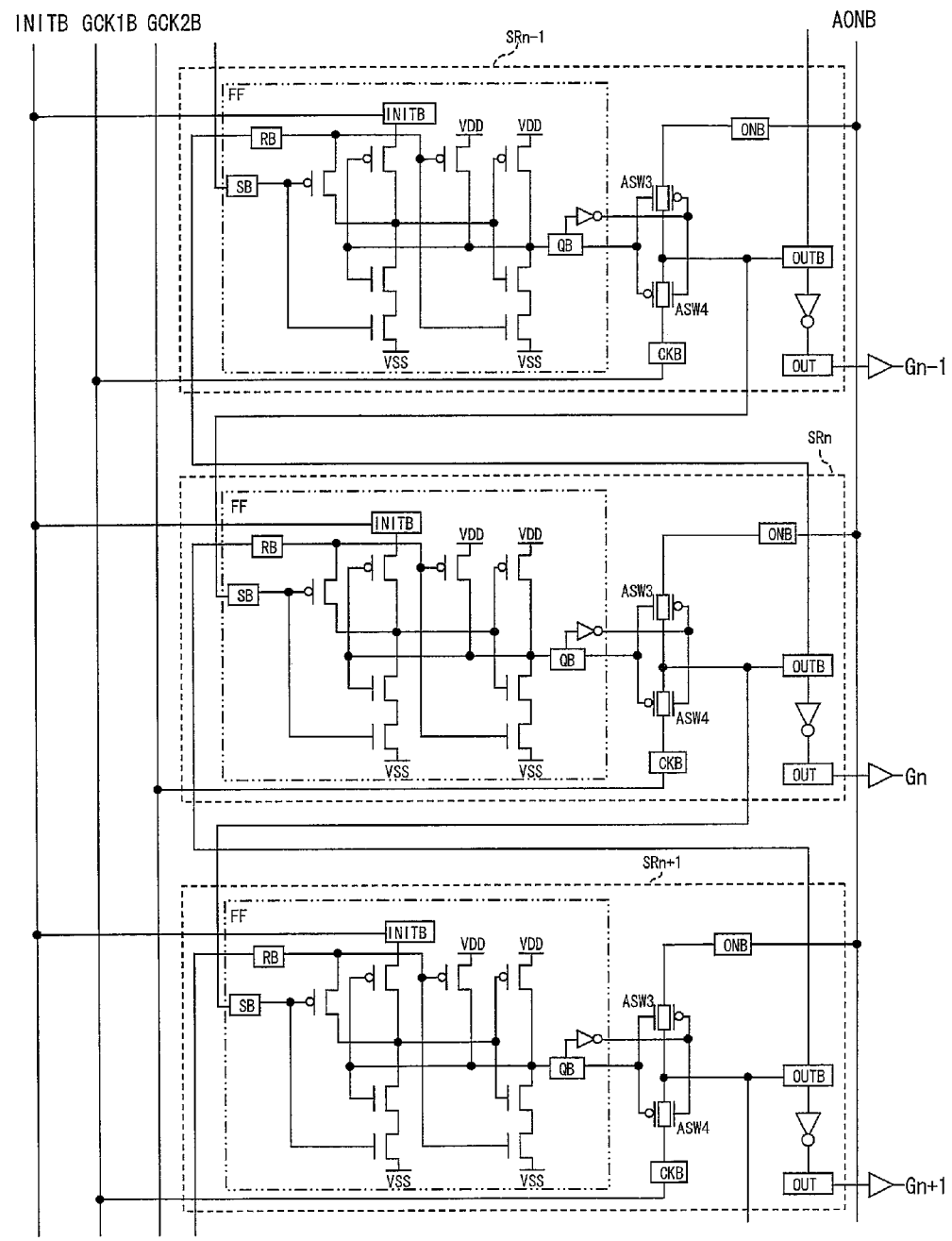

FIG. 10 is a circuit diagram partially illustrating a shift register of the liquid crystal display device shown in FIG. 9.

FIG. 11

(a) is a circuit diagram of a flip-flop of the shift register shown in FIG. 10, (b) is an operation timing chart of the flip-flop, and (c) is a truth table of the flip-flop.

Figure 12:
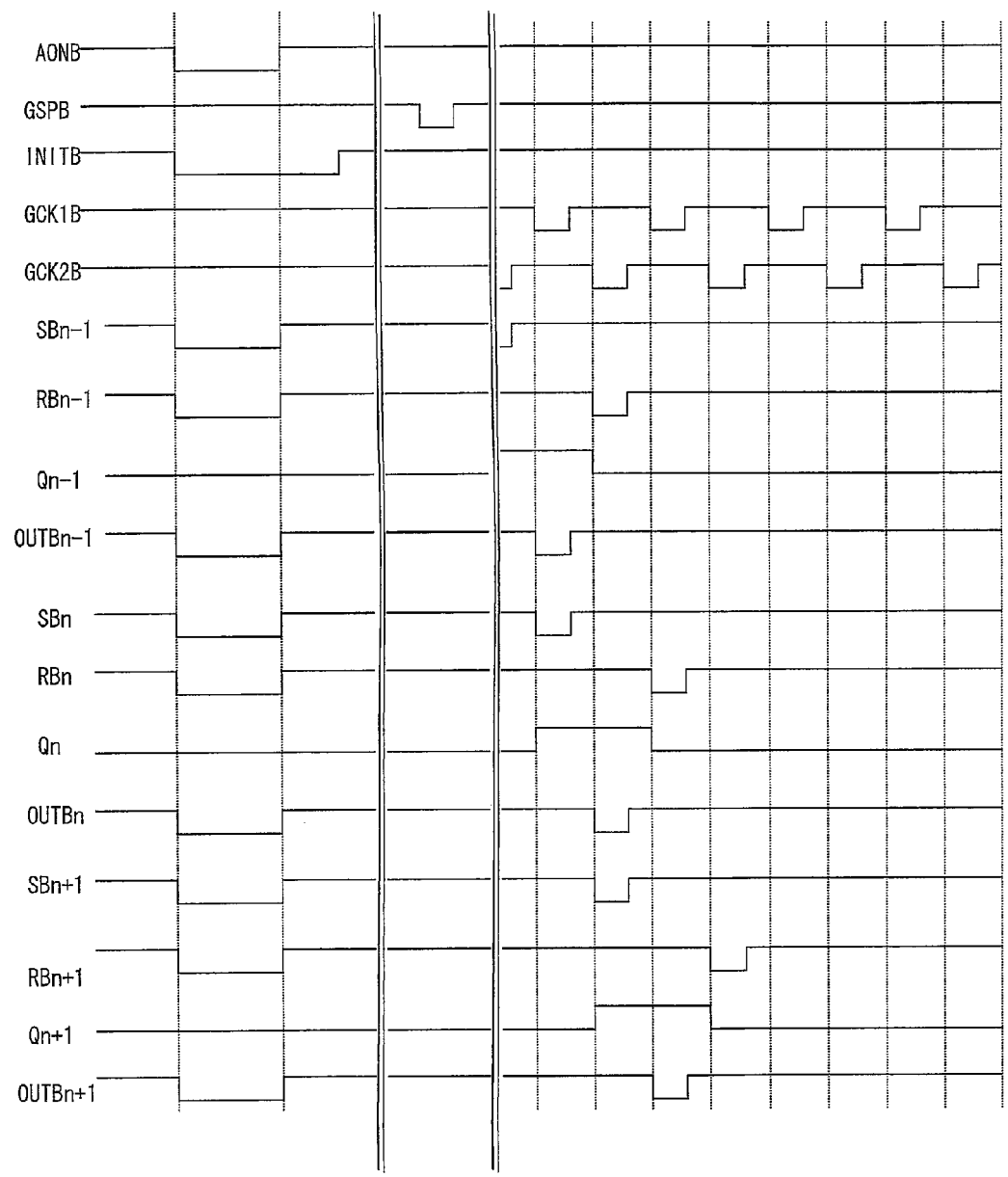

FIG. 12 is a timing chart illustrating how the liquid crystal display device shown in FIG. 9 is driven (when a power supply is turned on).

Figure 13:
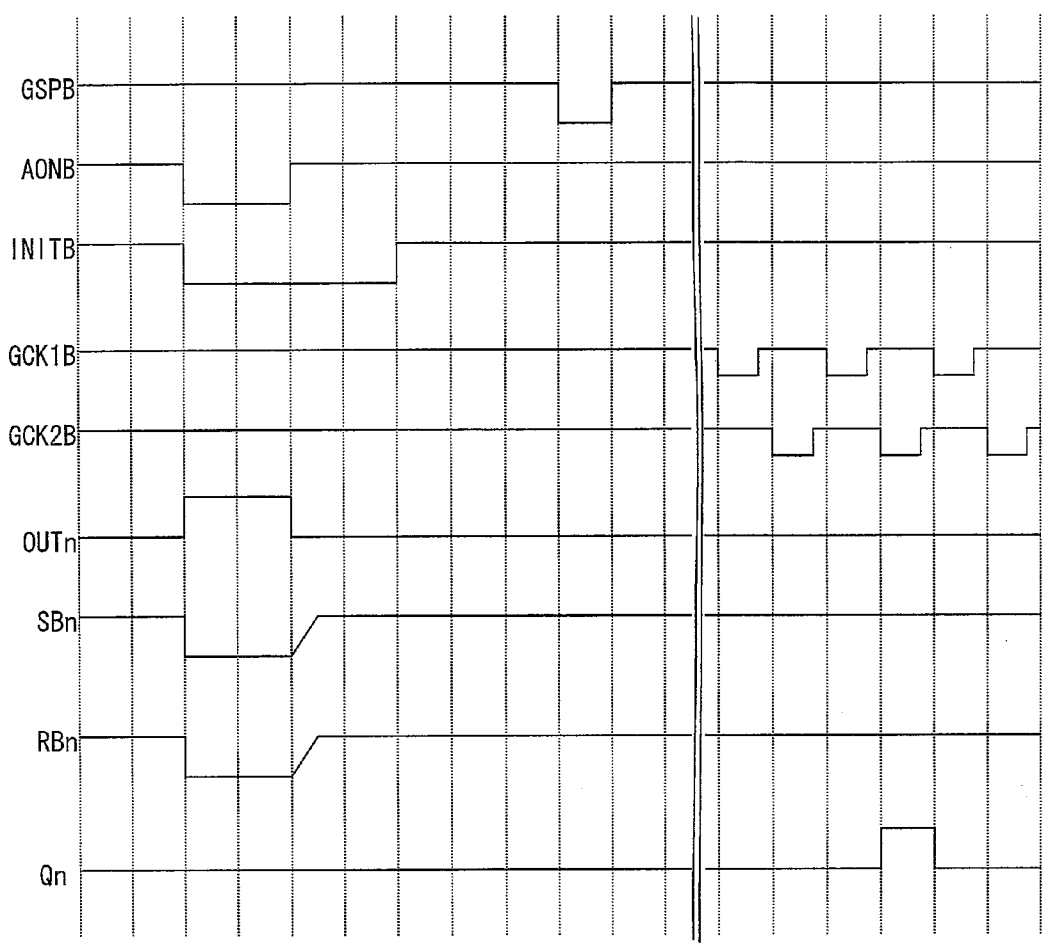

FIG. 13 is a timing chart illustrating how the liquid crystal display device shown in FIG. 9 is driven (in a case where an SB-signal and an R-signal return simultaneously).

Figure 14:
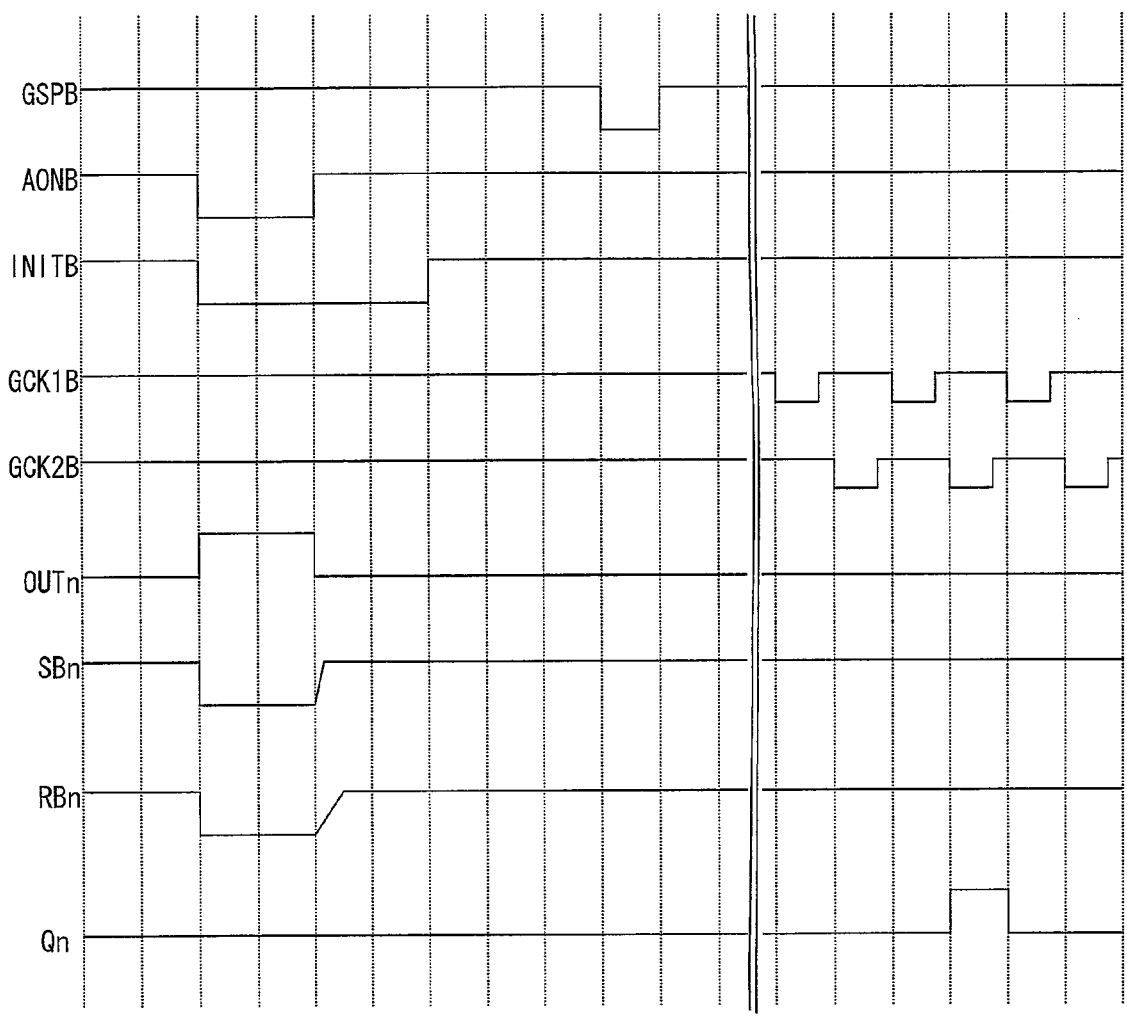

FIG. 14 is a timing chart illustrating how the liquid crystal display device shown in FIG. 9 is driven (in a case where the SB-signal returns before the R-signal returns).

Figure 15:
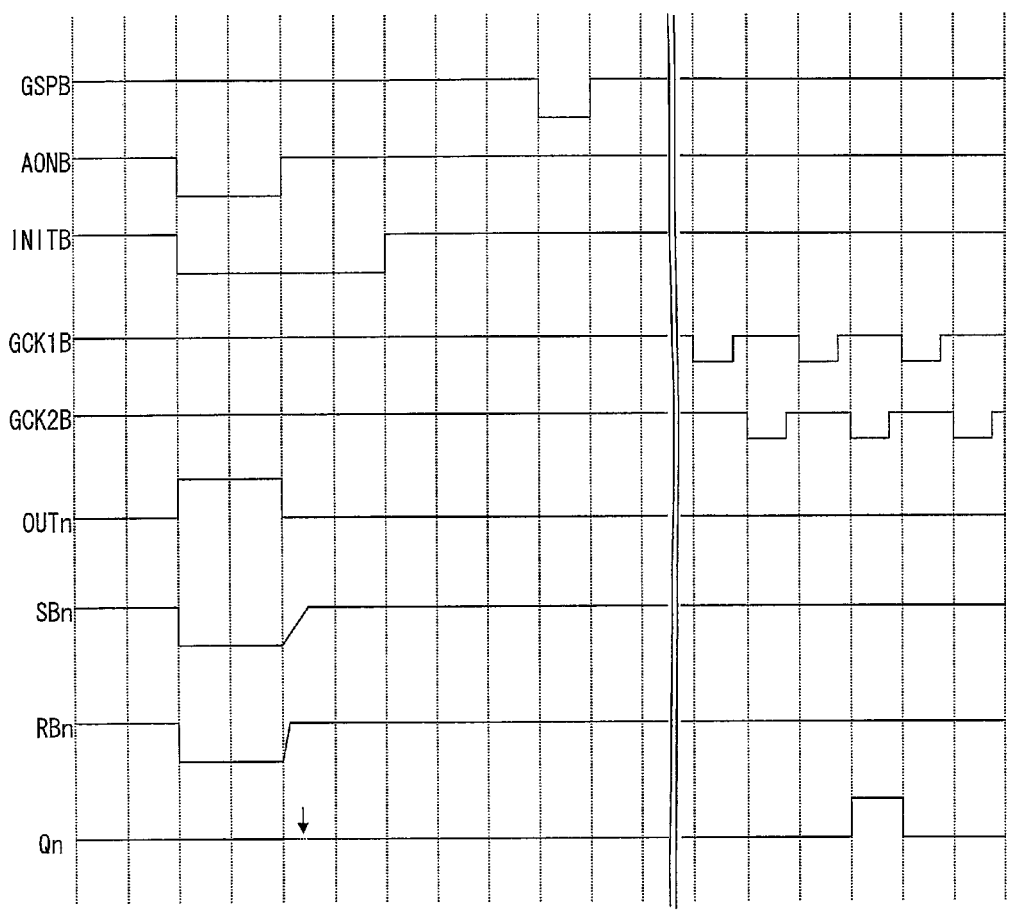

FIG. 15 is a timing chart illustrating how the liquid crystal display device shown in FIG. 9 is driven (in a case where the SB-signal returns after the R-signal returns).

FIG. 16

(a) is a view illustrating a process of generating an initial signal, and (b) is a timing chart illustrating the generation process.

FIG. 17

(a) is a view illustrating another process of generating an initial signal, and (b) is a timing chart illustrating the generation process.

Figure 18:
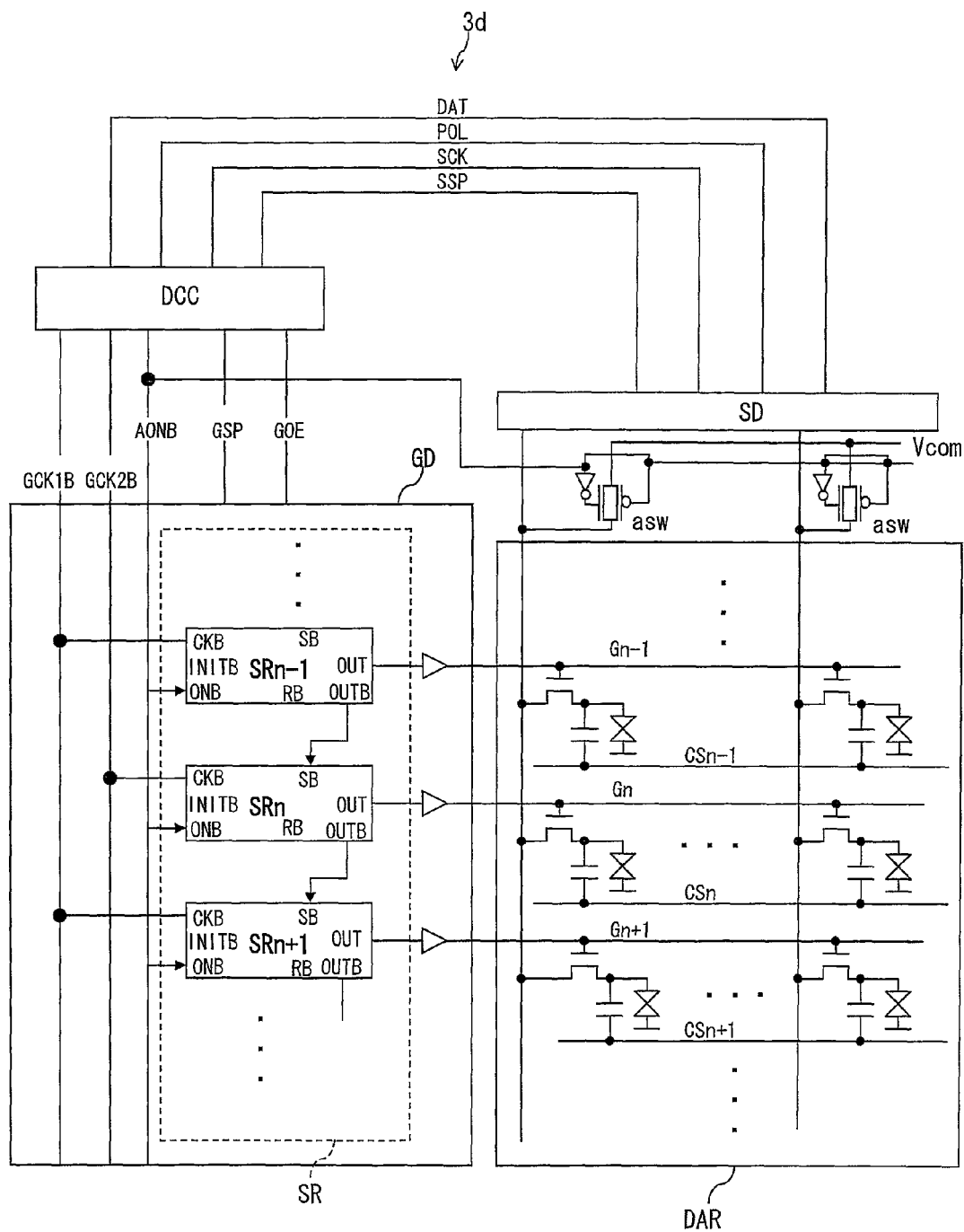

FIG. 18 is a schematic view illustrating yet another configuration of a liquid crystal display device according to Embodiment 2 of the present invention.

Figure 19:
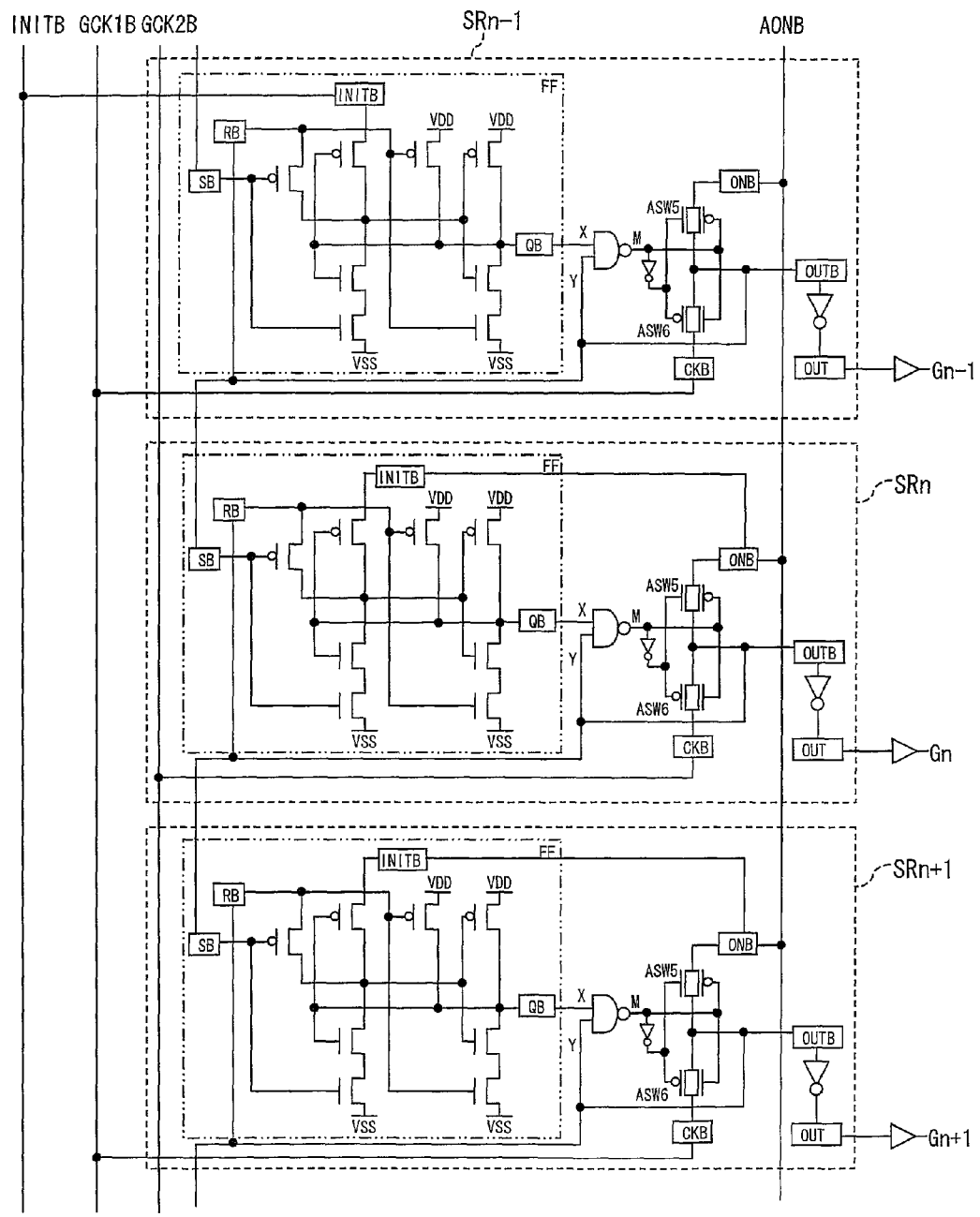

FIG. 19 is a circuit diagram partially illustrating a shift register of the liquid crystal display device shown in FIG. 18.

Figure 20:
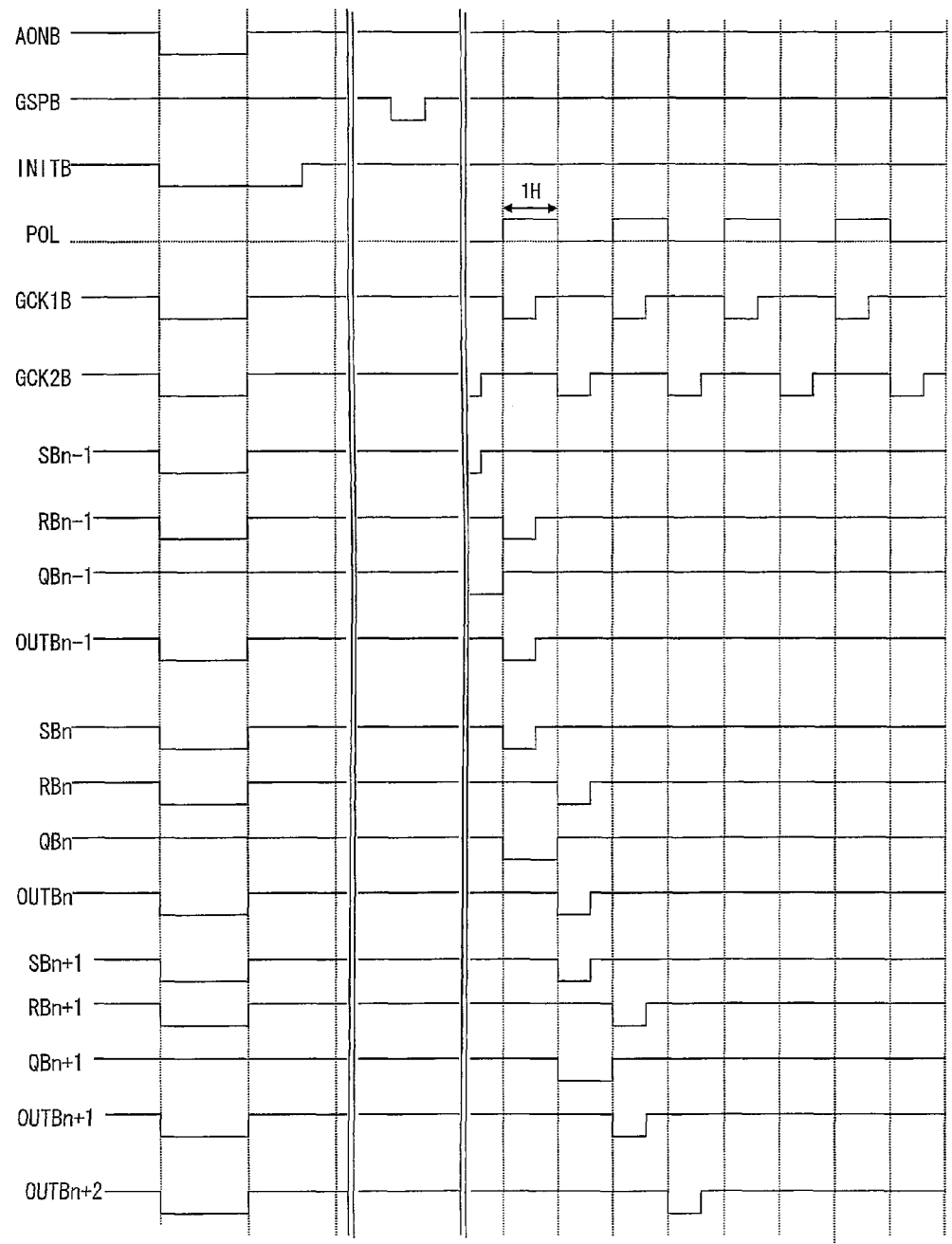

FIG. 20 is a timing chart illustrating how the liquid crystal display device shown in FIG. 18 is driven (when a power supply is turned on).

FIG. 21

(a) is a circuit diagram of a flip-flop of the shift register shown in FIG. 18, (b) is an operation timing chart of the flip-flop, and (c) is a truth table of the flip-flop.

Figure 22:
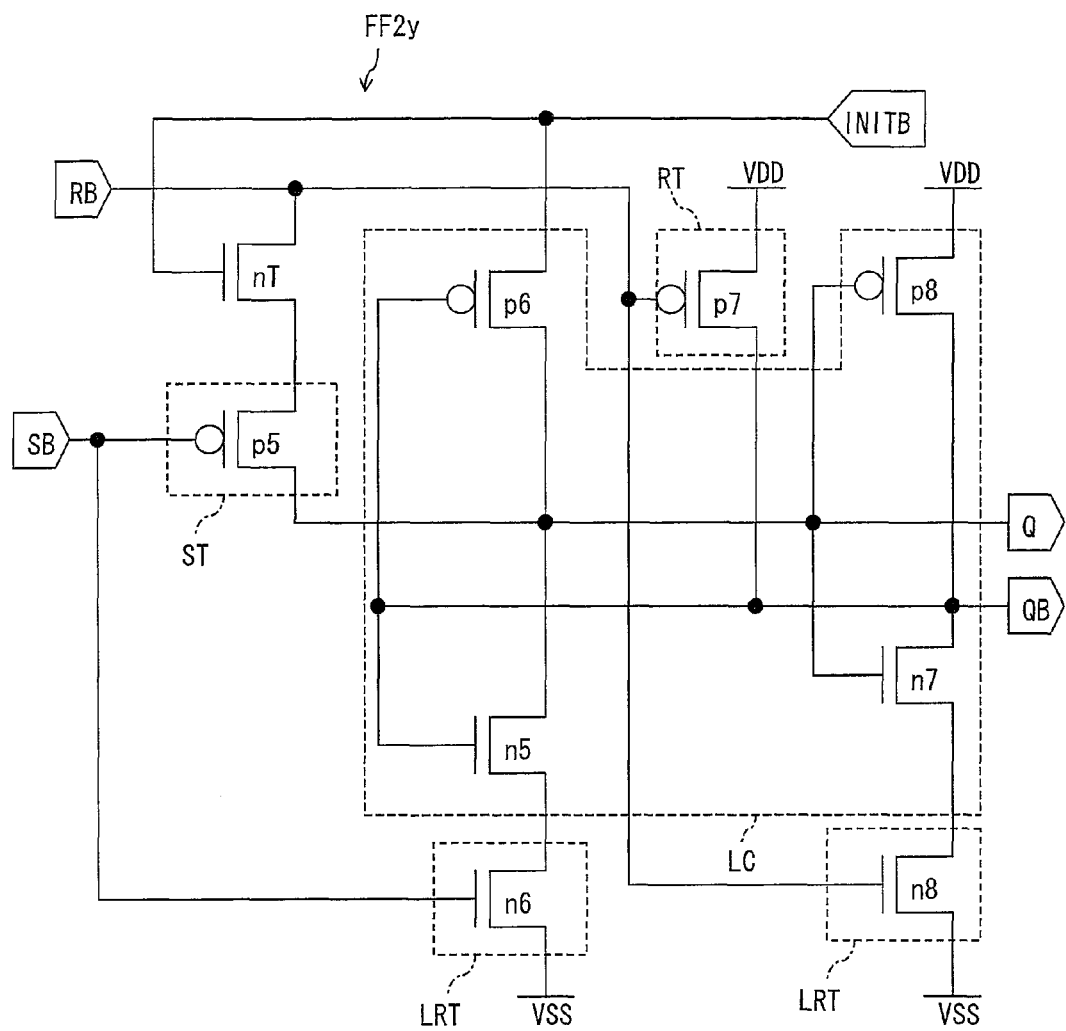

FIG. 22 is a circuit diagram of a flip-flop of the shift register shown in FIG. 18.

Figure 23:
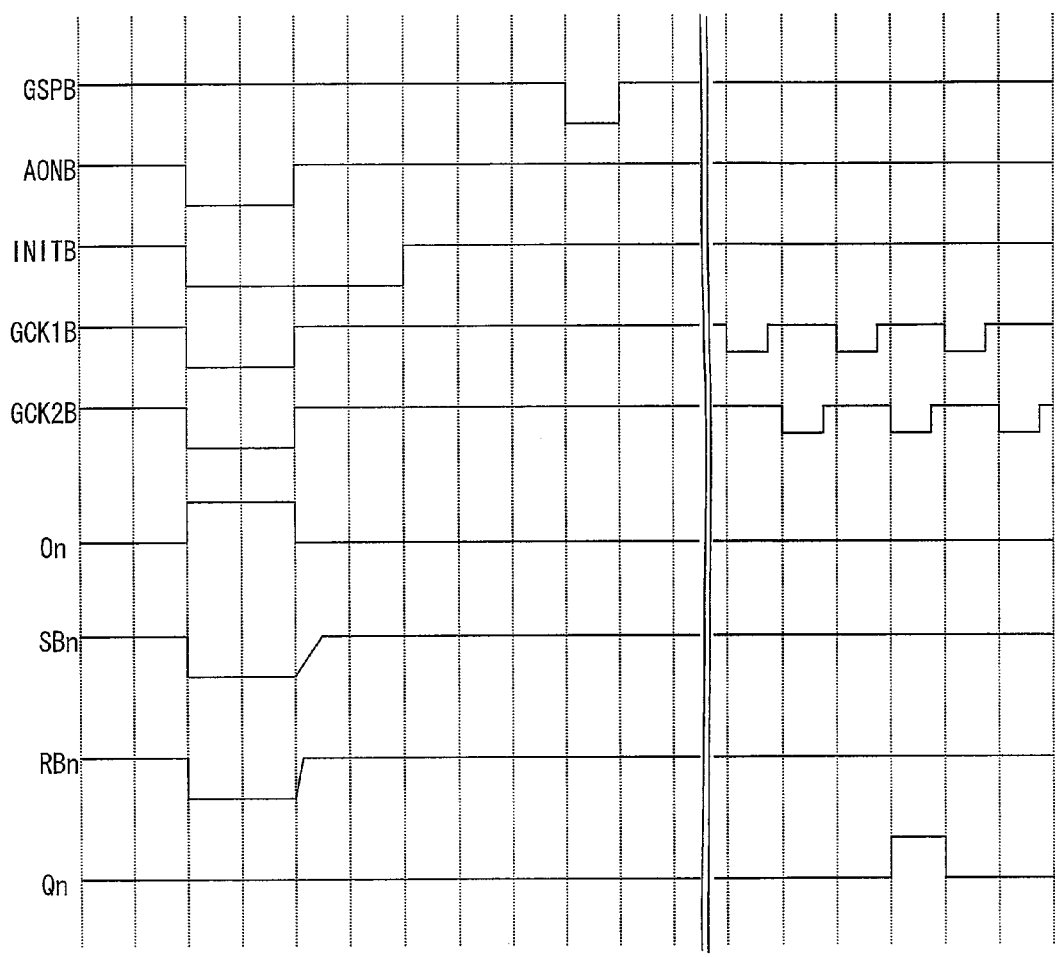

FIG. 23 is a timing chart illustrating how the liquid crystal display device shown in FIG. 18 is driven (in a case where the SB-signal returns after the R-signal returns).

FIG. 24

(a) is a circuit diagram of a flip-flop of the shift register shown in FIG. 18, (b) is an operation timing chart of the flip-flop, and (c) is a truth table of the flip-flop.

Figure 25:
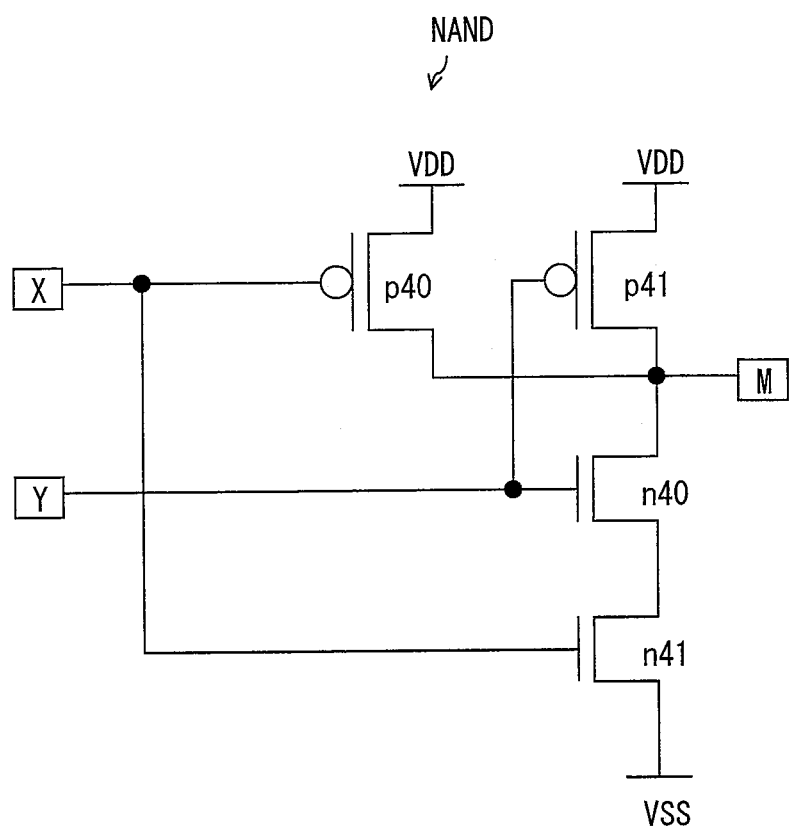

FIG. 25 is a circuit diagram illustrating a concrete configuration of an NAND circuit shown in FIG. 19.

Figure 26:
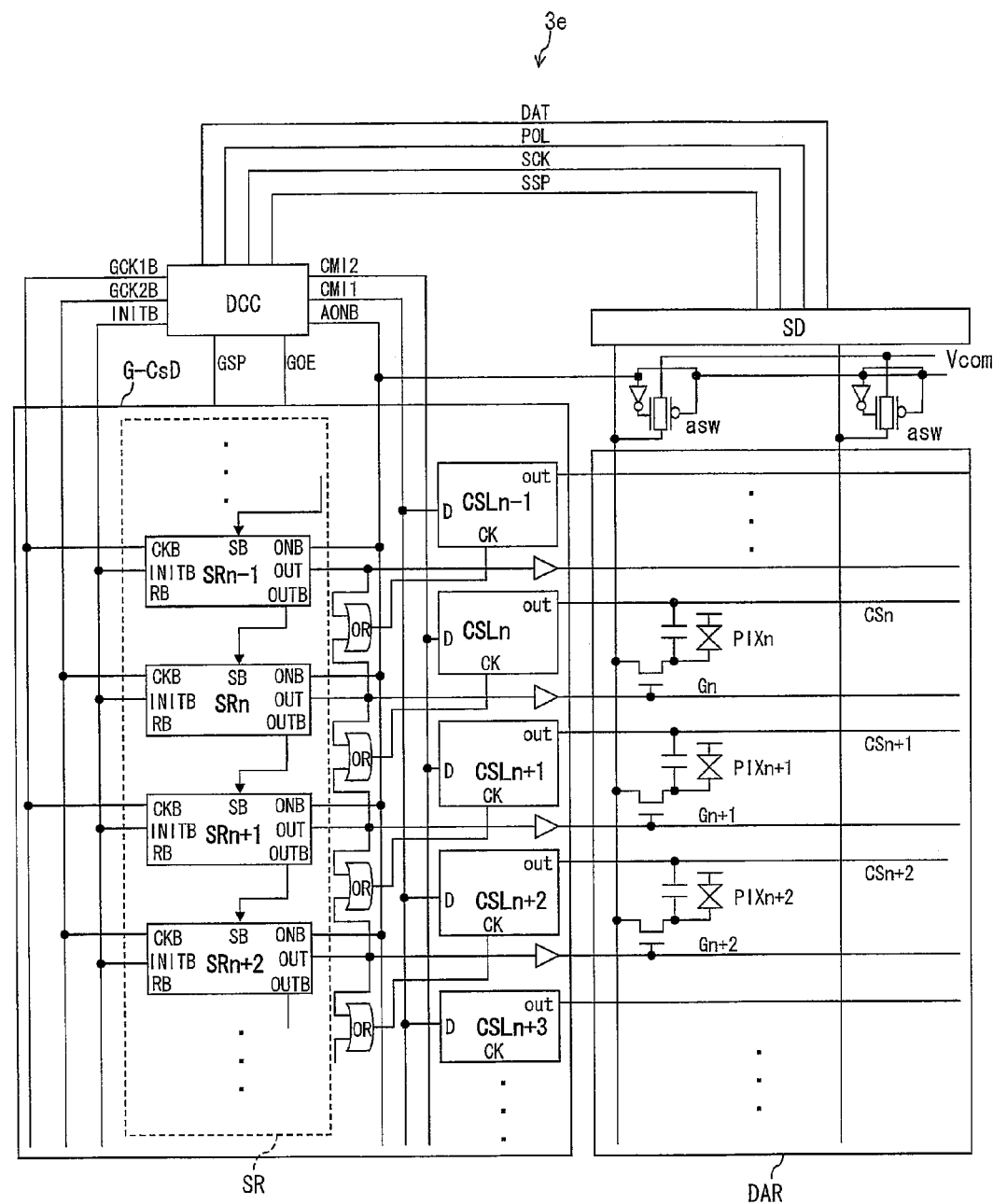

FIG. 26 is a schematic view illustrating a configuration of a liquid crystal display device of Embodiment 3 of the present invention.

Figure 27:
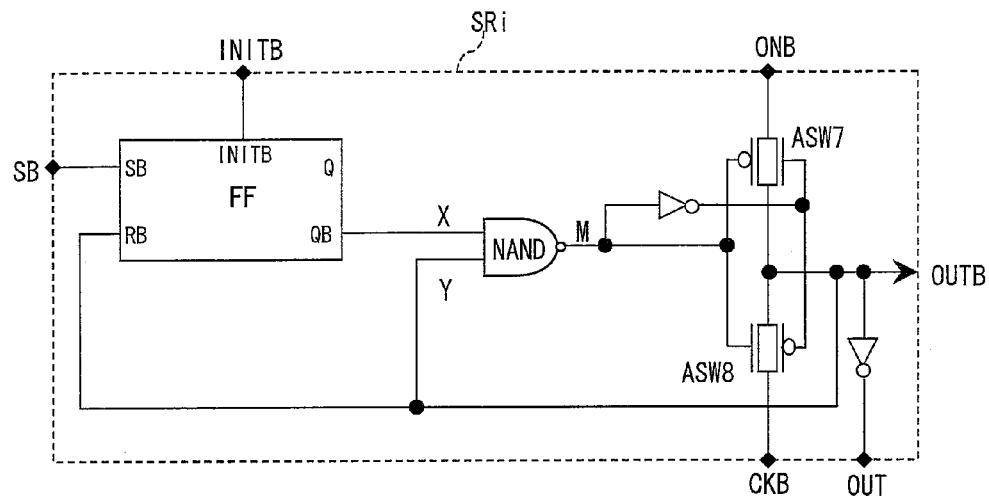

FIG. 27 is a circuit diagram illustrating each stage of a shift register of the liquid crystal display device shown in FIG. 26.

Figure 28:
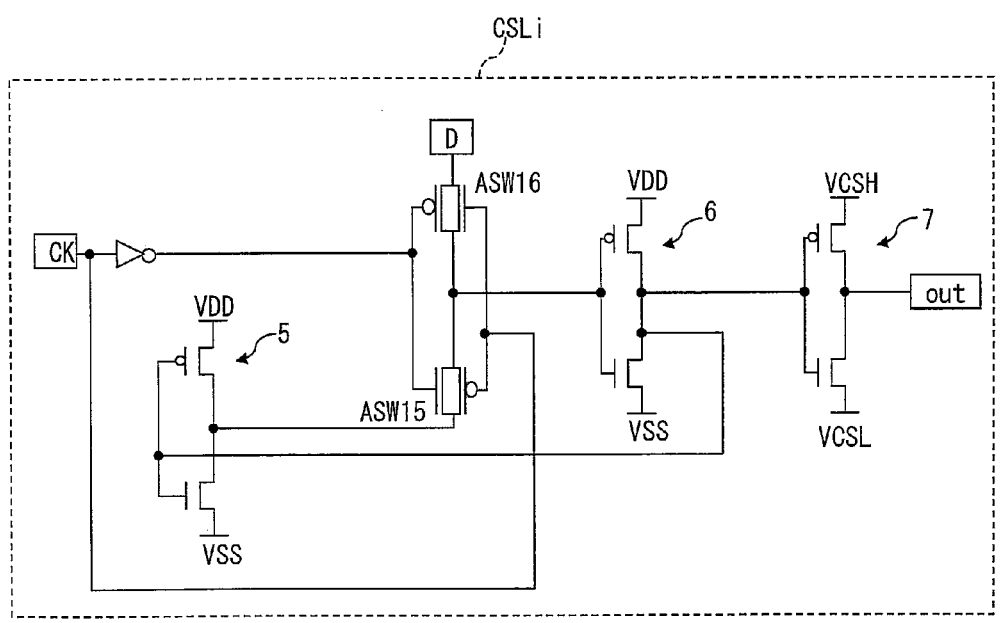

FIG. 28 is a circuit diagram illustrating a D-latch circuit of a G-CS driver of the liquid crystal display device shown in FIG. 26.

Figure 29:
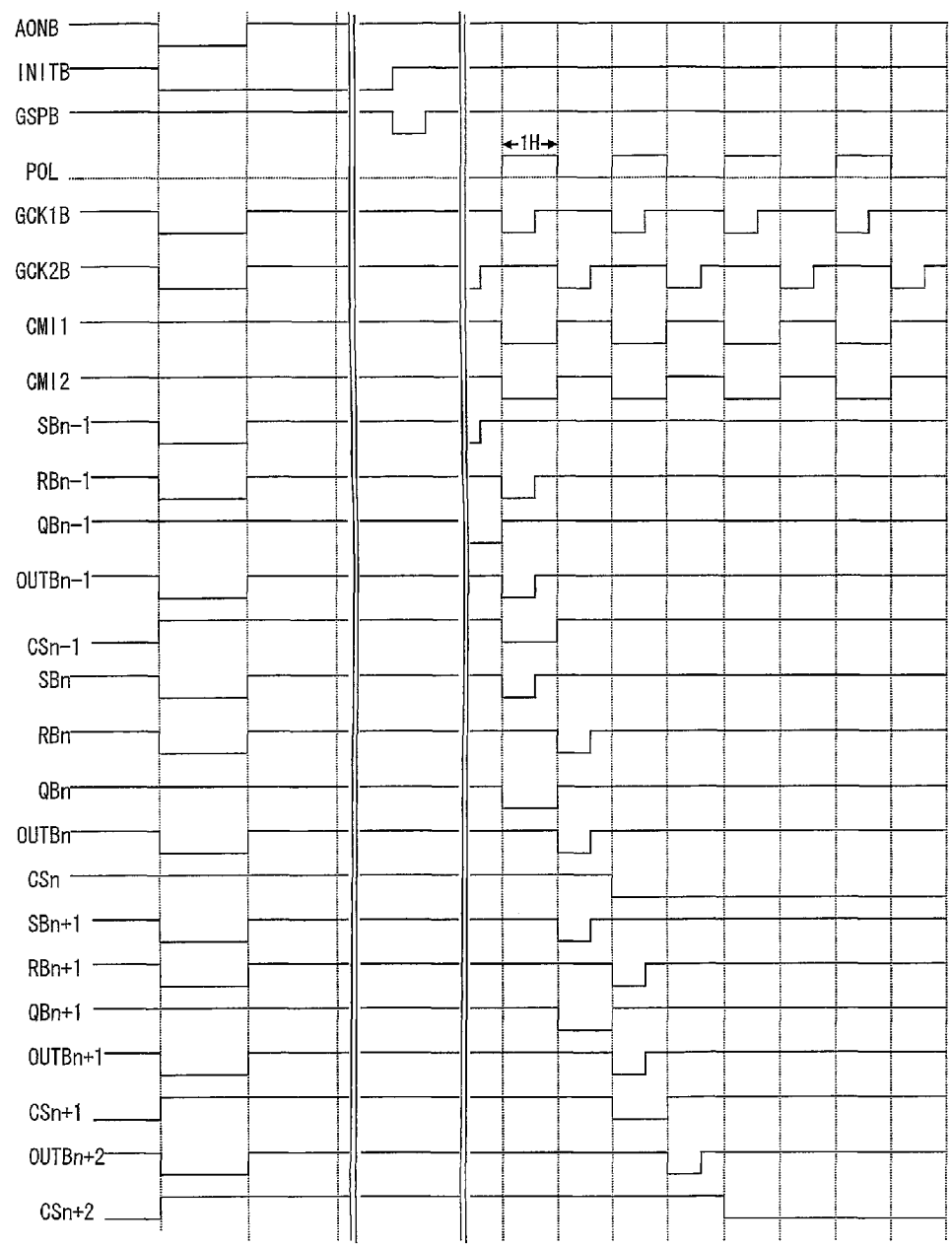

FIG. 29 is a timing chart illustrating how the liquid crystal display device shown in FIG. 26 is driven.

Figure 30:
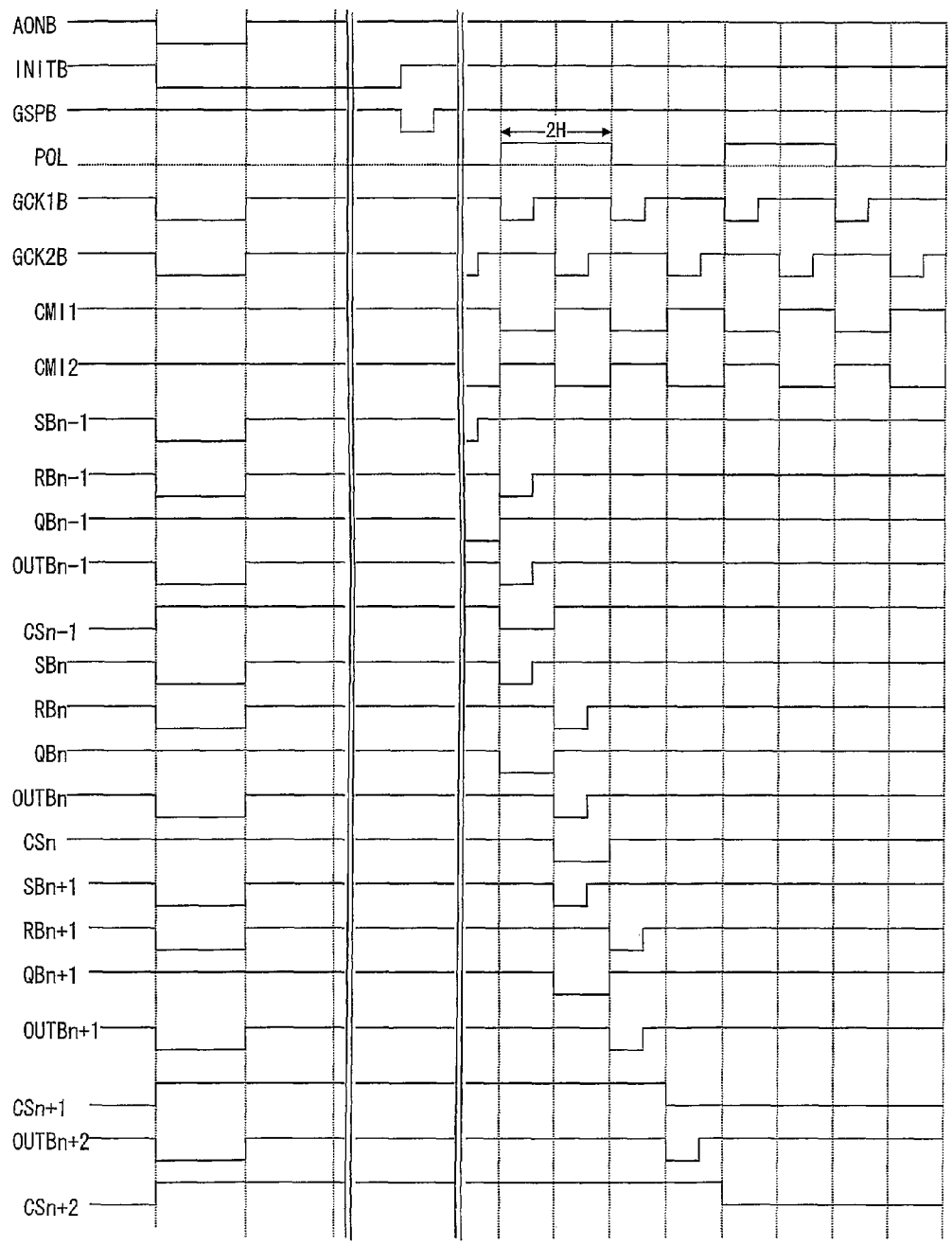

FIG. 30 is a timing chart illustrating how the liquid crystal display device shown in FIG. 26 is driven.

Figure 31:
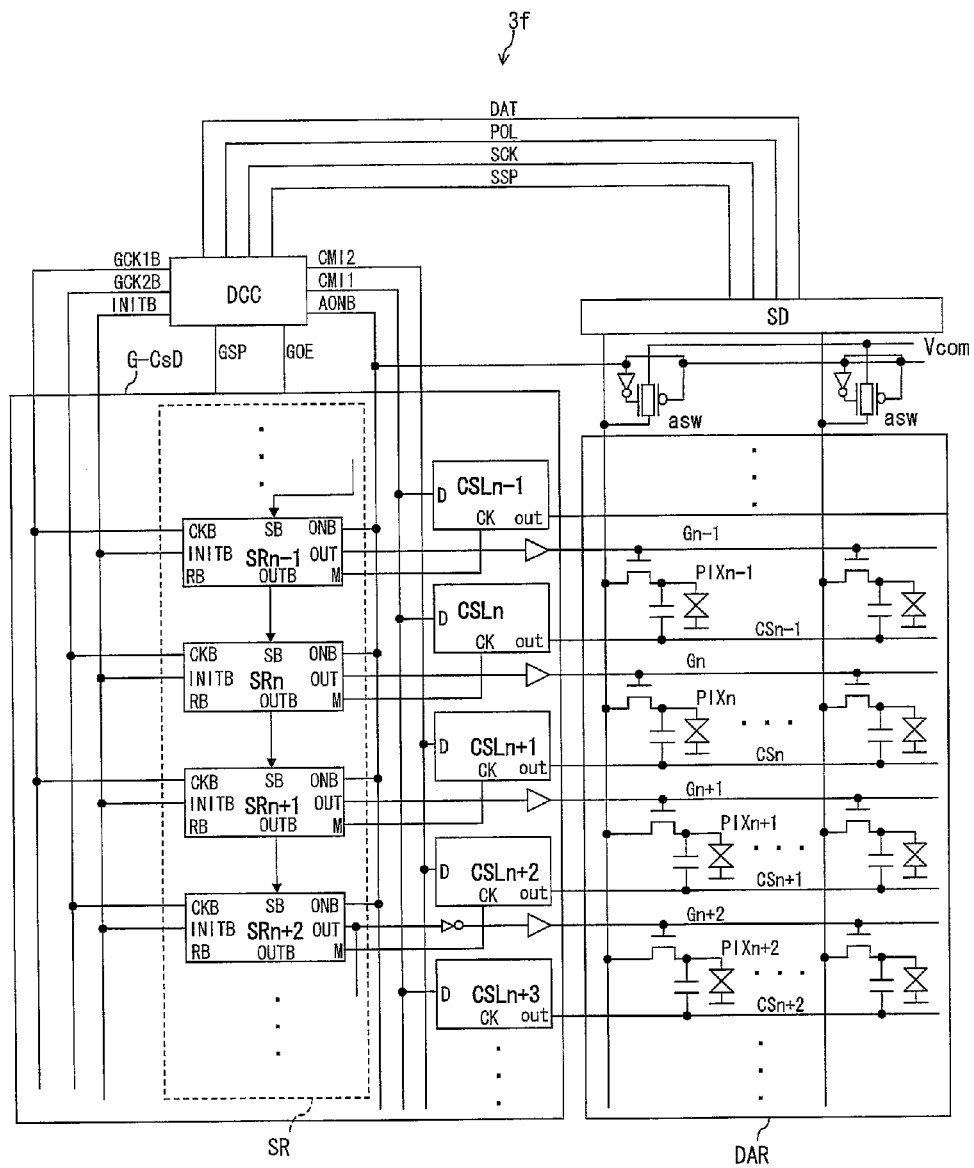

FIG. 31 is a schematic view illustrating a configuration of a liquid crystal display device of Embodiment 4 of the present invention.

Figure 32:
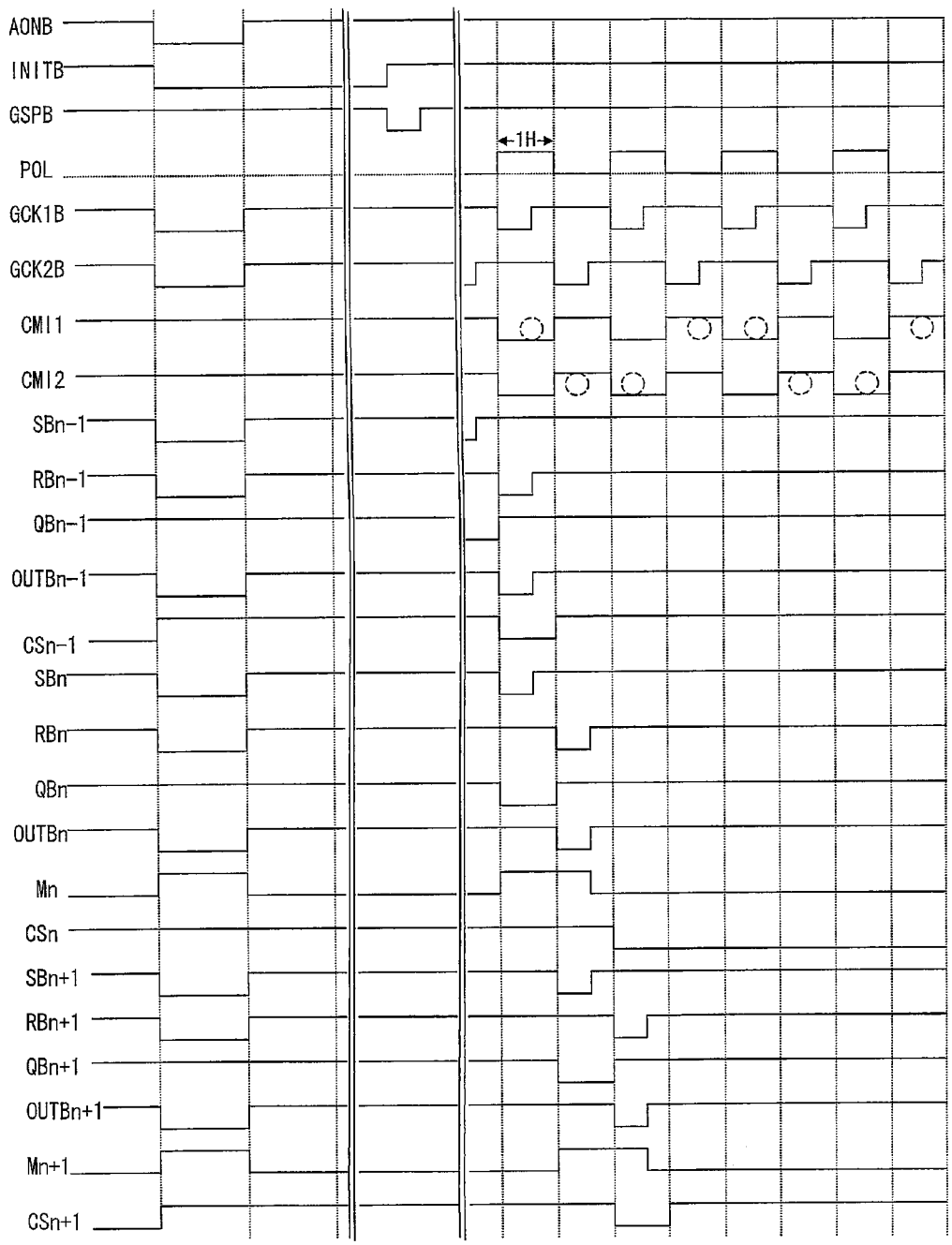

FIG. 32 is a timing chart illustrating how the liquid crystal display device shown in FIG. 31 is driven.

Figure 33:
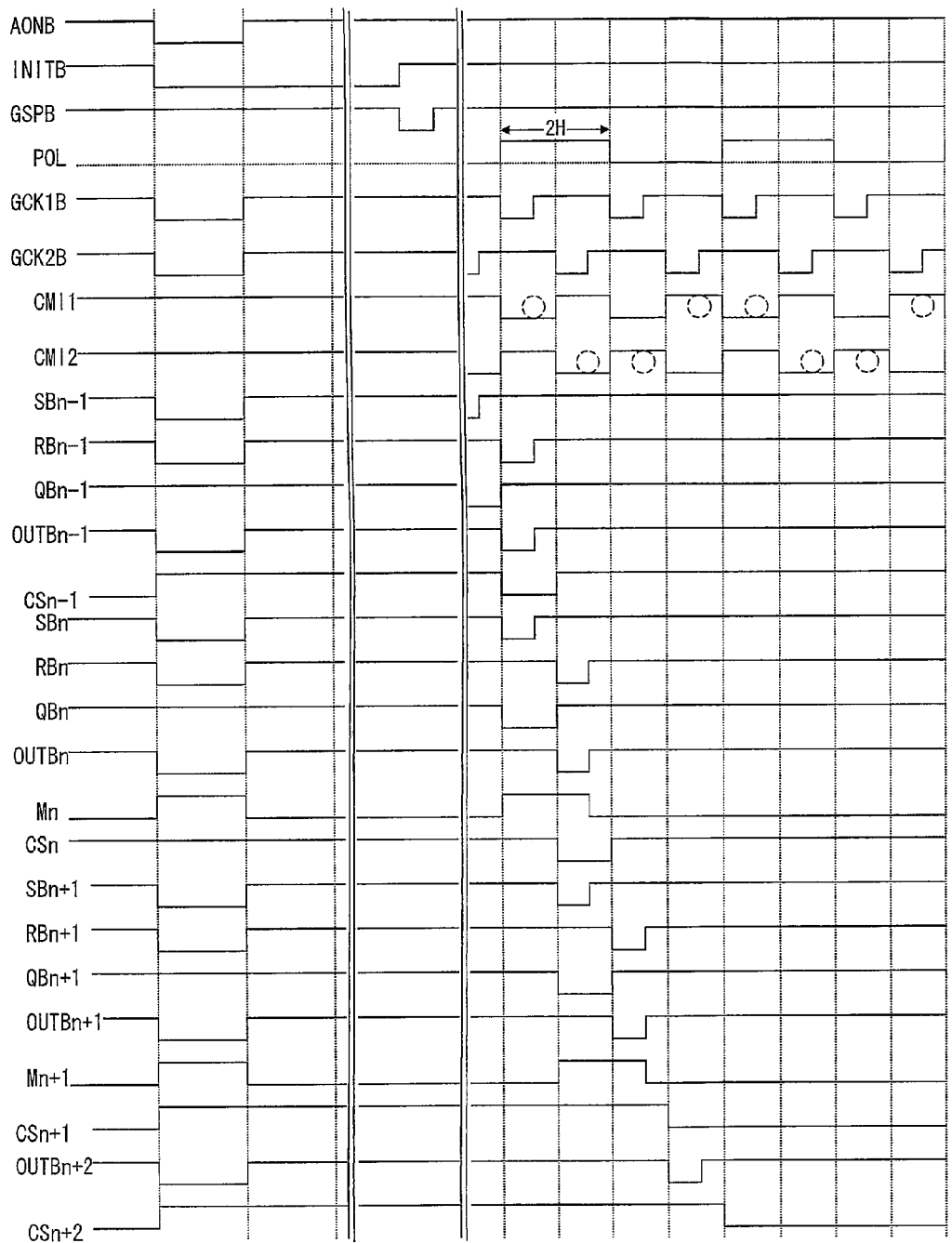

FIG. 33 is a timing chart illustrating how the liquid crystal display device shown in FIG. 31 is driven.

Figure 34:
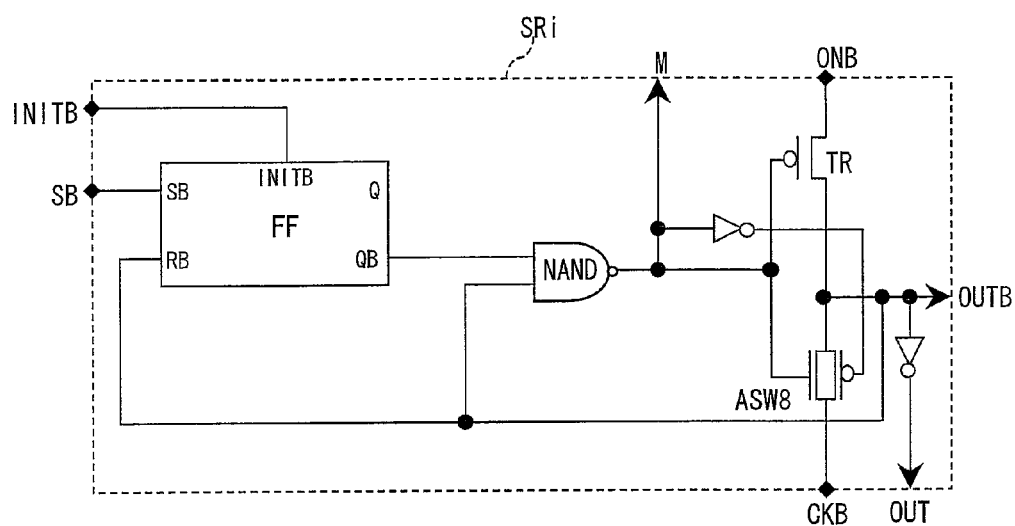

FIG. 34 is a circuit diagram illustrating a configuration example of each stage of a shift register.

Figure 35:
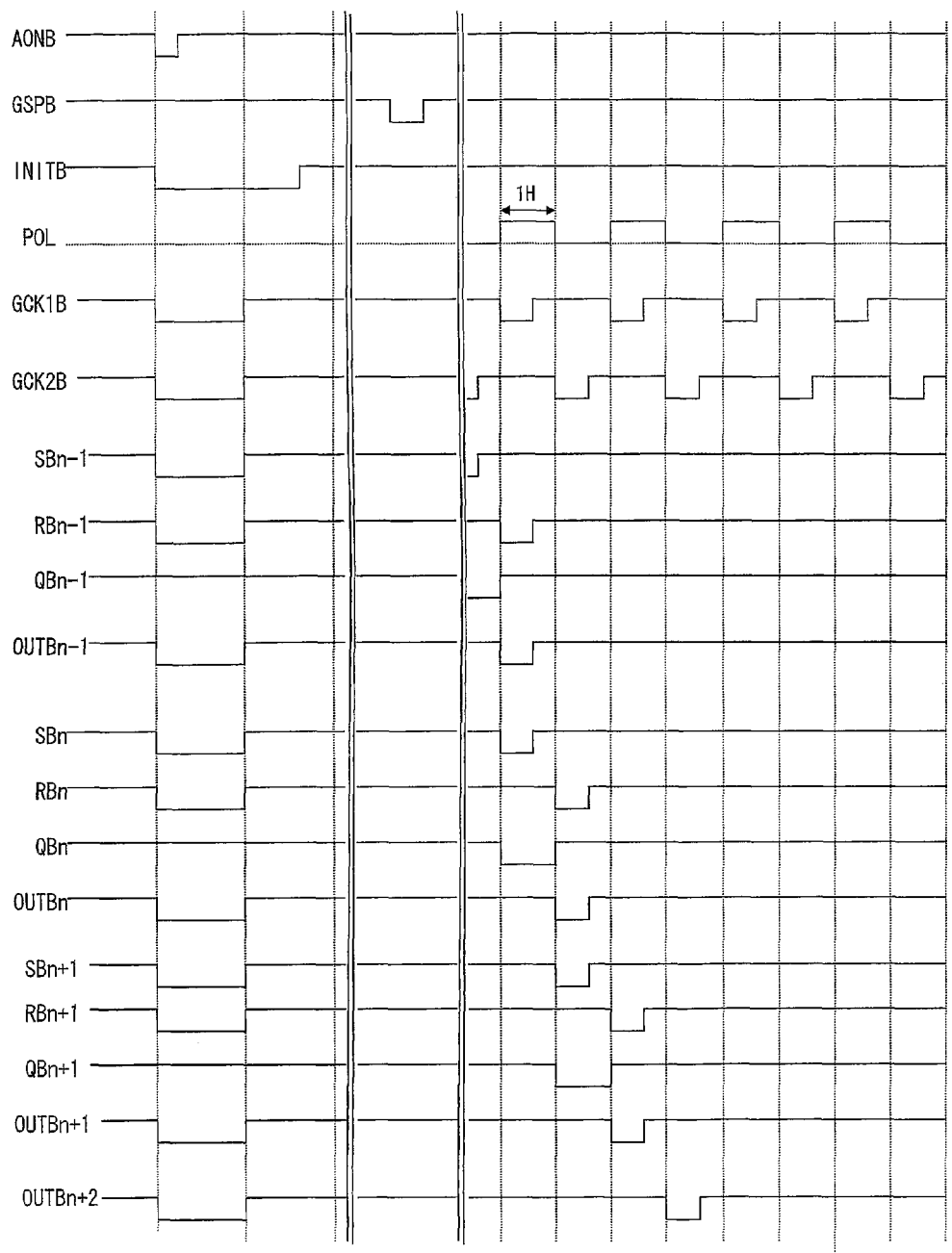

FIG. 35 is a timing chart illustrating a modified example of the configuration shown in FIG. 20.

Figure 36:
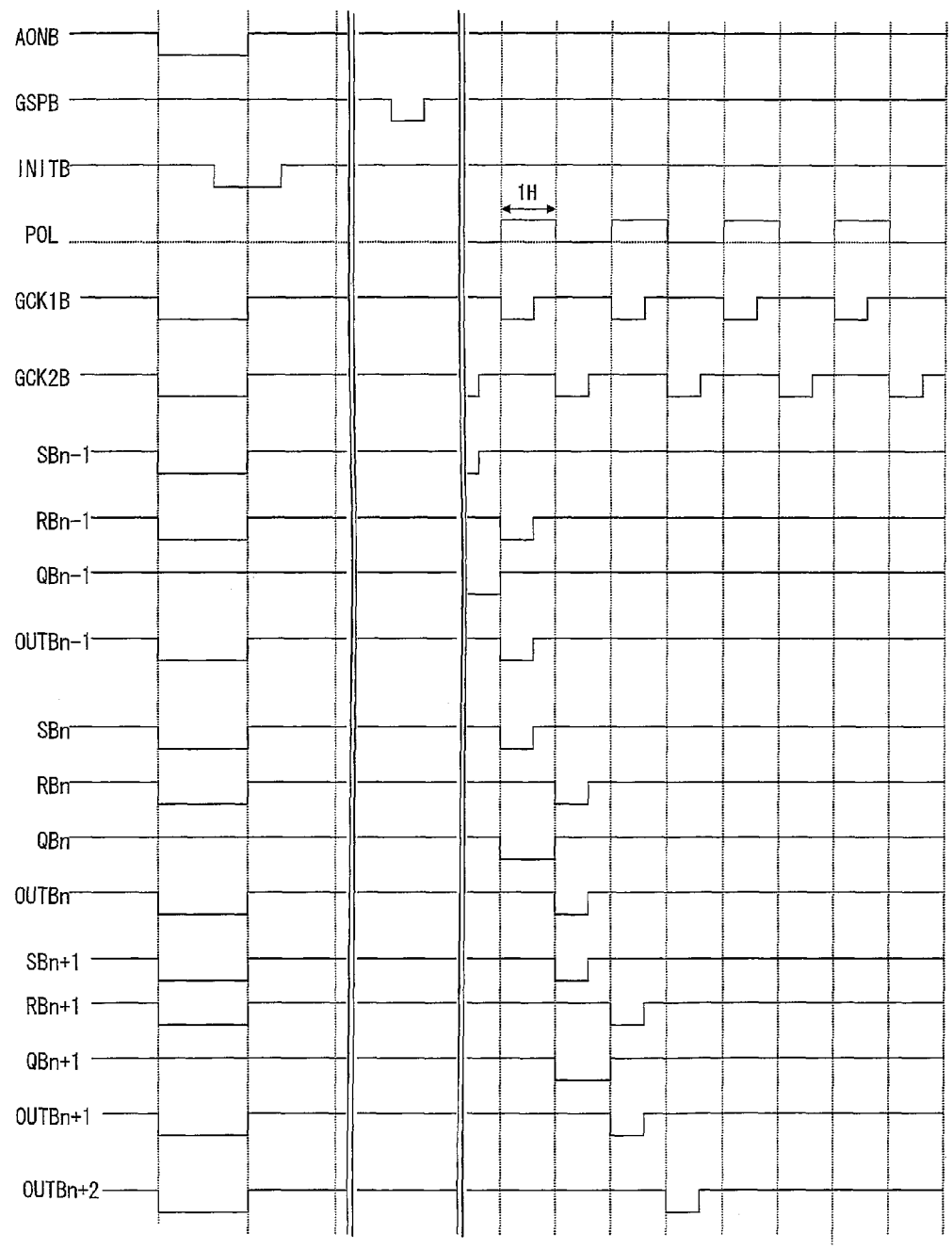

FIG. 36 is a timing chart illustrating another modified example of the configuration shown in FIG. 20.

Figure 37:
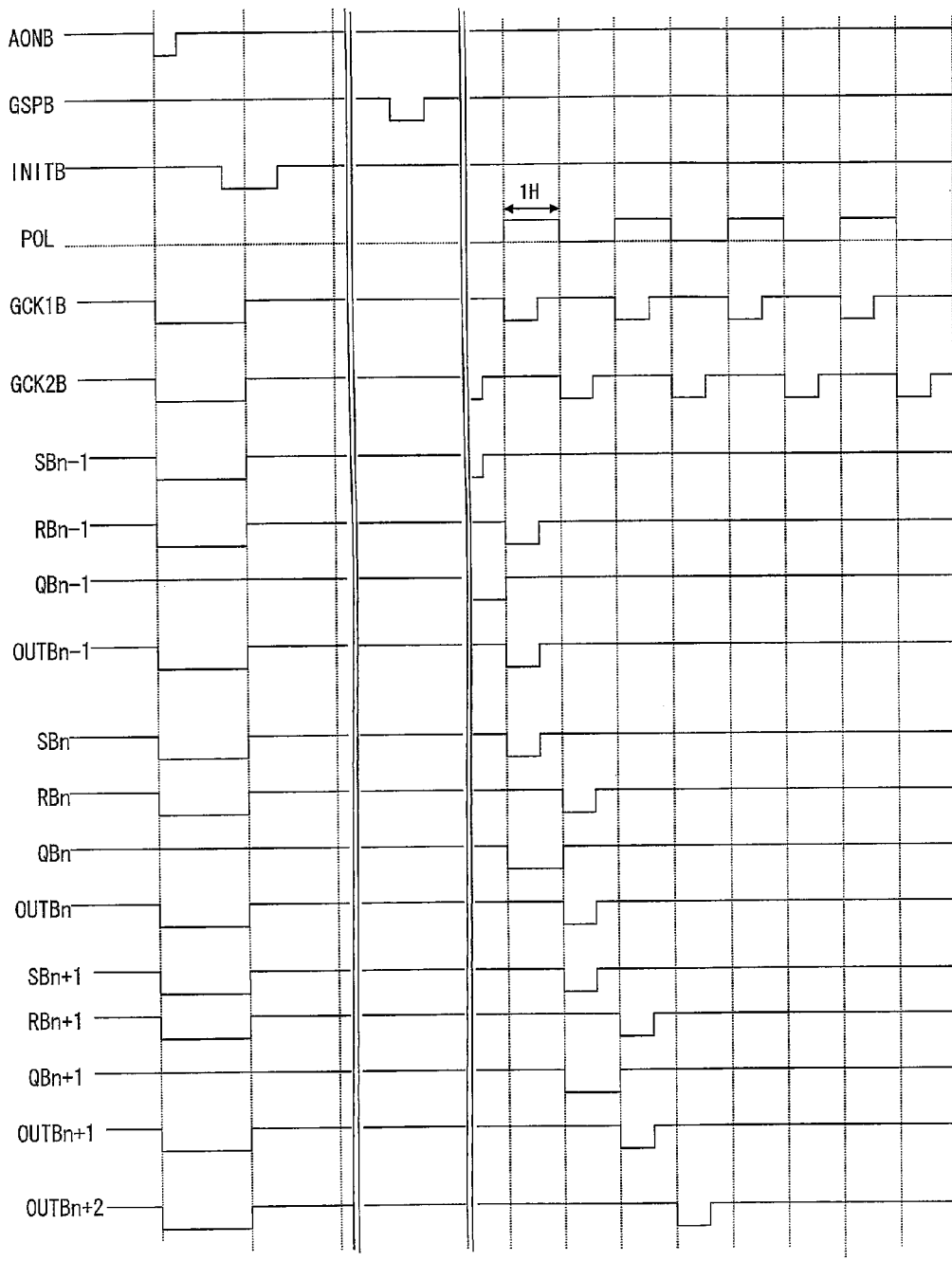

FIG. 37 is a timing chart illustrating yet another modified example of the configuration shown in FIG. 20.

Figure 38:
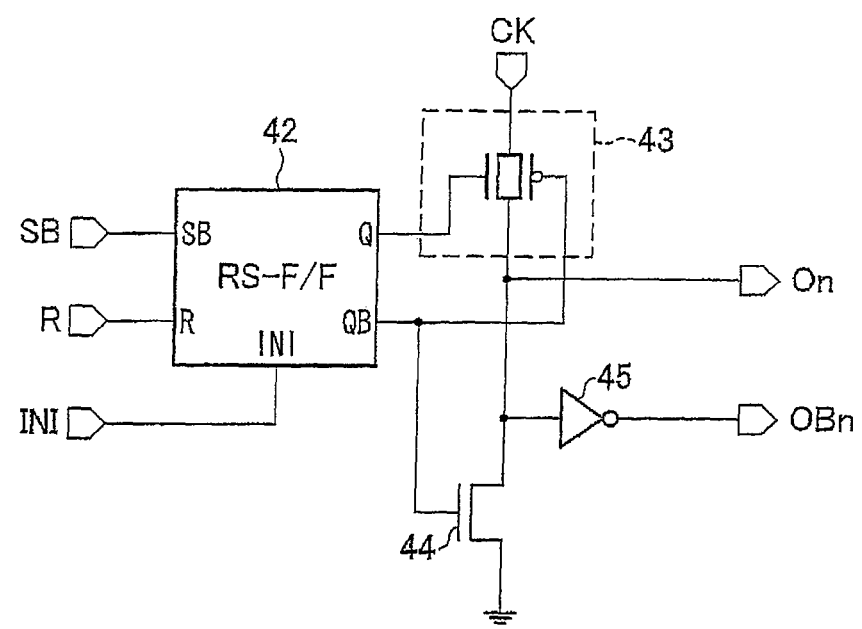

FIG. 38 is a circuit diagram illustrating a configuration of a conventional shift register.

Figure 39:
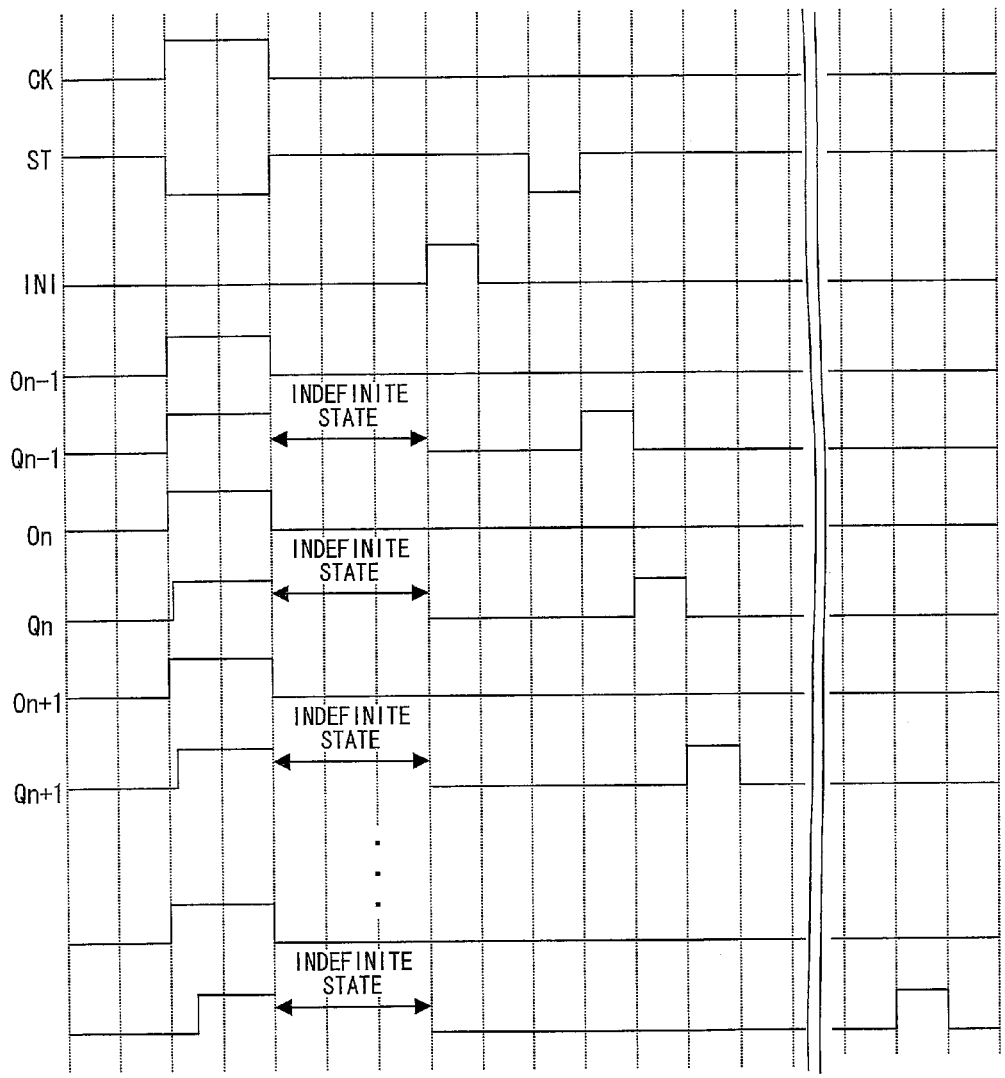

FIG. 39 is a timing chart illustrating how the conventional shift register is driven.

Figure 40:
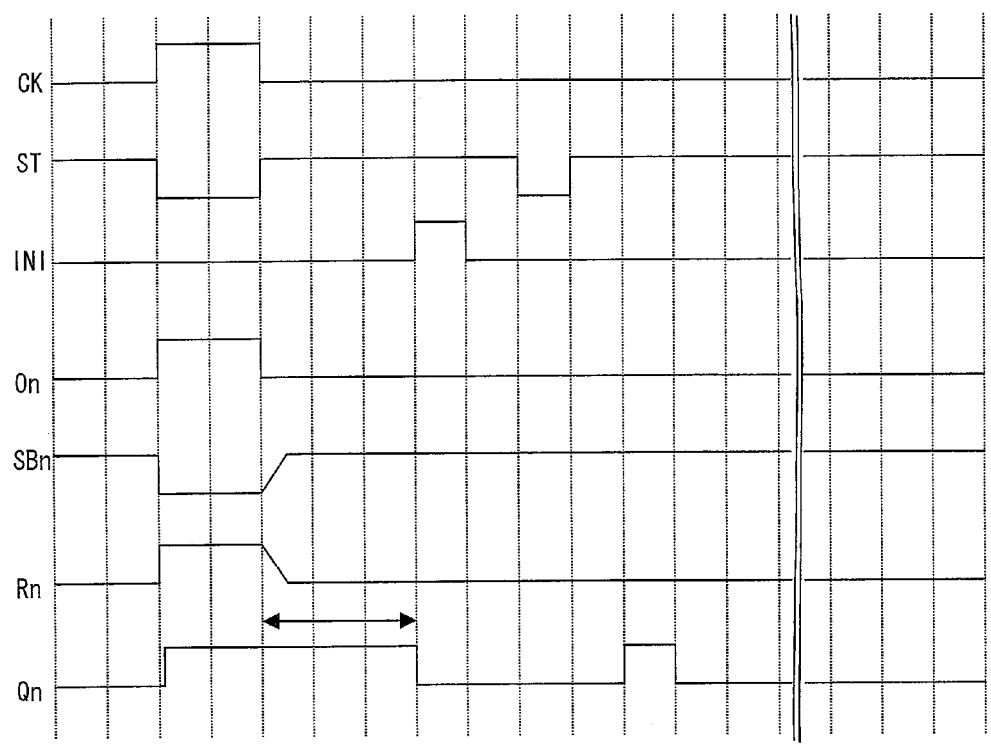

FIG. 40 is a timing chart illustrating how the conventional shift register is driven (in a case where an SB-signal and an R-signal return simultaneously).

Figure 41:
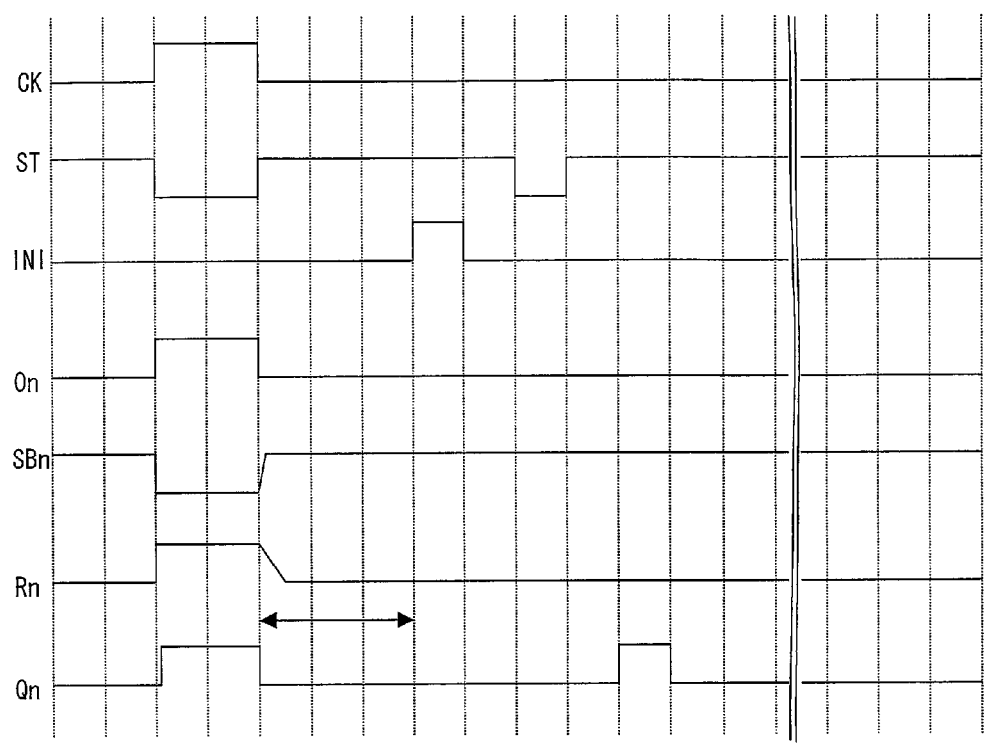

FIG. 41 is a timing chart illustrating how the conventional shift register is driven (in a case where the SB-signal returns before the R-signal returns).

Figure 42:
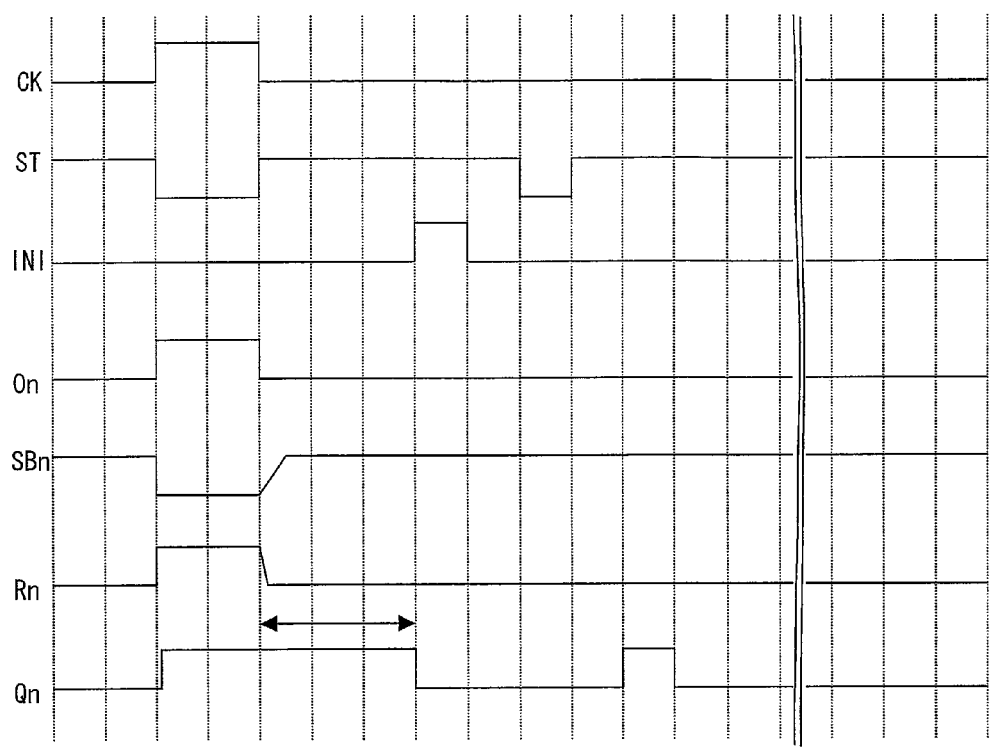

FIG. 42 is a timing chart illustrating how the conventional shift register is driven (in a case where the SB-signal returns after the R-signal returns).

Figure 43:
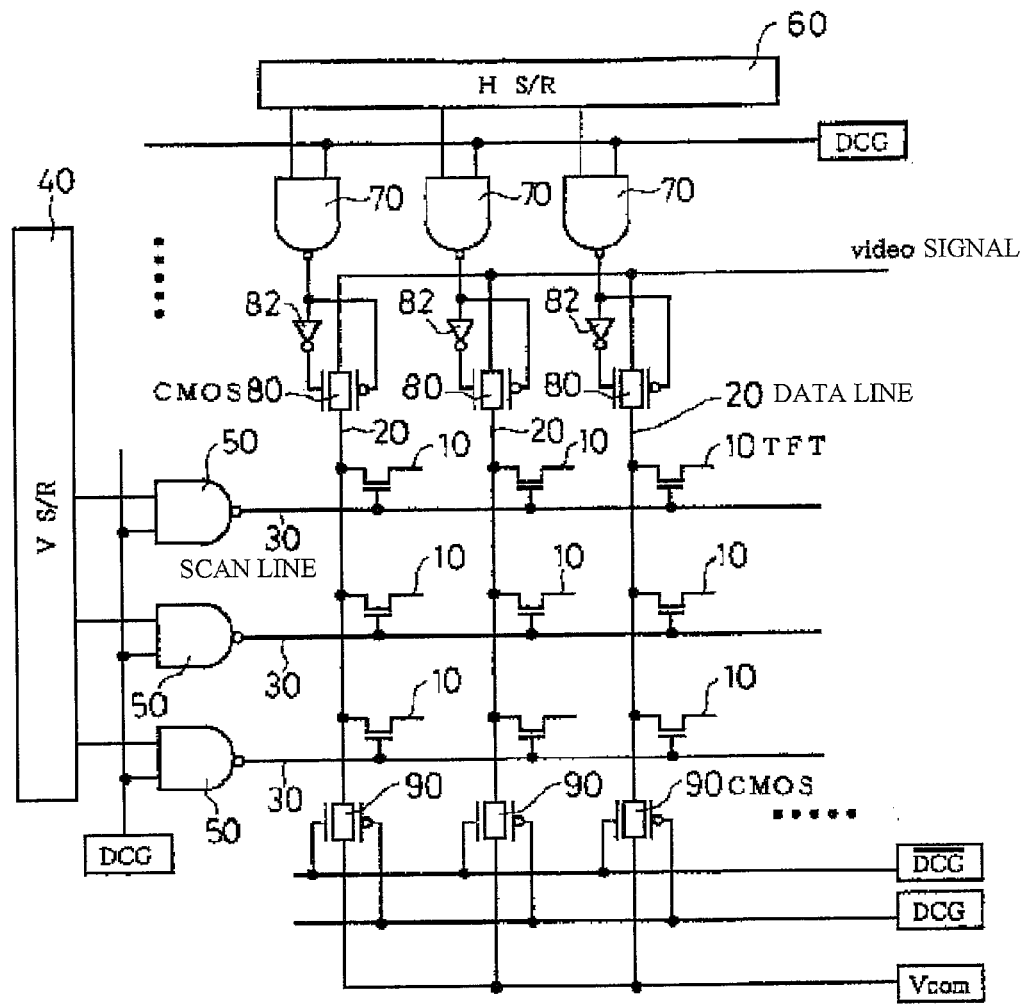

FIG. 43 is a circuit diagram illustrating a configuration of a conventional gate driver.

DESCRIPTION OF EMBODIMENTS

The following describes embodiments of the present invention with reference to FIGS. 1 through 37. Note that, in the following descriptions, it is assumed that a set-reset type flip-flop (hereinafter, sometimes abbreviated to "FF") has (i) a set terminal (an S-terminal or an SB-terminal) to which a setting signal (an S-signal or an SB-signal) is supplied, (ii) a reset terminal (an R-terminal or an RB-terminal) to which a resetting signal (an R-signal or an RB-signal) is supplied, (iii) an initialization terminal (an INI-terminal or an INITB-terminal) to which an initialization signal (an INI-signal or an INITB-signal) is supplied, (iv) an output terminal (a Q-terminal) from which a Q-signal is outputted, and (v) an inverted-output terminal (a QB-terminal) from which a QB-signal is outputted. Note that an electric potential of a high potential side power supply (VDD) is referred to as "Vdd" (hereinafter, sometimes referred to also as "High"), and an electric potential of a low potential side power supply (VSS) is referred to as "Vss" (hereinafter, sometimes referred to also as "Low"). The S-signal (the setting signal), the R-signal (the resetting signal), and the Q-signal (an output signal) become High when each of these signals is in an active state. The SB-signal (a set bar signal), the RB-signal (a reset bar signal), and the QB-signal (an inverted-output signal) become Low when each of these signals is in an active state.

Embodiment 1

FIG. 1 is a circuit diagram illustrating a configuration of a liquid crystal display device 3a of the present invention. The liquid crystal display device 3a includes a display section DAR, a gate driver GD, a source driver SD, and a display control circuit DCC. The display control circuit DCC supplies, to the gate driver GD, an INITB-signal (initialization signal), an AONB-signal (simultaneous selection signal), a gate start pulse GSP, a gate on enable signal GOE, and gate clock signals GCKB1 and GCKB2. Moreover, the display control circuit DCC supplies, to the source driver SD, a source start pulse SSP, digital data DAT, a polarity signal POL, and a source clock signal SCK. The gate driver GD includes a shift register SR having a plurality of stages. Hereinafter, an i-th stage (i=1, . . . n−1, n, n+1, . . . ) of the shift register is shortly referred to as "i-th stage SRi", as appropriate.

An output signal (OUT-signal) of the i-th stage SRi of the shift register is supplied to a scanning signal line Gi of the display section DAR via a buffer. For example, an OUT-signal of an n-th stage SRn is supplied to a scanning signal line Gn via a buffer. In the display section DAR, the scanning signal line Gn is connected to a gate of a transistor which is connected with a pixel electrode in a pixel PIXn. A retention capacitor (auxiliary capacitor) is formed by the pixel electrode in the pixel PIXn and a retention capacitor line CSn.

Moreover, one (1) analog switch asw and one (1) inverter are provided for each data signal line. The inverter has an input terminal connected to an AONB-signal line. One conduction terminal of the analog switch asw is connected to an end of the data signal line, and the other conduction terminal of the analog switch asw is connected to a Vcom (common electrode electric potential) power supply. An n-channel side gate of the analog switch asw is connected to an output terminal of the inverter, and a p-channel side gate of the analog switch asw is connected to the AONB-signal line.

FIG. 2 is a circuit diagram partially illustrating a concrete configuration of the shift register SR. As shown in FIG. 2, each of the stages of the shift register includes (i) a set-reset type flip-flop FF having an SB-terminal, an R-terminal, and an INITB-terminal, (ii) two analog switches ASW9 and ASW10, (iii) an inverter, (iv) a CKB terminal, (v) an ONB terminal, (vi) an OUTB terminal, and (vii) an OUT terminal. A Q-terminal of the flip-flop FF is connected to a p-channel side gate of the analog switch ASW9 and an n-channel side gate of the analog switch ASW10. A QB-terminal of the flip-flop FF is connected to an n-channel side gate of the analog switch ASW9 and a p-channel side gate of the analog switch ASW10. One conduction electrode of the analog switch ASW9 is connected to the ONB terminal, and one conduction electrode of the analog switch ASW10 is connected to the CK terminal. The other conduction electrode of the analog switch ASW9, the other conduction electrode of the analog switch ASW10, and the OUTB terminal, which serves as an output terminal of that stage, are connected with each other. The OUTB terminal is connected to the OUT terminal via the inverter.

In the shift register SR, the each of the stages has an OUTB terminal and an R-terminal which are connected to an SB-terminal and an OUT terminal of a following stage, respectively. For example, an OUTB terminal of the n-th stage SRn is connected to an SB-terminal of an (n+1)th stage SRn+1, and an OUT terminal of the (n+1)th stage SRn+1 is connected to an R-terminal of the n-th stage SRn. Note that a first stage SR1 of the shift register SR has an SB-terminal to which a GSPB signal is supplied. In the gate driver GD, the INITB-terminals of the flip-flops of the respective stages are connected to an INITB-signal line, and the ONB terminals of the respective stages are connected to the AONB-signal line. Moreover, a CKB terminal of an odd-numbered stage is connected to a GCKB line (via which the gate clock signal GCKB is supplied) which is different from a GCKB line to which a CKB terminal of an even-numbered stage is connected. For example, a CKB terminal of the n-th stage SRn is connected to a GCK2B signal line, and a CKB terminal of the (n+1)th stage SRn+1 is connected to a GCK1B signal line.

Figure 3:
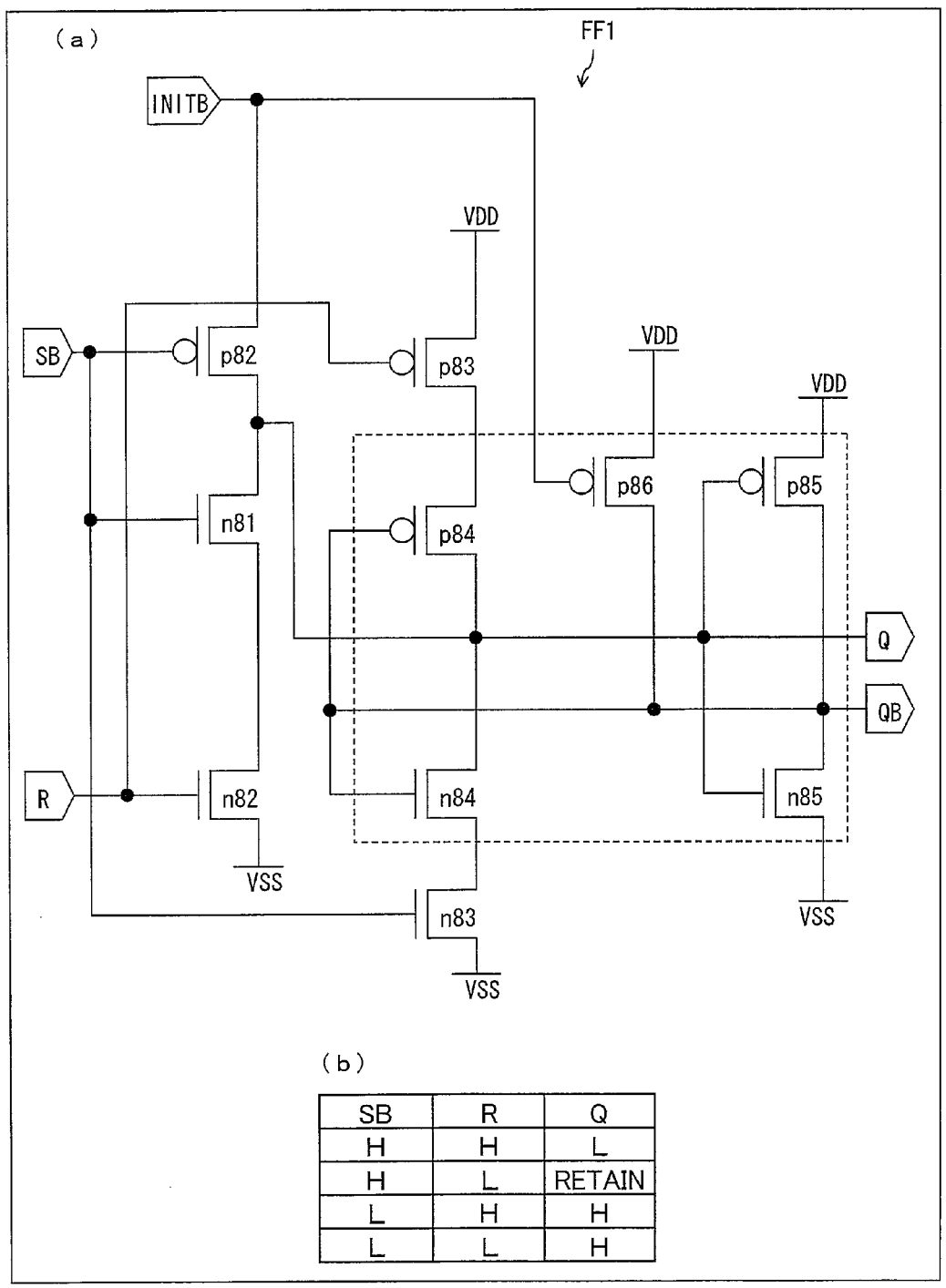
FIG. 3

As the flip-flop FF shown in FIG. 2, a flip-flop FF1 shown in FIG. 3 is used. As shown in FIG. 3, the flip-flop FF1 includes (i) a p-channel transistor p84 and an n-channel transistor n84 which constitute a CMOS circuit, (ii) a p-channel transistor p85 and an n-channel transistor n85 which constitute a CMOS circuit, (iii) p-channel transistors p82, p83, and p86, (iv) n-channel transistors n81, n82, and n83, and (v) an SB-terminal, an R-terminal, a Q-terminal, and a QB-terminal. A gate of the transistor p84, a gate of the transistor n84, a drain of the transistor p85, a drain of the transistor n85, a drain of the transistor p86, and the QB-terminal are connected with each other. A drain of the transistor p84, a drain of the transistor n84, a drain of the transistor p82, a drain of the transistor n81, a gate of the transistor p85, a gate of the transistor n85, and the Q-terminal are connected with each other. A source of the transistor n84 is connected to a drain of the transistor n83. A source of the transistor n84 is connected to the drain of the transistor n83. A source of the transistor n81 is connected to a drain of the transistor n82. The INITB-terminal is connected to a source of the transistor p82 and a gate of the transistor p86. The SB-terminal is connected to a gate of the transistor p82, a gate of the transistor n81, and a gate of the transistor n83. The R-terminal is connected to a gate of the transistor n82 and a gate of the transistor p83. A source of the transistor n85 is connected to the VSS. Sources of the transistors p82, p83, p85, and p86 are connected to the VDD. Sources of the transistors n82, n83, and n85 are connected to the VSS.

(b) of FIG. 3 is a truth table of the flip-flop FF1. A Q-signal of the flip-flop FF1 is to have a state as follows (see (b) of FIG. 3): during a period in which an SB-signal is High (inactive) and an R-signal is High (active), the Q-signal is Low (inactive); during a period in which the SB-signal is High (inactive) and the R-signal is Low (inactive), the Q-signal is in a retention state; during a period in which the SB-signal is Low (active) and the R-signal is High (active), the Q-signal is High (active); and during a period in which the SB-signal is Low (active) and the R-signal is Low (inactive), the Q-signal is High (active).

In the flip-flop FF1, in a case where both the SB-signal and the R-signal become inactive while the INITB-terminal is being active (Low), the transistor p82 and the transistor n86 are turned off and the transistors p85, p86, n83, and n84 are turned on, and thereby the Q-signal becomes Low and the QB-signal becomes High (inactive). In a case where both the SB-signal and the R-signal become active while the INITB-terminal is being active (Low), the transistors p82, p86, and p85 are turned on, and thereby the Q-signal becomes Low and the QB-signal becomes High (inactive). Moreover, in the flip-flop FF1, in a case where the SB-signal becomes active (Low) and the R-signal becomes inactive (High) while the INITB-terminal is being active (Low), the transistor p82 and the transistor p85 are turned on and the transistor p84 is turned off, and thereby the Q-signal becomes Low and the QB-signal becomes High (inactive). In a case where the SB-signal becomes inactive (High) and the R-signal becomes active (High) while the INITB-terminal is being active (Low), the transistors n81, n82, and p85 are turned on, and thereby the Q-signal becomes Low and the QB-signal becomes High (inactive).

FIG. 4 is a timing chart illustrating how the liquid crystal display device 3*a* is driven when a power supply is turned on. Note that, in each of the drawings, "AONB" indicates an AONB-signal (simultaneous selection signal), "INITB" indicates an INITB-signal (initialization signal), "GSPB" indicates a gate start pulse bar signal, "GCK1B" indicates a GCK1B signal, "GCK2B" indicates a GCK2B signal. Moreover, "SBi", "Ri", "Qi", and "OUTi" (i=n−1, n, n+1) indicate an SB-signal (i.e., an electric potential at the SB-terminal), an R-signal (i.e., an electric potential at the R-terminal), a Q-signal (i.e., an electric potential at the Q-terminal), and an OUT-signal (i.e., an electric potential at the OUT terminal) in the i-th stage SRi, respectively.

In the liquid crystal display device 3a, for example, the following preparation operation is carried out when the power supply is turned on. Specifically, the AONB-signal and the INITB-signal simultaneously become active (Low), and then the INITB-signal returns to inactive (High) after the AONB-signal returns to inactive (High). In each of the stages of the shift register SR, the analog switch ASW9 is in an on state. Therefore, OUT-signals of all the stages become active (High), and accordingly all the scanning signal lines are selected. At the time, the analog switches asw provided for the respective data signal lines are turned on, and accordingly the Vcom is applied to all the data signal lines. Moreover, in the flip-flop of each of the stages, the INITB-signal becomes active (Low), and thereby the Q-signal becomes Low (inactive) and the QB-signal becomes High (inactive). After the end of the preparation operation (i.e., after the AONB-signal becomes inactive), the Vcom is written into all the pixels PIX in the display section DAR, and the shift register SR is initialized (i.e., an output of the flip-flop in the each stage becomes inactive).

Moreover, in the shift register SR of the liquid crystal display device 3a, the following operation is carried out in each vertical scan period (at which a frame is displayed). Specifically, each stage of the shift register SR is configured as follows. When an SB-signal supplied to a stage in the shift register SR becomes active (Low), a flip-flop FF of the stage is set and accordingly a Q-signal becomes High (active). This causes a GCKB signal to be received by the stage via an analog switch ASW10. When the GCKB signal in the stage becomes active (High), an OUTB-signal of the stage becomes active (Low) and an SB-signal in a following stage of the stage becomes active. This causes an OUTB-signal of a flip-flop FF of the following stage of the stage to become active, and accordingly a GCKB signal is received by the following stage of the stage. When the GCKB signal in the following stage of the stage becomes active (Low), the flip-flop FF of the stage is reset and accordingly the Q-signal becomes Low (inactive). This causes an analog switch ASW9 of the stage to be turned on. At the time, the AONB-signal is High, and accordingly the OUTB-signal of the stage becomes also High (inactive).

In the liquid crystal display device 3a, for example, it is possible to apply an identical electric potential (e.g., Vcom) to all the pixels by simultaneously selecting all the scanning signal lines when the power supply is turned on. This makes it possible to prevent a disordered screen caused when the power supply is turned on. Here, the following describes a state of an output Q of the flip-flop in the shift register during a period in which the INITB-signal is being active (Low). That is, even in a case where both the SB-signal and the R-signal are shifted as follows: "active→inactive" (see FIG. 5), the output Q of the flip-flop is consistently inactive (Low); even in a case where the SB-signal is shifted as follows: "active→inactive→inactive" while the R-signal is shifted as follows: "active→active→inactive" (see FIG. 6), the output Q of the flip-flop is consistently inactive (Low); and even in a case where the SB-signal is shifted as follows: "active→active→inactive" while the R-signal is shifted as follows: "active→inactive→inactive" (see FIG. 7), the output Q of the flip-flop is consistently inactive (Low). This makes it possible to stabilize operation of the shift register while the shift register is returning from the simultaneous selection and after the simultaneous selection.

The AONB-signal is supplied to the analog switch ASW9, and it is therefore possible to reduce a size of the gate driver, as compared to a conventional configuration such as that shown in FIG. 43. Moreover, it is possible to complete the preparation operation more quickly, as compared to the conventional configuration in which simultaneous selection and initialization of the shift register are separately carried out.

FIG. 8 is a circuit diagram illustrating a configuration of a liquid crystal display device 3b in which the shift register SR shown in FIG. 1 is provided on a source driver side. In the configuration, a source start pulse SSP is supplied to the first stage of the shift register SR, and a source clock bar signal SCK1B or SCK2B is supplied to the CKB terminal of the each stage. Moreover, the OUT-signal outputted from the i-th stage SRi is supplied to a sampling circuit SAC, and data sampled based on the OUT-signal is supplied to a data signal line SLi of the display section DAR via a DAC. For example, the OUT-signal of the n-th stage SRn is supplied to the sampling circuit SAC, and then data sampled based on the OUT-signal is supplied to a data signal line SLn of the display section DAR via the DAC. In the display section DAR, the data signal line SLn is connected to a source of a transistor connected with a pixel electrode in the pixel PIXn.

FIG. 9 is a circuit diagram illustrating a configuration of a liquid crystal display device 3c, which is configured by modifying the liquid crystal display device 3a. FIG. 10 is a circuit diagram partially illustrating a shift register SR of the liquid crystal display device 3c. As shown in FIG. 10, each stage of the shift register includes (i) a set-reset type flip-flop FF having an SB-terminal, an RB-terminal, and an INITB-terminal, (ii) two analog switches ASW3 and ASW4, (iii) an inverter, and (iv) a CKB terminal, an ONB terminal, an OUT terminal, and an OUTB terminal. A Q-terminal of the flip-flop FF is connected to a p-channel side gate of the analog switch ASW3 and an n-channel side gate of the analog switch ASW4. A QB-terminal of the flip-flop FF is connected to an n-channel side gate of the analog switch ASW3 and a p-channel side gate of the analog switch ASW4. One conduction electrode of the analog switch ASW3 is connected to the ONB terminal, and one conduction electrode of the analog switch ASW4 is connected to the CKB terminal. The other conduction electrode of the analog switch ASW3, the other conduction electrode of the analog switch ASW4, and the OUTB terminal, which serves as an output terminal of that stage, are connected with each other. The OUTB terminal is connected to the OUT terminal via the inverter.

In the shift register SR, each of the stages has an OUTB terminal and an RB-terminal which are connected to an SB-terminal and an OUTB terminal of a following stage, respectively. For example, an OUTB terminal of an n-th stage SRn is connected to an SB-terminal of an (n+1)th stage SRn+1, and an OUTB terminal of the (n+1)th stage SRn+1 is connected to an RB-terminal of the n-th stage SRn. Note that a first stage SR1 of the shift register SR has an SB-terminal to which a GSPB signal is supplied. In the gate driver GD, the INITB-terminals of the flip-flops of the respective stages are connected to an INITB-signal line, and the ONB terminals of the respective stages are connected to the AONB-signal line. Moreover, a CKB terminal of an odd-numbered stage is connected to a GCKB line (via which the gate clock signal GCKB is supplied) which is different from a GCKB line to which a CKB terminal of an even-numbered stage is connected. For example, a CKB terminal of the n-th stage SRn is connected to a GCK2B signal line, and a CKB terminal of the (n+1)th stage SRn+1 is connected to a GCK1B signal line.

Figure 11:
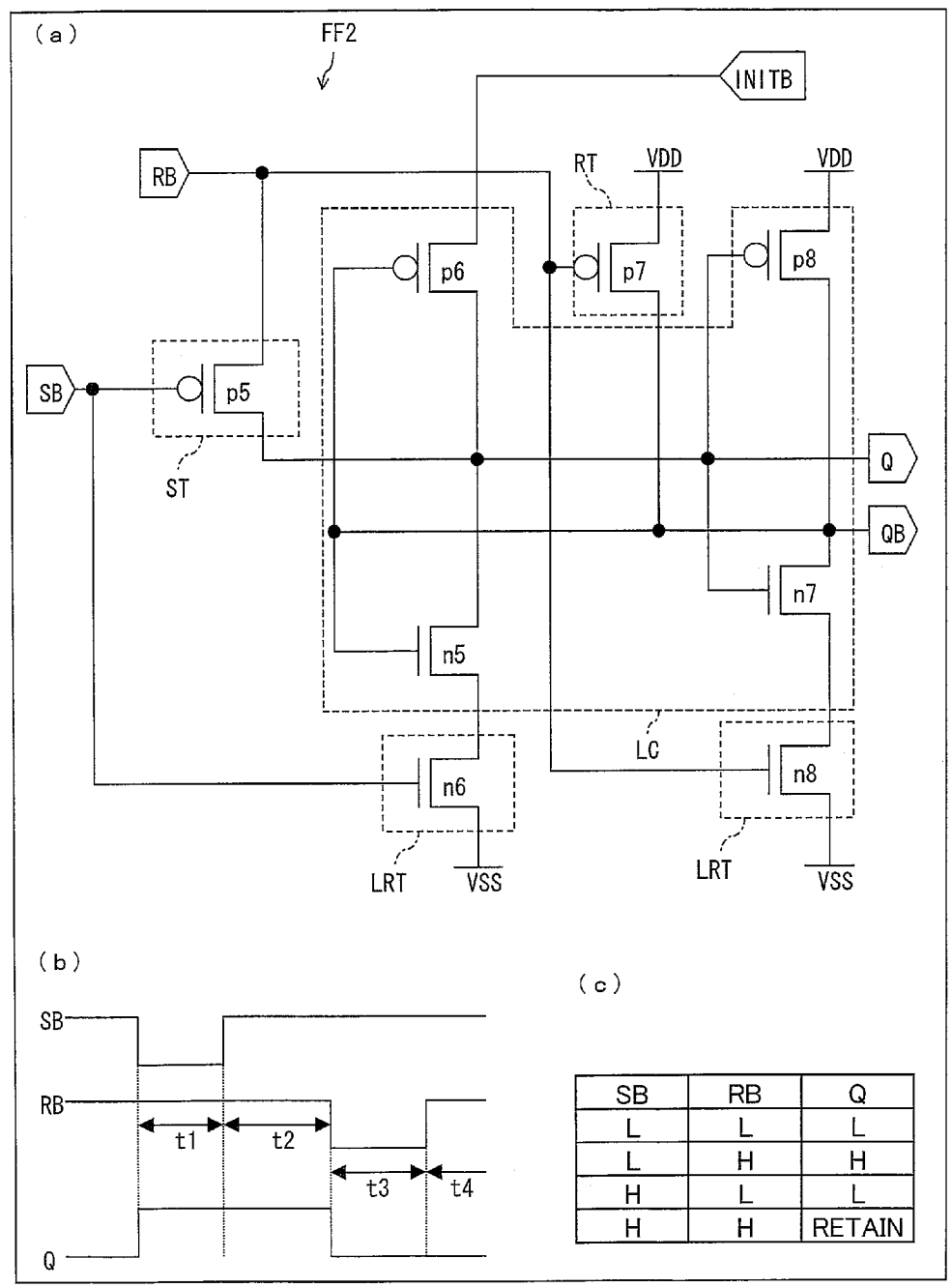

As the flip-flop FF shown in FIG. 10, a flip-flop FF2 shown in FIG. 11 is used. As shown in FIG. 11, the flip-flop FF2 includes (i) a p-channel transistor p6 and an n-channel transistor n5 which constitute a CMOS circuit, (ii) a p-channel transistor p8 and an n-channel transistor n7 which constitute a CMOS circuit, (iii) p-channel transistors p5 and p7, (iv) n-channel transistors n6 and n8, and (v) an INITB terminal, an SB-terminal, an RB-terminal, a Q-terminal, and a QB-terminal. A gate of the transistor p6, a gate of the transistor n5, a drain of the transistor p7, a drain of the transistor p8, a drain of the transistor n7, and the QB-terminal are connected with each other. A drain of the transistor p6, a drain of the transistor n5, a drain of the transistor p5, a gate of the transistor p8, a gate of the transistor n7, and the Q-terminal are connected with each other. A source of the transistor n5 is connected to a drain of the transistor n6. A source of the transistor n7 is connected to a drain of the transistor n8. The SB-terminal is connected to a gate of the transistor p5 and a gate of the transistor n6. The RB-terminal is connected to a source of the transistor p5, a gate of the transistor p7, and a gate of the transistor n8. The INITB-terminal is connected to a source of the transistor p6. Sources of the transistors p7 and p8 are connected to the VDD, and sources of the transistors n6 and n8 are connected to the VSS. Here, the transistors p6, n5, p8, and n7 constitute a latch circuit LC, the transistor p5 serves as a set transistor ST, the transistor p7 serves as a reset transistor RT, and each of the transistors n6 and n8 serves as a latch release transistor (release transistor) LRT.

(b) of FIG. 11 is a timing chart illustrating how the flip-flop FF2 is driven, and (c) of FIG. 11 is a truth table of the flip-flop FF2. In the flip-flop FF2, a Q-signal is to have a state as follows (see (b) and (c) of FIG. 11): during a period in which an SB-signal is Low (active) and an RB-signal is Low (active), the Q-signal is Low (inactive); during a period in which the SB-signal is Low (active) and the RB-signal is High (inactive), the Q-signal is High (active); during a period in which the SB-signal is High (inactive) and the RB-signal is Low (active), the Q-signal is Low (inactive); and during a period in which the SB-signal is High (inactive) and the RB-signal is High (inactive), the Q-signal is in a retention state.

FIG. 12 illustrates how the liquid crystal display device 3c is driven when a power supply is turned on. In the configuration, during a period in which the INITB-signal is being active (Low), an output Q of the flip-flop has a state as follows: That is, even in a case where the SB-signal and the RB-signal are shifted as follows: "active→inactive" (see FIG. 13), the output Q of the flip-flop is consistently inactive (Low); even in a case where the SB-signal is shifted as follows: "active→inactive→inactive" while the RB-signal is shifted as follows: "active→active→inactive" (see FIG. 14), the output Q of the flip-flop is consistently inactive (Low); and even in a case where the SB-signal is shifted as follows: "active→active→inactive" while the RB-signal is shifted as follows: "active→inactive→inactive" (see FIG. 15), the output Q of the flip-flop is basically inactive (Low), except for an instant at which the output Q is undetermined (i.e., during a period in which the SB-signal is active and the RB-signal is inactive). This makes it possible to stabilize operation of the shift register while the shift register is returning from the simultaneous selection and after the simultaneous selection.

Figure 16:
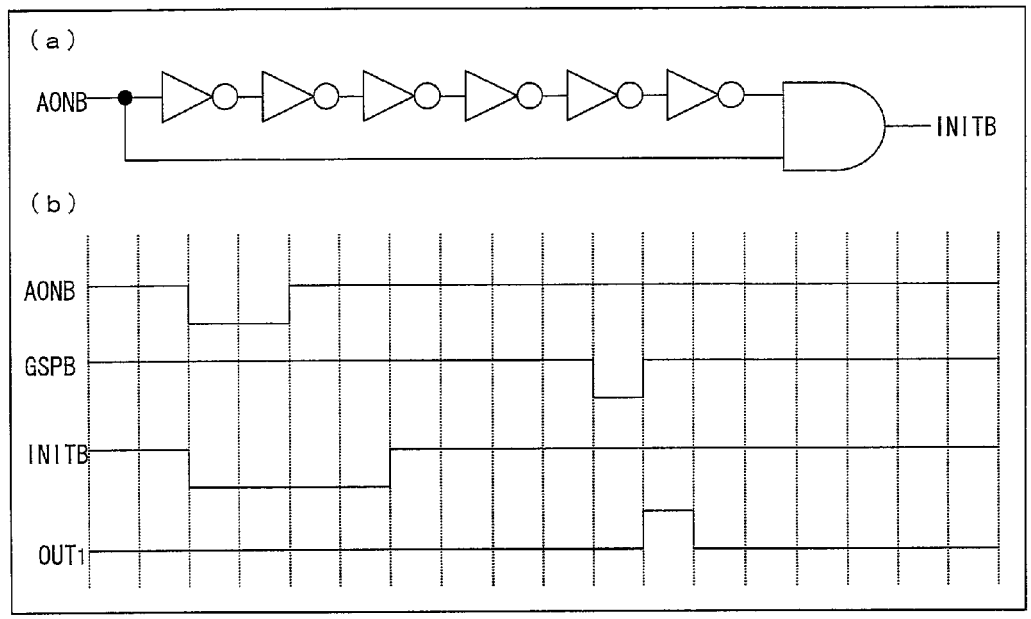
Figure 17:
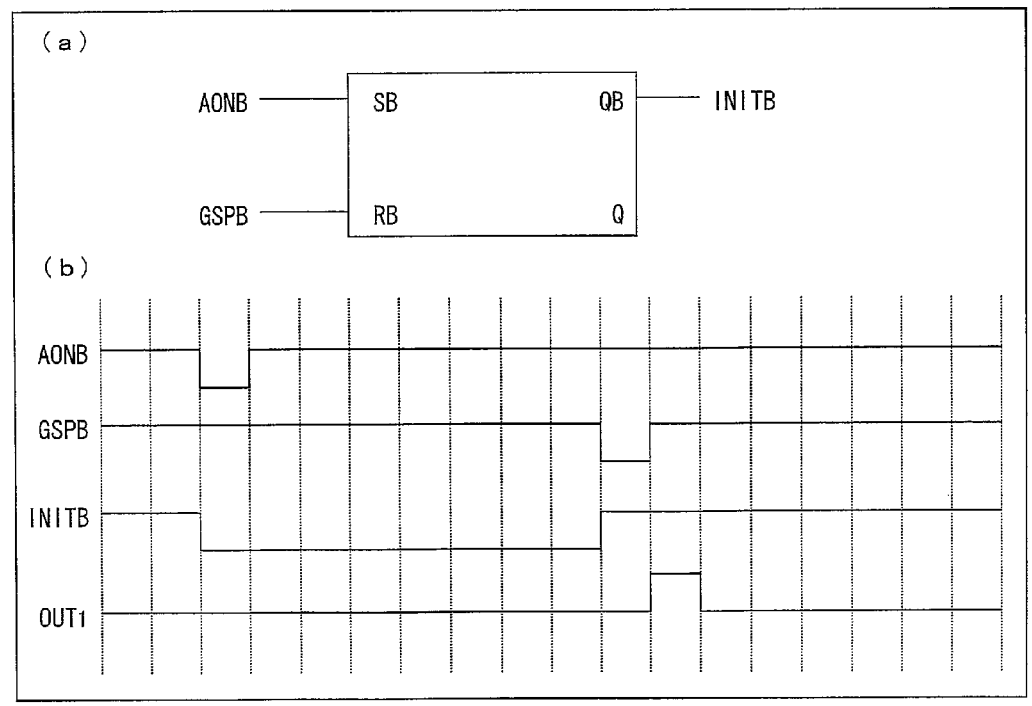

Note that the INITB-signal, which is used in each of the liquid crystal display devices 3a through 3c, can be generated as shown in, for example, (a) and (b) of FIG. 16. Specifically, an AONB-signal is supplied to a delay circuit configured by a plurality of inverter circuits which are cascade-connected to each other, and an output of the delay circuit and the AONB-signal are supplied to an AND circuit. Then, an output of the AND circuit is used as an INTB-signal. Alternatively, the INITB-signal can be generated as shown in (a) and (b) of FIG. 17. Specifically, an AONB-signal is supplied to an SB-terminal (set terminal) of a set-reset type flip-flop and a GSPB (gate start pulse) is supplied to an RB-terminal (reset terminal) of the flip-flop, and then an output (QB-signal) of the flip-flop is used as an INITB-signal.

Embodiment 2

FIG. 18 is a circuit diagram illustrating a configuration of a liquid crystal display device 3d of the present invention. The liquid crystal display device 3d includes a display section DAR, a gate driver GD, a source driver SD, and a display control circuit DCC. The display control circuit DCC supplies, to the gate driver GD, an INITB-signal (initialization signal), an AONB-signal (simultaneous selection signal), a gate start pulse GSP, a gate on enable signal GOE, and gate clock signals GCK1B and GCK2B. Moreover, the display control circuit DCC supplies, to the source driver SD, a source start pulse SSP, digital data DAT, a polarity signal POL, and a source clock signal SCK. The gate driver GD includes a shift register SR having a plurality of stages. Hereinafter, an i-th stage (i=1, ... n−1, n, n+1, ...) of the shift register is shortly referred to as "i-th stage SRi", as appropriate.

An output signal (OUT-signal) of the i-th stage SRi of the shift register is supplied to a scanning signal line Gi of the display section DAR via a buffer. For example, an OUTB-signal of an n-th stage SRn is supplied to a scanning signal line Gn via a buffer. In the display section DAR, the scanning signal line Gn is connected to a gate of a transistor which is connected with a pixel electrode in a pixel PIXn. A retention capacitor (auxiliary capacitor) is formed by the pixel electrode in the pixel PIXn and a retention capacitor line CSn.

Moreover, one (1) analog switch asw and one (1) inverter are provided for each data signal line. The inverter has an input terminal connected to an AONB-signal line. One conduction terminal of the analog switch asw is connected to an end of the data signal line, and the other conduction terminal of the analog switch asw is connected to a Vcom (common electrode electric potential) power supply. An n-channel side gate of the analog switch asw is connected to an output terminal of the inverter, and a p-channel side gate of the analog switch asw is connected to the AONB-signal line.

FIG. 19 is a circuit diagram partially illustrating a concrete configuration of the shift register SR. As shown in FIG. 19, each stage of the shift register includes (i) a flip-flop FF (the flip-flop FF2 shown in FIG. 11) having an INITB-terminal, an SB-terminal, and an RB-terminal, (ii) two analog switches ASW5 and ASW6 (gate circuit), (iii) an NAND circuit (logical circuit), (iv) an inverter, (v) a CKB terminal, (vi) an ONB terminal, and (vii) an OUTB terminal. A QB-terminal of the flip-flop FF is connected to one input terminal of the NAND circuit, and an output terminal of the NAND circuit is connected to an input terminal of the inverter, a p-channel side gate of the analog switch ASW5, and an n-channel side gate of the analog switch ASW6. An output terminal of the inverter is connected to an n-channel side gate of the analog switch ASW5 and a p-channel side gate of the analog switch ASW6. One conduction electrode of the analog switch ASW5 is connected to the ONB terminal, and one conduction electrode of the analog switch ASW6 is connected to the CKB terminal. The other conduction electrode of the analog switch ASW5, the other conduction electrode of the analog switch ASW6, the OUTB terminal, which serves as an output terminal of that stage, the other input terminal of the NAND circuit, and the RB terminal of the flip-flop FF are connected with each other.

Here, the analog switches ASW5 and ASW6 (gate circuit) and the NAND circuit (logical circuit) constitute a signal generating circuit which generates an OUTB-signal.

In the shift register SR, each of the stages has an OUTB terminal which is connected to an SB-terminal of a following stage. For example, an OUTB terminal of an n-th stage SRn is connected to an SB-terminal of an (n+1)th stage SRn+1. Note that a first stage SR1 of the shift register SR has an SB-terminal to which a GSPB signal is supplied. In the gate driver GD, the INITB-terminals of the flip-flops of the respective stages are connected to an INITB-signal line, and the ONB terminals of the respective stages are connected to the AONB-signal line. Moreover, a CKB terminal of an odd-numbered stage is connected to a GCKB line (via which the gate clock signal GCKB is supplied) which is different from a GCKB line to which a CKB terminal of an even-numbered stage is connected. For example, a CKB terminal of the n-th stage SRn is connected to a GCK2B signal line, and a CKB terminal of the (n+1)th stage SRn+1 is connected to a GCK1B signal line.

FIG. 20 is a timing chart illustrating how the liquid crystal display device 3d is driven when a power supply is turned on. In the liquid crystal display device 3d, the following preparation operation is carried out prior to the first frame (vertical scan period) of a displayed video. Specifically, the AONB-signal and the INITB-signal simultaneously become active (Low), and then the INITB-signal returns to inactive (High) after the AONB-signal returns to inactive (High). During a period in which the AONB-signal is being active, the GCKB signals are fixed to active (Low). When the AONB-signal becomes active (Low), the OUTB-signal becomes active (Low) because the analog switch ASW5 is turning on, and accordingly all the scanning signal lines are selected. At the time, the analog switches asw provided for the respective data signal lines are turned on, and accordingly the Vcom is applied to all the data signal lines. Moreover, in the flip-flop of the each stage, the INITB-signal becomes active (Low), and thereby the Q-signal becomes Low (inactive) and the QB-signal becomes High (inactive). Note that, once the OUTB-signal of the each stage of the shift register becomes active, a feedback signal to the NAND circuit becomes Low, and therefore the analog switch ASW5 is turned off and the analog switch ASW6 is turned on (i.e., the GCK1B or the GCK2B is received by the each stage). After the end of the preparation operation (i.e., after the AONB-signal becomes inactive), the Vcom is written into all the pixels PIX of the display section DAR, and the shift register SR is initialized (i.e., an output of the flip-flop in the each stage becomes inactive).

Moreover, in the liquid crystal display device 3d, the following operation is carried out in each vertical scan period (at which a frame is displayed). Specifically, each stage of the shift register SR is configured as follows. When an SB-signal supplied to a stage of the shift register SR becomes active (Low), an output of a flip-flop FF of the stage is set to be active. This causes a GCKB signal to be received by the stage. When the GCKB signal in the stage becomes active (Low), (i) an OUTB-signal of the stage becomes active (Low) and an SB-signal in a following stage of the stage becomes active, and (ii) the flip-flop FF of the stage is reset and accordingly the QB-signal becomes High (inactive). At the time, the OUTB-signal of the stage is Low (i.e., an output of the NAND circuit is High), and therefore the GCKB signal is continuously being received by the stage. When the GCKB signal becomes High (inactive), the OUTB-signal of the stage becomes High and the output of the NAND circuit becomes Low. Subsequently, the AONB-signal is outputted from the OUTB terminal, and the OUTB-signal becomes High (inactive).

In the liquid crystal display device 3d, for example, it is possible to apply an identical electric potential (e.g., Vcom) to all the pixels by simultaneously selecting all the scanning signal lines when the power supply is turned on. This makes it possible to prevent a disordered screen caused when the power supply is turned on. Here, during a period in which the INITB-signal is being active (Low), an output Q of the flip-flop has a state as follows: That is, even in a case where both the SB-signal and the RB-signal are shifted as follows: "active inactive" (see FIG. 13), the output Q of the flip-flop is consistently inactive (Low); even in a case where the SB-signal is shifted as follows: "active→inactive→inactive" while the RB-signal is shifted as follows: "active→active→inactive" (see FIG. 14), the output Q of the flip-flop is consistently inactive (Low); and even in a case where the SB-signal is shifted as follows: "active→active→inactive" while the RB-signal is shifted as follows: "active→inactive→inactive" (see FIG. 15), the output Q of the flip-flop is basically inactive (Low), except for an instant at which the output Q is undetermined (i.e., during a period in which the SB-signal is active and the RB-signal is inactive). This makes it possible to stabilize operation of the shift register while the shift register is returning from the simultaneous selection and after the simultaneous selection.

The AONB-signal is supplied to the analog switch ASW5, and it is therefore possible to reduce a size of the gate driver, as compared to a conventional configuration such as that shown in FIG. 43. Moreover, it is possible to complete the preparation operation more quickly, as compared to the conventional configuration in which simultaneous selection and initialization of the shift register are carried out separately. Furthermore, the each stage is reset automatically, and it is therefore possible to simplify a relation of connection between the stages.

Figure 21:
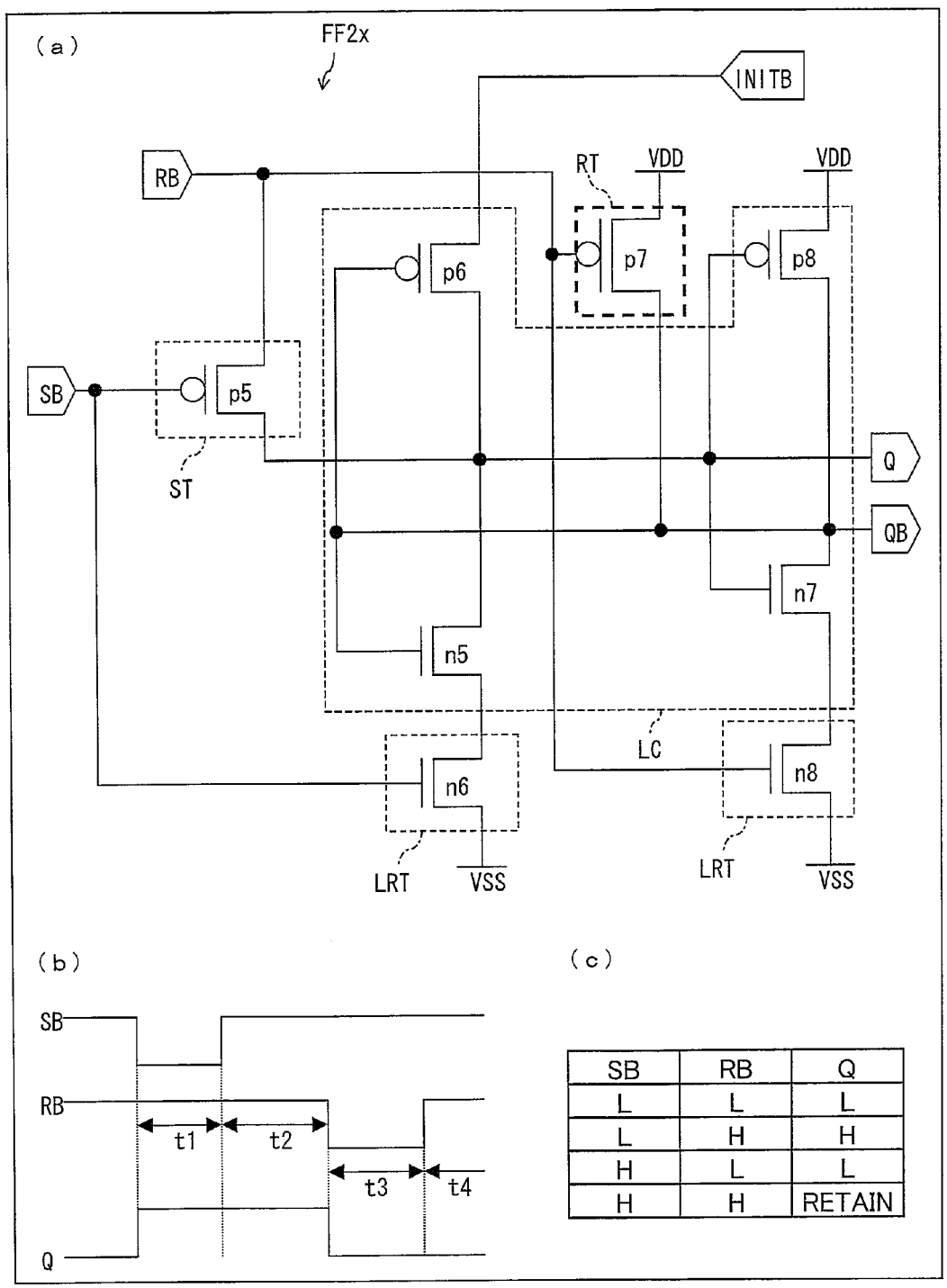

Note that, in the liquid crystal display device 3d, there occurs an instant at which the output Q is undetermined, when the SB-signal and the RB-signal are shifted as shown in FIG. 15. However, in a case where a flip-flop FF2x shown in FIG. 21 is used as the flip-flop FF of the each stage shown in FIG. 19, it is possible to cause the SB-signal and the RB-signal to be hardly shifted as shown in FIG. 15. In the flip-flop FF2x, operation performance of the transistor p7 (i.e., the reset transistor RT) is higher than that of the transistor p5 (i.e., the set transistor ST), unlike the flip-flop FF2 shown in FIG. 11. With the configuration, the electric potential at the QB-terminal hardly falls and the electric potential at the Q-terminal hardly rises. Accordingly, the flip-flop FF2x is easily reset. This makes it difficult for the SB-signal and the RB-signal to be shifted as shown in FIG. 15.

Alternatively, in a case where a flip-flop FF2y shown in FIG. 22 is used as the flip-flop FF of the each stage shown in FIG. 19, it is possible to prevent the undetermined instant, regardless of how the SB-signal and the RB-signal are shifted (i.e., even when the SB-signal and the RB-signal are shifted as shown in FIG. 15). As shown in FIG. 22, the flip-flop FF2y includes (i) a p-channel transistor p6 and an n-channel transistor n5 which constitute a CMOS circuit, (ii) a p-channel transistor p8 and an n-channel transistor n7 which constitute a CMOS circuit, (iii) p-channel transistors p5 and p7, (iv) n-channel transistors nT, n6 and n8, and (v) an INITB terminal, an SB-terminal, an RB-terminal, a Q-terminal, and a QB-terminal. A gate of the transistor p6, a gate of the transistor n5, a drain of the transistor p7, a drain of the transistor p8, a drain of the transistor n7, and the QB-terminal are connected with each other. A drain of the transistor p6, a drain of the transistor n5, a drain of the transistor p5, a gate of the transistor p8, a gate of the transistor n7, and the Q-terminal are connected with each other. A source of the transistor n5 is connected to a drain of the transistor n6. A source of the transistor p5 is connected to a drain of the transistor nT. A source of the transistor n7 is connected to a drain of the transistor n8. The SB-terminal is connected to a gate of the transistor p5 and a gate of the transistor n6. The RB-terminal is connected to a source of the transistor nT, a gate of the transistor p7, and a gate of the transistor n8. The INITB-terminal is connected to a source of the transistor p6 and a gate of the transistor nT. Sources of the transistors p7 and p8 are connected to the VDD, and sources of the transistor n6 and n8 are connected to the VSS. Here, the transistors p6, n5, p8, and n7 constitute a latch circuit LC, the transistor p5 serves as a set transistor ST, the transistor p7 serves as a reset transistor RT, and each of the transistors n6 and n8 serves as a latch release transistor (release transistor) LRT.

(b) of FIG. 22 is a timing chart illustrating how the flip-flop FF2y is driven, and (c) of FIG. 22 is a truth table of the flip-flop FF2y. A Q-signal of the flip-flop FF2y is to have a state as follows (see (b) and (c) of FIG. 22): during a period in which an SB-signal is Low (active) and an RB-signal is Low (active), the Q-signal is Low (inactive); during a period in which the SB-signal is Low (active) and the RB-signal is High (inactive), the Q-signal is High (active); during a period in which the SB-signal is High (inactive) and the RB-signal is Low (active), the Q-signal is Low (inactive); and during a period in which the SB-signal is High (inactive) and the RB-signal is High (inactive), the Q-signal is in a retention state.

Here, in the flip-flop FF2y, in a case where the SB-signal becomes active (Low) and the RB-signal becomes inactive (High) while the INITB-terminal is being active (Low), the nT is turned off, and accordingly the flip-flop FF2y maintains a previous state. Therefore, even when the SB-signal is shifted as follows: "active→active→inactive" while the R-signal is shifted as follows: "active→inactive→inactive" (see FIG. 23), the output Q of the flip-flop is consistently inactive (Low).

Figure 24:
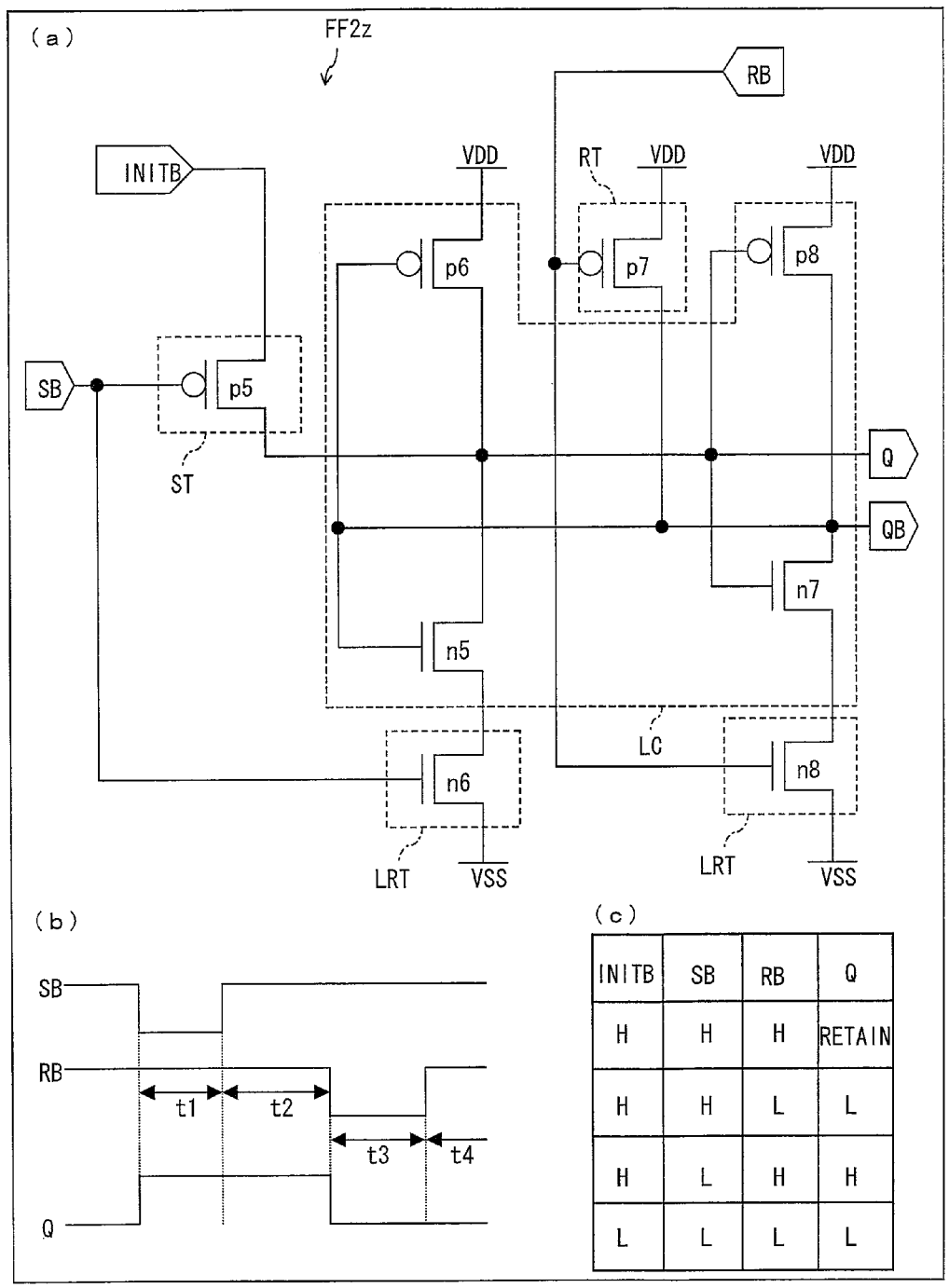

Alternatively, in a case where a flip-flop FF2z shown in FIG. 24 is used as the flip-flop FF of the each stage shown in FIG. 19, it is possible to prevent the undetermined instant, regardless of how the SB-signal and the RB-signal are shifted (i.e., even when the SB-signal and the RB-signal are shifted as shown in FIG. 15). As shown in FIG. 24, the flip-flop FF2z includes (i) a p-channel transistor p6 and an n-channel transistor n5 which constitute a CMOS circuit, (ii) a p-channel transistor p8 and an n-channel transistor n7 which constitute a CMOS circuit, (iii) p-channel transistors p5 and p7, (iv) n-channel transistors n6 and n8, and (v) an INITB terminal, an SB-terminal, an RB-terminal, a Q-terminal, and a QB-terminal. A gate of the transistor p6, a gate of the transistor n5, a drain of the transistor p7, a drain of the transistor p8, a drain of the transistor n7, and the QB-terminal are connected with each other. A drain of the transistor p6, a drain of the transistor n5, a drain of the transistor p5, a gate of the transistor p8, a gate of the transistor n7, and the Q-terminal are connected with each other. A source of the transistor n5 is connected to a drain of the transistor n6. A source of the transistor n7 is connected to a drain of the transistor n8. The SB-terminal is connected to a gate of the transistor p5 and a gate of the transistor n6. The INITB-terminal is connected to a source of the transistor p5. The RB-terminal is connected to a gate of the transistor p7 and a gate of the transistor n8. Sources of the transistors p6, p7, and p8 are connected to the VDD, and sources of the transistors n6 and n8 are connected to the VSS. Here, the transistors p6, n5, p8, and n7 constitute a latch circuit LC, the transistor p5 serves as a set transistor ST, the transistor p7 serves as a reset transistor RT, and each of the transistors n6 and n8 serves as a latch release transistor (release transistor) LRT.

(b) of FIG. 24 is a timing chart illustrating how the flip-flop FF2z is driven, and (c) of FIG. 24 is a truth table of the flip-flop FF2z. A Q-signal of the flip-flop FF2z is to have a state as follows (see (b) and (c) of FIG. 24): during a period in which an SB-signal is Low (active) and an RB-signal is Low (active), the Q-signal is Low (inactive); during a period in which the SB-signal is Low (active) and the RB-signal is High (inactive), the Q-signal is High (active); during a period in which the SB-signal is High (inactive) and the RB-signal is Low (active), the Q-signal is Low (inactive); and during a period in which the SB-signal is High (inactive) and the RB-signal is High (inactive), the Q-signal is in a retention state.

Here, in the flip-flop FF2z, in a case where the SB-signal becomes active (Low) and the RB-signal becomes inactive (High) in a period during which the INITB-terminal is being active (Low), the transistors p5 and p8 are turned on, and accordingly the Q-signal becomes Low and the QB-signal becomes High (inactive). Moreover, also in a case where the SB-signal becomes active (Low) and the RB-signal becomes active (Low) in a period during which the INITB-terminal is being active (Low), the Q-signal becomes Low and the QB-signal becomes High (inactive). In a case where the SB-signal becomes inactive (High) and the RB-signal becomes inactive (High) in a period during which the INITB-terminal is being active (Low), both the Q-signal and QB-signal are retained. Therefore, even when the SB-signal is shifted as follows: "active→active→inactive" while the R-signal is shifted as follows: "active→inactive→inactive" (see FIG. 23), the output Q of the flip-flop is consistently inactive (Low).

Note that, in the configuration shown in FIG. 19 (i.e., the configuration in which the flip-flop FF has reset priority so that the each stage of the shift register is automatically reset), a feedback of the OUTB-signal to the RB-terminal of the flip-flop may precede a feedback to the NAND circuit. In view of this, it is preferable to modify the NAND circuit (shown in FIG. 19) so that the NAND circuit has a configuration shown in FIG. 25. Specifically, a source of a p-channel transistor p40 is connected to the VDD; a gate of the transistor p40 is caused to serve as an input terminal X of the NAND circuit; a drain of the transistor p40 is caused to serve as an output terminal M of the NAND circuit; a source of a p-channel transistor p41 is connected to the VDD; a gate of the transistor p41 is caused to serve as an input terminal Y of the NAND circuit; a drain of the transistor p41 is connected to a source of an n-channel transistor n40; a gate of the transistor n40 is connected to the input terminal Y; a drain of the transistor n40 is connected to a source of an n-channel transistor n41; a gate of the n-channel transistor n41 is connected to the input terminal X; and a drain of the transistor n41 is connected to the VSS. Each of the p-channel transistors p40 and p41 is set to have operation performance higher than that of each of the n-channel transistors n40 and n41. This causes the OUTB-signal to remain active (=Low) until the QB-signal becomes sufficiently inactive (High). It is therefore possible to prevent the feedback to the RB-terminal of the flip-flop FF from preceding the feedback to the NAND circuit.

Embodiment 3

FIG. 26 is a circuit diagram illustrating a configuration of a liquid crystal display device 3e of the present invention. The liquid crystal display device 3e is a so-called CC (charge coupled) driven liquid crystal display device which includes a display section DAR, a gate-Cs driver G-CsD, a source driver SD, and a display control circuit DCC. The display control circuit DCC supplies, to the gate driver GD, a gate start pulse GSP, a gate on enable signal GOE, an AONB-signal (simultaneous selection signal), an INITB-signal, CS inversion signals CMI1 and CMI2, and gate clock signals GCK1B and GCK2B. Moreover, the display control circuit DCC supplies, to the source driver SD, a source start pulse SSP, digital data DAT, a polarity signal POL, and a source clock signal SCK. The gate-Cs driver G-CsD includes (i) a shift register SR having a plurality of stages and (ii) a plurality of D-latch circuits CSL. For each one of the stages of the shift register, one (1) OR circuit and one (1) D-latch circuit CSL are provided. Hereinafter, an i-th stage (i=1, . . . n−1, n, n+1, . . . ) of the shift register is shortly referred to as "i-th stage SRi", as appropriate. Note that a D-latch circuit CSLi is provided for the i-th stage SRi in the shift register. An output signal (OUT-signal) of the i-th stage SRi of the shift register is supplied to a scanning signal line Gi of the display section DAR via a buffer. An output signal (out-signal, CS-signal) of the D-latch circuit CSLi, which is provided for the i-th stage SRi, is supplied to a retention capacitor line CSi of the display section DAR. For example, an OUT-signal of an n-th stage SRn is supplied to a scanning signal line Gn via a buffer, and an output signal (out-signal, CS-signal) of a D-latch circuit CSLn, which is provided for the n-th stage SRn, is supplied to a retention capacitor line CSn of the display section DAR. In the display section DAR, the scanning signal line Gn is connected to a gate of a transistor which is connected with a pixel electrode in a pixel PIXn. A retention capacitor (auxiliary capacitor) is formed by the pixel electrode in the pixel PIXn and a retention capacitor line CSn.

Moreover, one (1) analog switch asw and one (1) inverter are provided for each data signal line. The inverter has an input terminal connected to an AONB-signal line. One conduction terminal of the analog switch asw is connected to an end of the data signal line, and the other conduction terminal of the analog switch asw is connected to a Vcom (common electrode electric potential) power supply. An n-channel side gate of the analog switch asw is connected to an output terminal of the inverter, and a p-channel side gate of the analog switch asw is connected to the AONB-signal line.

FIG. 27 is a circuit diagram illustrating a configuration of the i-th stage SRi of the shift register SR shown in FIG. 26. As shown in FIG. 27, each stage of the shift register includes (i) a flip-flop FF (the flip-flop FF2, FF2x, FF2y, or FF2z) having an INITB-terminal, an SB-terminal, and an RB-terminal, (ii) two analog switches ASW7 and ASW8, (iii) an NAND circuit, (iv) an inverter, (v) a CKB terminal, and (vi) an ONB terminal. A QB-terminal of the flip-flop FF is connected to one input terminal of the NAND circuit, and an output terminal (M) of the NAND circuit is connected to an input terminal of the inverter, a p-channel side gate of the analog switch ASW7, and an n-channel side gate of the analog switch ASW8. An output terminal of the inverter is connected to an n-channel side gate of the analog switch ASW7 and a p-channel side gate of the analog switch ASW8. One conduction electrode of the analog switch ASW7 is connected to the ONB terminal, and one conduction electrode of the analog switch ASW8 is connected to the CKB terminal. The other conduction electrode of the analog switch ASW7, the other conduction electrode of the analog switch ASW8, the OUTB terminal, which serves as an output terminal of that stage, the other input terminal of the NAND circuit, and the RB terminal of the flip-flop FF are connected with each other. The OUTB terminal is connected to an OUT terminal via the inverter.

In the i-th stage SRi, during a period in which a QB-signal (at one input terminal X of the NAND circuit) in the flip-flop FF is being High (inactive), an output (M) of the NAND circuit becomes Low (i.e., the analog switch ASW7 is turned on and the analog switch ASW8 is turned off), provided that an OUTB-signal (at the other input terminal Y of the NAND circuit) is High (inactive), and accordingly an AONB-signal (which is inactive and has an electric potential Vdd) is outputted from the OUTB terminal. On the other hand, the output (M) of the NAND circuit becomes High (i.e., the analog switch ASW7 is turned off and the analog switch ASW8 is turned on), provided that the OUTB-signal (at the other input terminal Y of the NAND circuit) is Low (active), and accordingly a GCKB signal is passed through and then outputted from the OUTB terminal. During a period in which the QB-signal in the flip-flop FF is being Low (active), the output (M) of the NAND circuit becomes High (i.e., the analog switch ASW7 is turned off and the analog switch ASW8 is turned on) because both the input terminals X and Y of the NAND circuit are Low, and accordingly a GCKB signal is passed through and then outputted from the OUTB terminal. That is, the NAND circuit, the inverter, and the analog switches ASW1 and ASW2 (gate circuit) constitute a signal generating circuit which generates the OUTB-signal. In particular, the analog switches ASW7 and ASW8 constitute a gate circuit which outputs the inputted AONB-signal or the inputted clock signal in response to the output M of the NAND circuit.

FIG. 28 is a circuit diagram illustrating a configuration of the D-latch circuit CSLi which is provided for the i-th stage SRi of the shift register SR shown in FIG. 26. The D-latch circuit CSLi includes three CMOS circuits 5 through 7, analog switches ASW15 and ASW16, an inverter, a CK-terminal, a D-terminal, and an out-terminal (see FIG. 28). Each of the CMOS circuits 5 and 6 has a p-channel transistor and an n-channel transistor. A gate of the p-channel transistor is connected to a gate of the n-channel transistor, and a drain of the p-channel transistor is connected to a drain of the n-channel transistor. Moreover, a source of the p-channel transistor is connected to the VDD, and a source of the n-channel transistor is connected to the VSS. The CMOS circuit 7 has a p-channel transistor and an n-channel transistor. A gate of the p-channel transistor is connected to a gate of the n-channel transistor, and a drain of the p-channel transistor is connected to a drain of the n-channel transistor. Moreover, a source of the p-channel transistor is connected to a power supply VCSH, and a source of the n-channel transistor is connected to a power supply VCSL. The ck-terminal, an input terminal of the inverter, an n-channel side gate of the analog switch ASW16, and a p-channel side gate of the analog switch ASW15 are connected with each other. An output terminal of the inverter, a p-channel side gate of the analog switch ASW16, and an n-channel side gate of the analog switch ASW15 are connected with each other. A drain side of the CMOS circuit 5 is connected to one conduction terminal of the analog switch ASW15. One conduction terminal of the analog switch ASW16 is connected to the D-terminal. The other conduction terminal of the analog switch ASW15, the other conduction terminal of the analog switch ASW16, and a gate side of the CMOS circuit 6 are connected with each other. A gate side of the CMOS circuit 5 is connected to a drain side of the CMOS circuit 6. The drain side of the CMOS circuit 6 is connected to a gate side of the CMOS circuit 7. A drain side of the CMOS circuit 7 is connected to the out-terminal.

In a period during which a ck-signal (i.e., a signal which is to be supplied to the ck-terminal) is being active (High), the D-latch circuit CSLi receives a D-signal (i.e., a signal which is supplied to the D-terminal) and latches the D-signal. Specifically, when the D-signal is shifted from Low to High in the period during which the ck-signal is being active, an electric potential of an out-signal (which is outputted from the out-terminal) rises from that of the power supply VCSL to that of the power supply VCSH, and after that, the electric potential of the power supply VCSH is maintained. On the other hand, when the D-signal is shifted from High to Low in the period during which the ck-signal is being active, the electric potential of the out-signal (which is outputted from the out-terminal) falls from that of the power supply VCSH to that of the power supply VCSL, and after that, the electric potential of the power supply VCSL is maintained.

In the gate-Cs driver G-CsD of the liquid crystal display device 3e, an OUTB terminal of each stage is connected to an SB-terminal of a following stage of the stage. An OUT terminal of the stage is connected to one input terminal of an OR circuit provided for the stage. An OUT terminal of the following stage of the stage is connected to the other input terminal of the OR circuit provided for the stage. An output terminal of the OR circuit provided for the stage is connected to a ck-terminal of a D-latch circuit provided for the stage. For example, an OUTB terminal of the n-th stage SRn is connected to an SB-terminal of the (n+1)th stage SRn+1; an OUT terminal of the n-th stage SRn is connected to one input terminal of an OR circuit provided for the n-th stage SRn; an OUT terminal of the (n+1)th stage SRn+1 is connected to the other input terminal of the OR circuit provided for the n-th stage SRn; and an output terminal of the OR circuit provided for the n-th stage SRn is connected to a ck-terminal of a D-latch circuit CSLn provided for the n-th stage SRn. Note that the first stage of the shift register SR has an SB-terminal to which a GSPB signal is supplied.

Moreover, in the gate-Cs driver G-CsD of the liquid crystal display device 3e, a CKB terminal of each odd-numbered stage and another CKB terminal of each even-numbered stage are connected to respective different GCK lines (via which a gate clock signal GCK is supplied). INITB-terminals of flip-flops of the respective stages are connected to an INITB-signal line, and ONB terminals of the respective stages are connected to an identical AONB line (via which an AON signal is supplied). For example, a CKB terminal of the n-th stage SRn is connected to the GCK2B signal line; a CKB terminal of the (n+1)th stage SRn+1 is connected to a GCK1B signal line; and ONB terminals of the n-th stage SRn and the (n+1)th stage SRn+1 are connected to the identical AONB-signal line. Moreover, every two D-terminals of respective two D-latch circuits provided for two adjacent stages are connected to a different CMI line (via which a CMI signal is supplied). For example, a D-terminal of the D-latch circuit CSLn provided for the n-th stage SRn and a D-terminal of a D-latch circuit CSLn+1 provided for the (n+1)th stage SRn+1 are connected to a CMI2 signal line, and a D-terminal of a D-latch circuit CSLn+2 provided for an (n+2)th stage SRn+2 and a D-terminal of a D-latch circuit CSLn+3 provided for an (n+3)th stage SRn+3 are connected to a CMI1 signal line.

FIG. 29 is a timing chart illustrating how the liquid crystal display device 3e is driven. Note that, in FIG. 29, a cycle of the polarity signal POL is assumed to be one (1) horizontal scan period 1H (that is, a polarity of a data signal supplied to an identical data signal line is inverted every 1H), and the CS inversion signals CMI1 and CMI2 are assumed to have identical phases.

In the liquid crystal display device 3e, the following display preparation operation is carried out prior to the first frame (vertical scan period) of a displayed video. Specifically, the AONB-signal and the INITB-signal simultaneously become active (Low), and then the INITB-signal returns to inactive (High) in sync with the GSPB becoming active, after the AONB-signal returns to inactive (High). During a period in which the AONB-signal is being active, the GCKB signals are fixed to active (Low). Moreover, each of the CMI signals is fixed to High (or Low). Accordingly, in the each stage of the shift register SR, the AONB-signal is outputted from the OUTB terminal via the analog switch ASW7. This causes the OUTB-signals of all the stages to become active (Low), and accordingly all the scanning signal lines are selected. At the time, the analog switches asw provided for the respective data signal lines are turned on, and accordingly the Vcom is applied to all the data signal lines. Moreover, in the flip-flop of the each stage, the INITB-signal becomes active (Low), and thereby the Q-signal becomes Low (inactive) and the QB-signal becomes High (inactive). Note that, once the OUTB-signal of the each stage of the shift register becomes active, a feedback signal to the NAND circuit becomes Low, and therefore the analog switch ASW7 is turned off and the analog switch ASW8 is turned on (i.e., the GCK1B or the GCK2B is received by the each stage). Moreover, an output of the OR circuit provided for the each stage becomes active (High). This causes each of the D-latch circuits to latch the CMI1 signal (Low) or the CMI2 signal (Low), and thereby the out-signal (CS-signal), which is supplied to the retention capacitor line, is caused to have the electric potential of the power supply VCSL. After the end of the display preparation operation, the Vcom is written into all the pixels PIX of the display section DAR, the QB output of the flip-flop FF provided in the each stage of the shift register becomes inactive (High), and the out-signal (i.e., an electric potential at the retention capacitor line) of each of the D-latch circuits is caused to have the electric potential of the power supply VCSL.

In the liquid crystal display device 3e, the following operation is carried out when the first frame is displayed (at the first vertical scan period). Specifically, each stage of the shift register SR is configured as follows. When an SB-signal supplied to a stage of the shift register SR becomes active (=Low), an output of a flip-flop FF of the stage is set to be active. This causes a GCKB signal to be received by the stage. When the GCKB signal in the stage becomes active (=Low), (i) an OUTB-signal of the stage becomes active (=Low) and an SB-signal in a following stage of the stage becomes active, and (ii) the flip-flop FF of the stage is reset to be High (inactive). At the time, the OUTB-signal of the stage is Low (i.e., an output of the NAND circuit is High), and therefore the GCKB signal is continuously being received by the stage. When the GCKB signal becomes High (inactive), the OUTB-signal of the stage becomes High and the output of the NAND circuit becomes Low. Subsequently, the AONB-signal is outputted from the OUTB terminal, and the OUTB-signal becomes High (inactive).

When the OUTB-signal of the stage becomes active, the D-latch circuit provided for the stage latches the CMI1 signal or the CMI2 signal (because the output of the OR circuit provided for the stage becomes active). Further, when the OUTB-signal of the following stage of the stage becomes active, the D-latch circuit provided for the stage latches the CMI1 signal or the CMI2 signal again (because the output of the OR circuit provided for the stage becomes active). With the configuration, after the OUTB-signal of the stage becomes inactive (i.e., the scanning signal line provided for the stage is not selected), an out-signal (i.e, the electric potential of the retention capacitor line provided for the stage) of the D-latch circuit provided for to the stage rises from the electric potential of the power supply VCSL to the electric potential of the power supply VCSH (in a case where a data signal having a positive polarity is written into a pixel corresponding to the stage) or falls from the electric potential of the power supply VCSH to the electric potential of the power supply VCSL (in a case where a data signal having a negative polarity is written into the pixel corresponding to the stage).

For example, when an OUTB-signal of the n-th stage SRn becomes active, the D-latch circuit CSLn provided for the n-th stage SRn latches the CMI2 signal (because the output of the OR circuit provided for the n-th stage SRn becomes active). Further, when the OUTB-signal of the (n+1)th stage SRn+1 becomes active, the D-latch circuit CSLn latches the CMI2 signal again (because the output of the OR circuit provided for the n-th stage SRn becomes active). With the configuration, after the OUTB-signal of the n-th stage SRn becomes inactive (i.e., a scanning signal line Gn provided for the n-th stage SRn is selected and then not selected), an out-signal (i.e, an electric potential of the retention capacitor line CSn provided for the n-th stage SRn) of the D-latch circuit CSLn provided for the n-th stage SRn falls from the electric potential of the power supply VCSH to the electric potential of the power supply VCSL. Here, a data signal having a negative polarity, as indicated by the polarity signal POL, is written into the pixel PIXn which corresponds to the n-th stage SRn. Therefore, it is possible to cause an effective electric potential to be lower than the electric potential of the data signal (i.e., a luminance of the pixel PIXn is heightened) by causing the electric potential of the retention capacitor line CSn to fall.

When an OUTB-signal of the (n+1)th stage SRn+1 becomes active, the D-latch circuit CSLn+1 provided for the (n+1)th stage SRn+1 latches the CMI2 signal. Further, when the OUTB-signal of the (n+1)th stage SRn+1 becomes active, the D-latch circuit CSLn+1 latches the CMI2 signal again. With the configuration, after the OUTB-signal of the (n+1)th stage SRn+1 becomes inactive (i.e., a scanning signal line Gn+1 is selected and then not selected), an out-signal (i.e, an electric potential of a retention capacitor line CSn+1) of the D-latch circuit CSLn+1 provided for the (n+1)th stage SRn+1 rises from the electric potential of the power supply VCSL to the electric potential of the power supply VCSH. Here, a data signal having a positive polarity, as indicated by the polarity signal POL, is written into a pixel PIXn+1 which provided for the (n+1)th stage SRn+1. Therefore, it is possible to cause an effective electric potential to be higher than the electric potential of the data signal (i.e., a luminance of the pixel PIXn+1 is heightened) by causing the electric potential of the retention capacitor line CSn+1 to rise.

When an OUTB-signal of the (n+2)th stage SRn+2 becomes active, the D-latch circuit CSLn+2 provided for the (n+2)th stage SRn+2 latches the CMI1 signal. Further, when the OUTB-signal of the (n+2)th stage SRn+2 becomes active, the D-latch circuit CSLn+2 latches the CMI1 signal again. With the configuration, after the OUTB-signal of the (n+2)th stage SRn+2 becomes inactive (i.e., a scanning signal line Gn+2 is selected and then not selected), an out-signal (i.e, an electric potential of a retention capacitor line CSn+2) of the D-latch circuit CSLn+2 provided for the (n+2)th stage SRn+2 falls from the electric potential of the power supply VCSH to the electric potential of the power supply VCSL. Here a data signal having a negative polarity, as indicated by the polarity signal POL, is written into a pixel PIXn+2 which corresponds to the (n+2)th stage SRn+2. Therefore, it is possible to cause an effective electric potential to be higher than the electric potential of the data signal (i.e., a luminance of the pixel PIXn+2 is heightened) by causing the electric potential of the retention capacitor line CSn+2 to fall.

In each of the second and subsequent frames, a display is carried out in a manner similar to that in the first frame. Note, however, that the phase of the POL is shifted by a half cycle every frame. This causes a polarity of a data signal, which is supplied to an identical pixel, to be inverted every frame. In accordance with this, a rise and a fall of an out-signal of the D-latch circuit CSLi (i.e., an electric potential of the retention capacitor line CSi) are switched every frame.

In the liquid crystal display device 3e, for example, it is possible to apply an identical electric potential (e.g., Vcom) to all the pixels by simultaneously selecting all the scanning signal lines when the power supply is turned on. This makes it possible to prevent a disordered screen caused when the power supply is turned on. Here, the flip-flop in the each stage of the shift register SR is driven as shown in FIGS. 13 through 15 or FIG. 23 while the shift register SR is returning from the simultaneous selection. This makes it possible to stabilize operation of the shift register while the shift register is returning from the simultaneous selection and after the simultaneous selection.

The AONB-signal is supplied to the analog switch ASW7, and it is therefore possible to reduce a size of the gate driver, as compared to a conventional configuration such as that shown in FIG. 43. Moreover, it is possible to complete the preparation operation more quickly, as compared to the conventional configuration in which simultaneous selection and initialization of the shift register are carried out separately. Moreover, the each stage is reset automatically, and it is therefore possible to simplify a relation of connection between the stages. Moreover, each of pixel rows is appropriately driven from the first frame by a CC driving. This makes it possible to solve a problem of the conventional CC driving, that is, it is possible to prevent a disordered screen (lateral stripes) in the first frame.

A further remarkable characteristic of the liquid crystal display device 3e is that (i) a cycle of the polarity signal POL is switched to 2H (i.e., a polarity of a data signal supplied to an identical data signal line is inverted every 2H) only by shifting the phase of the CMI2 signal (from the state shown in FIG. 29) by a half cycle (see FIG. 30) and (ii) each of the pixel rows is appropriately driven from the first frame by the CC driving. That is, in the liquid crystal display device 3e, (i) the cycle of the polarity signal POL can be switched from 1H to 2H only by controlling the phases of the respective CS inversion signals CMI1 and CMI2 and (ii) a disordered screen at the time can be prevented.

Embodiment 4

FIG. 31 is a circuit diagram illustrating a configuration of a liquid crystal display device 3f of the present invention. The liquid crystal display device 3f is a so-called CC (charge coupled) driven liquid crystal display device which includes a display section DAR, a gate-Cs driver G-CsD, a source driver SD, and a display control circuit DCC. The display control circuit DCC supplies, to the gate driver GD, a gate start pulse GSP, a gate on enable signal GOE, an INITB-signal, an AONB-signal (simultaneous selection signal), CS inversion signals CMI1 and CMI2, and gate clock signals GCK1B and GCK2B. Moreover, the display control circuit DCC supplies, to the source driver SD, a source start pulse SSP, digital data DAT, a polarity signal POL, and a source clock signal SCK. The gate-Cs driver G-CsD includes (i) a shift register SR having a plurality of stages and (ii) a plurality of D-latch circuits CSL. For each one of the stages of the shift register, one (1) inverter, one (1) D-latch circuit CSL, and one (1) buffer are provided. Hereinafter, an i-th stage (i=1, ... n−1, n, n+1, ... ) of the shift register is shortly referred to as "i-th stage SRi", as appropriate. Note that a D-latch circuit CSLi is provided for the i-th stage SRi in the shift register.

An output signal (OUT-signal) of the i-th stage SRi of the shift register is supplied to a scanning signal line Gi of the display section DAR via a buffer. An output signal (out-signal, CS-signal) of the D-latch circuit CSLi, which is provided for the i-th stage SRi, is supplied to a retention capacitor line CSi−1 of the display section DAR. For example, an OUT-signal of an n-th stage SRn is supplied to a scanning signal line Gn via a buffer, and an output signal (out-signal, CS-signal) of a D-latch circuit CSLn, which is provided for the n-th stage SRn, is supplied to a retention capacitor line CSn−1 of the display section DAR. In the display section DAR, the scanning signal line Gn is connected to a gate of a transistor which is connected with a pixel electrode in a pixel PIXn. A retention capacitor (auxiliary capacitor) is formed by the pixel electrode in the pixel PIXn and a retention capacitor line CSn. Moreover, a scanning signal line Gn−1 is connected to a gate of a transistor which is connected with a pixel electrode in a pixel PIXn−1. A retention capacitor (auxiliary capacitor) is formed by the pixel electrode in the pixel PIXn−1 and the retention capacitor line CSn−1.

Moreover, one (1) analog switch asw and one (1) inverter are provided for each data signal line. The inverter has an input terminal connected to an AONB-signal line. One conduction terminal of the analog switch asw is connected to an end of the data signal line, and the other conduction terminal of the analog switch asw is connected to a Vcom (common electrode electric potential) power supply. An n-channel side gate of the analog switch asw is connected to an output terminal of the inverter, and a p-channel side gate of the analog switch asw is connected to the AONB-signal line.

Note that the i-th stage SRi of the shift register SR shown in FIG. 31 has a configuration shown in FIG. 27, and the D-latch circuit CSLi has a configuration shown in FIG. 28.

In the shift register SR in the gate-Cs driver G-CsD of the liquid crystal display device 3f, an OUTB terminal of each of the stages is connected to an SB-terminal of a following one of the stages. An M-terminal of each of the stages is connected to a ck-terminal of a D-latch circuit provided for the each of the stages. For example, an OUTB terminal of the n-th stage SRn is connected to an SB-terminal of the (n+1)th stage SRn+1, and an M-terminal of the n-th stage SRn is connected to a ck-terminal of a D-latch circuit CSLn provided for the n-th stage SRn. Note that the first stage of the shift register SR has an SB-terminal to which a GSPB signal is supplied.

Moreover, in the gate-Cs driver G-CsD, a CKB terminal of each odd-numbered stage and another CKB terminal of each even-numbered stage are connected to respective different GCK lines (via which a gate clock signal GCK is supplied). INITB-terminals of flip-flops of the respective stages are connected to an INITB-signal line, and ONB terminals of the respective stages are connected to an identical AONB line (via which an AON signal is supplied). For example, a CKB terminal of the n-th stage SRn is connected to the GCK2B signal line; a CKB terminal of the (n+1)th stage SRn+1 is connected to the GCK1B signal line; and ONB terminals of the n-th stage SRn and the (n+1)th stage SRn+1 are connected to the identical AONB-signal line. Moreover, every two D-terminals of respective two D-latch circuits provided for two adjacent stages are connected to a different CMI line (via which a CMI signal is supplied).

For example, a D-terminal of the D-latch circuit CSLn−1 provided for an (n−1)th stage SRn−1 and a D-terminal of the D-latch circuit CSLn provided for the n-th stage SRn are connected to the CMI1 signal line, and a D-terminal of a D-latch circuit CSLn+1 provided for the (n+1)th stage SRn+1 and a D-terminal of a D-latch circuit CSLn+2 provided for an (n+2)th stage SRn+2 are connected to the CMI2 signal line.

FIG. 32 is a timing chart illustrating how the liquid crystal display device 3f is driven. Note that, in FIG. 32, a cycle of the polarity signal POL is assumed to be one (1) horizontal scan period 1H (that is, a polarity of a data signal supplied to an identical data signal line is inverted every 1H), and the CS inversion signals CMI1 and CMI2 are assumed to have identical phases.

In the liquid crystal display device 3f, the following display preparation operation is carried out prior to the first frame (vertical scan period) of a displayed video. Specifically, the AONB-signal and the INITB-signal simultaneously become active (Low), and then the INITB-signal returns to inactive (High) in sync with the GSPB becoming active, after the AONB-signal returns to inactive (High). During a period in which the AONB-signal is being active, the GCKB signals are fixed to active (Low). Moreover, each of the CMI signals is fixed to High (or Low). Accordingly, in the each stage of the shift register SR, the AONB-signal is outputted from the OUTB terminal via the analog switch ASW7 (see FIG. 27). This causes the OUTB-signals of all the stages to become active (Low), and accordingly all the scanning signal lines are selected. At the time, the analog switches asw provided for the respective data signal lines are turned on, and accordingly the Vcom is applied to all the data signal lines. Moreover, in the flip-flop of the each stage, the INITB-signal becomes active (Low), and accordingly the Q-signal becomes Low (inactive) and the QB-signal becomes High (inactive). Note that, once the OUTB-signal of the each stage of the shift register becomes active, a feedback signal to the NAND circuit becomes Low, and accordingly the analog switch ASW7 is turned off and the analog switch ASW8 is turned on (i.e., the GCK1B or the GCK2B is received by the each stage). Moreover, an M-signal (i.e., a signal outputted from the M-terminal) of the each stage becomes active (High). This causes each of the D-latch circuits to latch the CMI1 signal (Low) or the CMI2 signal (Low), and thereby the out-signal (CS-signal), which is supplied to the retention capacitor line, is caused to have the electric potential of the power supply VCSL. After the end of the display preparation operation, the Vcom is written into all the pixels PIX of the display section DAR, the QB output of the flip-flop provided in each stage of the shift register becomes inactive (High), and the out-signal (i.e., an electric potential of the retention capacitor line) of each of the D-latch circuits is caused to have the electric potential of the power supply VCSL.

In the liquid crystal display device 3f, the following operation is carried out when the first frame is displayed (at the first vertical scan period). Specifically, each stage of the shift register SR is configured as follows. When an SB-signal supplied to a stage of the shift register SR becomes active (=Low), an output of a flip-flop FF of the stage is set to be active. This causes a GCKB signal to be received by the stage. When the GCKB signal in the stage becomes active (=Low), (i) an OUTB-signal of the stage becomes active (=Low) and an SB-signal in a following stage of the stage becomes active, and (ii) the flip-flop FF of the stage is reset to be High (inactive). At the time, the OUTB-signal of the stage is Low (i.e., an output of the NAND circuit is High), and therefore the GCKB signal is continuously being received by the stage. When the GCKB signal becomes High (inactive), the OUTB-signal of the stage becomes High and the output of the NAND circuit becomes Low. Subsequently, the AONB-signal is outputted from the OUTB terminal, and the OUTB-signal becomes High (inactive).

When an M-signal of the following stage of the stage becomes active, a D-latch circuit provided for the following stage of the stage latches the CMI1 signal or the CMI2 signal. With the configuration, after the OUTB-signal of the stage becomes inactive (i.e., the scanning signal line provided for the stage is not selected), the out-signal (i.e, the electric potential of the retention capacitor line provided for the stage) of the D-latch circuit provided for the stage (i) rises from the electric potential of the power supply VCSL to the electric potential of the power supply VCSH (in a case where a data signal having a positive polarity is written into a pixel corresponding to the stage) or (ii) falls from the electric potential of the power supply VCSH to the electric potential of the power supply VCSL (in a case where a data signal having a negative polarity is written into the pixel corresponding to the stage).

For example, when an M-signal of the n-th stage SRn becomes active, the D-latch circuit CSLn provided for the n-th stage SRn latches the CMI1 signal. With the configuration, after the OUT-signal of the (n−1)th stage SRn−1 becomes inactive (i.e., the scanning signal line Gn−1 is selected and then not selected), an out-signal (i.e, an electric potential of the retention capacitor line CSn−1) of the D-latch circuit CSLn rises from the electric potential of the power supply VCSL to the electric potential of the power supply VCSH. Here, a data signal having a positive polarity, as indicated by the polarity signal POL, is written into a pixel PIXn−1 which corresponds to the (n−1)th stage SRn−1. It is therefore possible to cause an effective electric potential to be higher than the electric potential of the data signal (i.e., a luminance of the pixel PIXn−1 is heightened) by causing the electric potential of the retention capacitor line CSn−1 to rise.

When an M-signal of the (n+1)th stage SRn+1 becomes active, the D-latch circuit CSLn+1 provided for the (n+1)th stage SRn+1 latches the CMI2 signal. With the configuration, after the OUT-signal of the n-th stage SRn becomes inactive (i.e., the scanning signal line Gn is selected and then not selected), an out-signal (i.e, an electric potential of the retention capacitor line CSn) of the D-latch circuit CSLn+1 falls from the electric potential of the power supply VCSH to the electric potential of the power supply VCSL. Here, a data signal having a negative polarity, as indicated by the polarity signal POL, is written into a pixel PIXn which corresponds to the n-th stage SRn. It is therefore possible to cause an effective electric potential to be lower than the electric potential of the data signal (i.e., a luminance of the pixel PIXn is heightened) by causing the electric potential of the retention capacitor line CSn to fall.

When an M-signal of the (n+2)th stage SRn+2 becomes active, the D-latch circuit CSLn+2 provided for the (n+2)th stage SRn+2 latches the CMI2 signal. With the configuration, after the OUT-signal of the (n+1)th stage SRn+1 becomes inactive (i.e., a scanning signal line Gn+1 is selected and then not selected), an out-signal (i.e, an electric potential of a retention capacitor line CSn+1) of the D-latch circuit CSLn+2 rises from the electric potential of the power supply VCSL to the electric potential of the power supply VCSH. Here, a data signal having a positive polarity, as indicated by the polarity signal POL, is written into a pixel PIXn+1 which corresponds to the (n+1)th stage SRn+1. It is therefore possible to cause an effective electric potential to be higher than the electric potential of the data signal (i.e., a luminance of the pixel PIXn+1 is heightened) by causing the electric potential of the retention capacitor line CSn+1 to rise.

In each of the second and subsequent frames, a display is carried out in a manner similar to that in the first frame. Note, however, that the phase of the POL is shifted by a half cycle every frame. This causes a polarity of a data signal, which is supplied to an identical pixel electrode PIXi, to be inverted every frame. In accordance with this, a rise and a fall of an out-signal of the D-latch circuit CSLi (i.e., an electric potential of the retention capacitor line CSi) are switched every frame.

In the liquid crystal display device 3f, for example, it is possible to apply an identical electric potential (e.g., Vcom) to all the pixels by simultaneously selecting all the scanning signal lines when the power supply is turned on. This makes it possible to prevent a disordered screen caused when the power supply is turned on. Here, the flip-flop in the each stage of the shift register SR is driven as shown in FIGS. 13 through 15 or FIG. 23 while the shift register SR is returning from the simultaneous selection. This makes it possible to stabilize operation of the shift register while the shift register is returning from the simultaneous selection and after the simultaneous selection.

The AONB-signal is supplied to the analog switch ASW7 (see FIG. 27), and it is therefore possible to reduce a size of the gate driver, as compared to a conventional configuration such as that shown in FIG. 43. Moreover, it is possible to complete the preparation operation more quickly, as compared to the conventional configuration in which simultaneous selection and initialization of the shift register are carried out separately. Moreover, the each stage is reset automatically, and it is therefore possible to simplify a relation of connection between the stages.

An internal signal (M-signal) of the shift register is supplied to the ck-terminal of the D-latch circuit, and it is therefore possible to further reduce the size of the gate-Cs driver because it is not necessary to provide an NOR circuit or an OR circuit in the gate-Cs driver. Moreover, each of pixel rows is appropriately driven from the first frame by a CC driving. This makes it possible to solve a problem of the conventional CC driving, that is, it is possible to prevent a disordered screen (lateral stripes) in the first frame.

A further remarkable characteristic of the liquid crystal display device 3f is that (i) a cycle of the polarity signal POL is switched to 2H (i.e., a polarity of a data signal supplied to an identical data signal line is inverted every 2H) only by shifting the phase of the CMI2 signal (form the state shown in FIG. 32) by a half cycle (see FIG. 33) and (ii) each of the pixel rows is appropriately driven from the first frame by the CC driving. That is, in the liquid crystal display device 3f, (i) the cycle of the polarity signal POL can be switched from 1H to 2H only by controlling the phases of the respective CS inversion signals CMI1 and CMI2 and (ii) a disordered screen at the time can be prevented.

Note that it is possible to change, as shown in FIG. 34, the configuration (see FIG. 27) of each stage of the shift register included in the liquid crystal display device 3e or 3f. Specifically, the analog switch ASW7 shown in FIG. 27 may be replaced with a single-channel (p-channel) transistor TR. This makes it possible to further reduce a size of the shift register.

Moreover, the liquid crystal display device 3d may be driven as follows: That is, the AONB-signal may become inactive (High) while a simultaneous selection is being carried out (see FIG. 35); the INITB-signal may become active (Low) after the AONB becomes active (Low) but before the AONB becomes inactive (High) (see FIG. 36); or the INITB-signal may become active (Low) after the AONB is switched from active (Low) to inactive (High) (see FIG. 37).

Note that (i) the gate driver, (ii) the source driver or the gate-Cs driver, and (iii) the pixel circuit in the display section may be formed monolithically (i.e., formed on an identical substrate).

In the present invention, an output side of the two conduction electrodes of the transistor (p-channel or n-channel) is referred to as the "drain terminal".

A display driving circuit of the present invention includes a shift register, the display driving circuit carrying out simultaneous selection of a plurality of signal lines at a predetermined timing, wherein: a stage of the shift register includes (i) a set-reset type flip-flop receiving an initialization signal and (ii) a signal generating circuit receiving a simultaneous selection signal, the signal generating circuit generating an output signal of the stage by use of an output of the flip-flop; the output signal of the stage (i) becomes active due to an activation of the simultaneous selection signal and then (ii) remains active during the simultaneous selection; the output of the flip-flop is being inactive while the initialization signal is being active, regardless of whether each of a setting signal and a resetting signal is active or inactive; and the initialization signal becomes active before the end of the simultaneous selection and becomes inactive after the end of the simultaneous selection.

According to the configuration, the initialization of the shift register (i.e., the initialization of the flip-flop of each of the stages) is completed when the simultaneous selection is ended and accordingly the setting signal and the resetting signal become inactive. This makes it possible to stabilize operation of the shift register after the end of the simultaneous selection, as compared to the conventional driver (see FIGS. 38 and 39) in which the flip-flop is undetermined, after the end of the simultaneous selection, until an INI signal is supplied.

In the display driving circuit of the present invention, it is possible that the signal generating circuit includes a gate circuit which selectively outputs, as the output signal of the stage, one of inputted signals in response to a switching signal supplied to the gate circuit.

In the display driving circuit of the present invention, it is possible that the output of the flip-flop is supplied, as the switching signal, to the gate circuit.

In the display driving circuit of the present invention, it is possible that the signal generating circuit further includes a logical circuit; and the output of the flip-flop is supplied to the logical circuit, an output of the logical circuit is supplied to the gate circuit as the switching signal, and the output signal of the stage is fed back to the logical circuit and to a reset terminal of the flip-flop.

In the display driving circuit of the present invention, it is possible that the gate circuit selectively outputs the simultaneous selection signal or a clock signal.

In the display driving circuit of the present invention, it is possible that the clock signal is fixedly active during the simultaneous selection.

In the display driving circuit of the present invention, it is possible that the logical circuit includes an NAND circuit.

In the display driving circuit of the present invention, it is possible that the NAND circuit is made up of a plurality of p-channel transistors and a plurality of n-channel transistors; and in the NAND circuit, operation performance of each of the plurality of p-channel transistors is higher than that of each of the plurality of n-channel transistors.

In the display driving circuit of the present invention, it is possible that the flip-flop includes: a first CMOS circuit having a p-channel first transistor and an n-channel second transistor, a gate terminal of the p-channel first transistor being connected with a gate terminal of the n-channel second transistor, and a drain terminal of the p-channel first transistor being connected with a drain terminal of the n-channel second transistor, a second CMOS circuit having a p-channel third transistor and an n-channel fourth transistor, a gate terminal of the p-channel third transistor being connected with a gate terminal of the n-channel fourth transistor, and a drain terminal of the p-channel third transistor being connected with a drain terminal of the n-channel fourth transistor, an input transistor, a plurality of input terminals, and a first output terminal and a second output terminal; a gate side of the first CMOS circuit, a drain side of the second CMOS circuit, and the first output terminal are connected with each other, and a gate side of the second CMOS circuit, a drain side of the first CMOS circuit, and the second output terminal are connected with each other; and the input transistor has a gate terminal and a source terminal which are connected with respective different ones of the plurality of input terminals.

In the display driving circuit of the present invention, it is possible that the input transistor has a drain terminal which is connected with the first output terminal.

In the display driving circuit of the present invention, it is possible that the input transistor is a p-channel transistor; and the source terminal of the input transistor is connected with one of the plurality of input terminals to which a signal is to be supplied, the signal having (i) a first electric potential when the signal is inactive or (ii) a second electric potential when the signal is active, the second electric potential being lower than the first electric potential.

In the display driving circuit of the present invention, it is possible that the plurality of input terminals encompass an input terminal to which the setting signal is to be supplied and an input terminal to which the resetting signal is to be supplied; and the input transistor is a set transistor which has (i) a gate terminal connected to the input terminal to which the setting signal is to be supplied and (ii) a source terminal connected to the input terminal to which the resetting signal is to be supplied.

In the display driving circuit of the present invention, it is possible that the plurality of input terminals encompass an input terminal to which the initialization signal is to be supplied, the input terminal to which the initialization signal is to be supplied being connected to a source terminal of any one of the first through fourth transistors.

The display driving circuit of the present invention may further includes: a reset transistor which has (i) a gate terminal connected to one of the plurality of input terminals to which one the resetting signal is to be supplied, (ii) a source terminal connected to a first power supply line, and (iii) a drain terminal connected to the second output terminal.

The display driving circuit of the present invention may further includes at least one of: a release transistor which has (i) a gate terminal connected to the one of the plurality of input terminals to which one the resetting signal is to be supplied, (ii) a source terminal connected to a second power supply line, and (iii) a drain terminal connected to a source terminal of the second transistor; and a release transistor which has (i) a gate terminal connected to one of the plurality of input terminals to which one the setting signal is to be supplied, (ii) a source terminal connected to the second power supply line, and (iii) a drain terminal connected to a source terminal of the fourth transistor.

The display driving circuit of the present invention may be used in a display device having a pixel electrode connected to a data signal line and a scanning signal line via a switching element, the display device supplying, to a retention capacitor line, a modulating signal in accordance with a polarity of a signal potential written into the pixel electrode, the pixel electrode and the retention capacitor line forming a capacitor therebetween.

In the display driving circuit of the present invention, it is possible that a retaining circuit, which receives a retention target signal, is provided for the stage, the retaining circuit (i) receiving the retention target signal when a control signal generated in the stage becomes active and then (ii) retaining the retention target signal; and the output signal of the stage is supplied to the scanning signal line connected to a pixel corresponding to the stage, and an output of the retaining circuit provided for the stage is supplied, as the modulating signal, to a followed retention capacitor line forming a capacitor with a pixel electrode of a pixel corresponding to a stage followed by the stage.

In the display driving circuit of the present invention, it is possible that a retaining circuit, which receives a retention target signal, is provided for the stage; the retaining circuit (i) receives the retention target signal when a control signal generated in the stage becomes active and then (ii) retains the retention target signal; an output of the retaining circuit is supplied, as the modulating signal, to the retention capacitor line; and the control signal generated in the stage becomes active prior to an earliest vertical scan period of a displayed video.

In the display driving circuit of the present invention, it is possible that a polarity of an electric potential of a signal supplied to the data signal line is inverted every plural horizontal scan periods.

In the display driving circuit of the present invention, it is possible that a retaining circuit, which receives a retention target signal, is provided for the stage; the logical circuit receives (i) an output signal of the stage, and (ii) an output signal of a following stage following the stage, and the retaining circuit (i) receives the retention target signal when an output of the logical circuit becomes active and then (ii) retains the retention target signal; the output signal of the stage is supplied to the scanning signal line connected to a pixel corresponding to the stage, and an output of the retaining circuit is supplied, as the modulating signal, to the retention capacitor line, a capacitor being formed by the retention capacitor line and the pixel electrode of the pixel corresponding to the stage; and a phase of the retention target signal which is supplied to ones of the retaining circuits is different from that of a retention target signal which is supplied to other ones of the retaining circuits.

In the display driving circuit of the present invention, it is possible that a retaining circuit, which receives a retention target signal, is provided for the stage, the retaining circuit (i) receiving the retention target signal when a control signal generated in the stage becomes active and then (ii) retaining the retention target signal; the output signal of the stage is supplied to the scanning signal line connected to a pixel corresponding to the stage, and an output of the retaining circuit provided for the stage is supplied, as the modulating signal, to a followed retention capacitor line forming a capacitor with a pixel electrode of a pixel corresponding to a followed stage followed by the stage; and a phase of the retention target signal which is supplied to ones of the retaining circuits is different from that of a retention target signal which is supplied to other ones of the retaining circuits.

The display driving circuit of the present invention may have: a first mode in which a polarity of an electric potential of a signal supplied to the data signal line is inverted every n horizontal scan period(s) (n is a natural number); and a second mode in which a polarity of an electric potential of a signal supplied to the data signal line is inverted every m horizontal scan period(s) (m is a natural number different from n), the display driving circuit switching between the first mode and the second mode.

A display panel of the present invention includes: the display driving circuit and a pixel circuit, the display driving circuit and the pixel circuit being formed monolithically.

A display device of the present invention includes the display driving circuit.

The present invention is not limited to the embodiments, but can be altered as appropriate based on a known technique or common technical knowledge. An embodiment derived from a proper combination of such alterations is also encompassed in the technical scope of the present invention. Moreover, the effects and functions, and the like described in the embodiments are merely examples.

INDUSTRIAL APPLICABILITY

The shift register of the present invention is suitable for use in various kinds of drivers, in particular, a driver of a liquid crystal display device.

REFERENCE SIGNS LIST $3a$ through $3f$: Liquid crystal display device
ASW9, ASW10, asw: Analog switch
SR: Shift register
SRi: i-th stage of shift register
DCC: Display control circuit
GD: Gate driver
SD: Source driver
G-CsD: Gate-Cs driver
DAR: Display section
Gn: Scanning signal line
CSn: Retention capacitor line
PIXn: Pixel
CSLi: D-latch circuit provided for i-th stage of a shift register
FF: Flip-flop
ST: Set transistor (input transistor)
RT: Reset transistor (input transistor)
LRT: Latch release transistor
LC: Latch circuit
POL: (Data) polarity signal
CMI1, CMI2: CS inversion signal

The invention claimed is:

1. A display driving circuit including a shift register, said display driving circuit carrying out simultaneous selection of a plurality of signal lines at a given timing, wherein,
a stage of the shift register includes (i) a flip-flop of a set-reset type configured to receive an initialization signal and (ii) a signal generating circuit configured to, receive a simultaneous selection signal, and
generate an output signal of the stage by use of an output of the flip-flop,
the flip-flop includes,
a first Complementary Metal-Oxide Semiconductor (CMOS) circuit having a p-channel first transistor and an n-channel second transistor, a gate terminal of the p-channel first transistor being connected to a gate terminal of the n-channel second transistor, and a drain terminal of the p-channel first transistor being connected to a drain terminal of the n-channel second transistor,
a second CMOS circuit having a p-channel third transistor and an n-channel fourth transistor, a gate terminal of the p-channel third transistor being connected to a gate terminal of the n-channel fourth transistor, and a drain terminal of the p-channel third transistor being connected to a drain terminal of the n-channel fourth transistor,
an input transistor,
a plurality of input terminals, and
a first output terminal and a second output terminal;
a gate side of the first CMOS circuit, a drain side of the second CMOS circuit and the first output terminal are connected to each other, and a gate side of the second CMOS circuit, a drain side of the first CMOS circuit, and the second output terminal are connected to each other;
the input transistor has a gate terminal and a source terminal which are connected with respective different ones of the plurality of input terminals;
the output signal of the stage is activated due to an activation of the simultaneous selection signal and remains active during the simultaneous selection;
the output of the flip-flop is inactive while the initialization signal is active, regardless of whether each of a setting signal and a resetting signal is active or inactive; and
the initialization signal is activate before an end of the simultaneous selection and is inactive after the end of the simultaneous selection.

2. The display driving circuit as set forth in claim 1, wherein the signal generating circuit includes a gate circuit configured to selectively output, as the output signal of the stage, one of inputted signals in response to a switching signal supplied to the gate circuit.

3. The display driving circuit as set forth in claim 2, wherein the output of the flip-flop is supplied, as the switching signal, to the gate circuit.

4. The display driving circuit as set forth in claim 2, wherein,
the signal generating circuit further includes a logical circuit; and
the output of the flip-flop is supplied to the logical circuit, an output of the logical circuit is supplied to the gate circuit as the switching signal, and the output signal of the stage is fed back to the logical circuit and to a reset terminal of the flip-flop.

5. The display driving circuit as set forth in claim 4, wherein the logical circuit includes an NAND circuit.

6. The display driving circuit as set forth in claim 5, wherein,
the NAND circuit is made up of a plurality of p-channel transistors and a plurality of n-channel transistors; and
in the NAND circuit, operation performance of each of the plurality of p-channel transistors is higher than that of each of the plurality of n-channel transistors.

7. The display driving circuit as set forth in claim 2, wherein the gate circuit selectively outputs the simultaneous selection signal or a clock signal.

8. The display driving circuit as set forth in claim 7, wherein the clock signal is fixedly active during the simultaneous selection.

9. The display driving circuit as set forth in claim 1, wherein the input transistor has a drain terminal which is connected to the first output terminal.

10. The display driving circuit as set forth in claim 1, wherein,
the input transistor is a p-channel transistor; and
the source terminal of the input transistor is connected to one of the plurality of input terminals to which a signal is to be supplied, the signal having (i) a first electric potential when the signal is inactive or (ii) a second electric potential when the signal is active, the second electric potential being lower than the first electric potential.

11. The display driving circuit as set forth in claim 1, wherein,
the plurality of input terminals encompass an input terminal to which the setting signal is to be supplied and an input terminal to which the resetting signal is to be supplied; and
the input transistor is a set transistor which has (i) a gate terminal connected to the input terminal to which the setting signal is to be supplied and (ii) a source terminal connected to the input terminal to which the resetting signal is to be supplied.

12. The display driving circuit as set forth in claim 1, wherein the plurality of input terminals encompass an input terminal to which the initialization signal is to be supplied, the input terminal to which the initialization signal is to be supplied being connected to a source terminal of any one of the first through fourth transistors.

13. The display driving circuit as set forth in claim 1, further comprising:
a reset transistor which has (i) a gate terminal connected to one of the plurality of input terminals to which one the resetting signal is to be supplied, (ii) a source terminal connected to a first power supply line, and (iii) a drain terminal connected to the second output terminal.

14. The display driving circuit as set forth in claim 13, further comprising at least one of:
a release transistor having (i) a gate terminal connected to the one of the plurality of input terminals to which one the resetting signal is to be supplied, (ii) a source terminal connected to a second power supply line, and (iii) a drain terminal connected to a source terminal of the second transistor; and
a release transistor having (i) a gate terminal connected to one of the plurality of input terminals to which one the setting signal is to be supplied, (ii) a source terminal connected to the second power supply line, and (iii) a drain terminal connected to a source terminal of the fourth transistor.

15. The display driving circuit as set forth in claim 1, which is used in a display device having a pixel electrode connected to a data signal line and a scanning signal line via a switching element, the display device being configured to supply, to a retention capacitor line, a modulating signal in accordance with a polarity of a signal potential written into the pixel electrode, the pixel electrode and the retention capacitor line forming a capacitor therebetween.

16. The display driving circuit as set forth in claim 15, wherein,
a retaining circuit provided for the stage, the retaining circuit being configured to (i) receive a retention target signal when a control signal generated in the stage becomes active and then (ii) retain the retention target signal; and
the output signal of the stage is supplied to the scanning signal line connected to a pixel corresponding to the stage, and an output of the retaining circuit provided for the stage is supplied, as the modulating signal, to a followed retention capacitor line forming a capacitor with a pixel electrode of a pixel corresponding to a stage followed by the stage.

17. The display driving circuit as set forth in claim 15, wherein,
- a retaining circuit is provided for the stage;
- the retaining circuit being configured to (i) receive a retention target signal when a control signal generated in the stage becomes active and then (ii) retain the retention target signal;
- an output of the retaining circuit is supplied, as the modulating signal, to the retention capacitor line; and
- the control signal generated in the stage becomes active prior to an earliest vertical scan period of a displayed video.

18. The display driving circuit as set forth in claim 15, wherein a polarity of an electric potential of a signal supplied to the data signal line is inverted every plural horizontal scan periods.

19. The display driving circuit as set forth in claim 18, wherein,
- a retaining circuit is provided for the stage;
- a logical circuit receives (i) an output signal of the stage, and (ii) an output signal of a following stage following the stage, and the retaining circuit is configured to (i) receive a retention target signal when an output of the logical circuit becomes active and then (ii) retain the retention target signal;
- the output signal of the stage is supplied to the scanning signal line connected to a pixel corresponding to the stage, and an output of the retaining circuit is supplied, as the modulating signal, to the retention capacitor line, a capacitor being formed by the retention capacitor line and the pixel electrode of the pixel corresponding to the stage; and
- a phase of the retention target signal which is supplied to ones of the retaining circuits is different from that of a retention target signal which is supplied to other ones of the retaining circuits.

20. The display driving circuit as set forth in claim 18, wherein,
- a retaining circuit is provided for the stage, the retaining circuit being configured to (i) the receive a retention target signal when a control signal generated in the stage becomes active and then (ii) retain the retention target signal;
- the output signal of the stage is supplied to the scanning signal line connected to a pixel corresponding to the stage, and an output of the retaining circuit provided for the stage is supplied, as the modulating signal, to a followed retention capacitor line forming a capacitor with a pixel electrode of a pixel corresponding to a followed stage followed by the stage; and
- a phase of the retention target signal which is supplied to ones of the retaining circuits is different from that of a retention target signal which is supplied to other ones of the retaining circuits.

21. The display driving circuit as set forth in claim 18, having,
- a first mode in which a polarity of an electric potential of a signal supplied to the data signal line is inverted every n horizontal scan period(s) (n is a natural number); and
- a second mode in which a polarity of an electric potential of a signal supplied to the data signal line is inverted every m horizontal scan period(s) (m is a natural number different from n), said display driving circuit switching between the first mode and the second mode.

22. A display panel, comprising:
- a display driving circuit recited in claim 1; and
- a pixel circuit, the display driving circuit and the pixel circuit being formed monolithically.

23. A display device comprising:
the display driving circuit recited in claim 1.

* * * * *